(12) United States Patent
Nishimura et al.

(10) Patent No.: US 6,964,840 B2
(45) Date of Patent: Nov. 15, 2005

(54) RADIATION-SENSITIVE RESIN COMPOSITION

(75) Inventors: Yukio Nishimura, Mie (JP); Noboru Yamahara, Mie (JP); Masafumi Yamamoto, Mie (JP); Toru Kajita, Mie (JP); Tsutomu Shimokawa, Mie (JP); Hiroshi Ito, San Jose, CA (US)

(73) Assignees: JSR Corporation, Tokyo (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/867,892

(22) Filed: Jun. 16, 2004

(65) Prior Publication Data

US 2004/0241580 A1 Dec. 2, 2004

Related U.S. Application Data

(63) Continuation of application No. 09/879,894, filed on Jun. 14, 2001, now Pat. No. 6,800,414.

(30) Foreign Application Priority Data

Jun. 16, 2000 (JP) .................................... 2000-182297
Apr. 6, 2001 (JP) .................................... 2001-108824

(51) Int. Cl.$^7$ .............................................. G03F 7/004
(52) U.S. Cl. ........................... 430/270.1; 430/286.1; 430/905; 430/907; 430/910
(58) Field of Search ...................... 430/270.1, 286.1, 430/905, 907, 910

(56) References Cited

U.S. PATENT DOCUMENTS

| | | | |
|---|---|---|---|
| 5,215,857 A | 6/1993 | Hosaka et al. | |
| 5,238,774 A | 8/1993 | Hosaka et al. | |
| 5,405,720 A | 4/1995 | Hosaka et al. | |
| 5,494,784 A | 2/1996 | Hosaka et al. | |
| 5,925,492 A | 7/1999 | Hosaka et al. | |
| 6,020,104 A | 2/2000 | Hosaka et al. | |
| 6,165,678 A | 12/2000 | Allen et al. | |
| RE37,179 E | 5/2001 | Yamachika et al. | |
| 6,228,554 B1 | 5/2001 | Hosaka et al. | |
| 6,270,939 B1 | 8/2001 | Hosaka et al. | |
| 6,280,900 B1 | 8/2001 | Chiba et al. | |
| 6,337,171 B1 | 1/2002 | Kobayashi et al. | |
| 6,403,280 B1 | 6/2002 | Yamahara et al. | |
| 6,440,636 B1 * | 8/2002 | Ushirogouchi et al. | 430/270.1 |
| 6,468,714 B2 | 10/2002 | Kai et al. | |
| 6,482,568 B1 | 11/2002 | Douki et al. | |
| 6,503,686 B1 | 1/2003 | Fryd et al. | |
| 6,506,527 B1 | 1/2003 | Demejo et al. | |
| 6,511,787 B2 | 1/2003 | Harada et al. | |
| 6,517,992 B1 | 2/2003 | Wang et al. | |
| 6,531,260 B2 | 3/2003 | Iwasawa et al. | |
| 6,610,456 B2 * | 8/2003 | Allen et al. | 430/270.1 |
| 6,623,907 B2 | 9/2003 | Numata et al. | |
| 6,692,887 B1 | 2/2004 | Suwa et al. | |
| 2002/0004569 A1 | 1/2002 | Hatakeyama et al. | |
| 2002/0009667 A1 | 1/2002 | Nishimura et al. | |
| 2002/0009668 A1 | 1/2002 | Nishimura et al. | |

(Continued)

FOREIGN PATENT DOCUMENTS

| | | |
|---|---|---|
| DE | 42 07 261 | 9/1993 |
| JP | 02-027660 | 1/1990 |
| JP | 04-226461 | 8/1992 |
| JP | 07-234511 | 5/1995 |
| JP | 07-234511 | 9/1995 |
| WO | WO 01/37047 | 5/2001 |

OTHER PUBLICATIONS

Patterson et al., "Polymers for 157 nm Photoresist Applications: A Progress Report", Proceedings of SPIE, vol. 3999, 365–374, (2000).

Somervell et al., "Using Alicyclic Polymers in Top Surface Imaging Systems to Reduce Line Edge Roughness", Proceedings of SPIE, vol. 3999, 270–282, (2000).

Ito et al., "Synthesis and Preliminary Evaluation of Substituted Poly(Norbornene Sulfones) For 193 NM Lithography", Polymeric Materials Science and Engineering, Washington, DC, US, vol. 77, 449–450, (1997).

*Primary Examiner*—Yvette C. Thornton
(74) *Attorney, Agent, or Firm*—Merchant & Gould; Steven B. Kelber

(57) ABSTRACT

A radiation-sensitive resin composition comprising an acid-labile group-containing resin and a photoacid generator is disclosed. The resin has a structure of the formula (1),

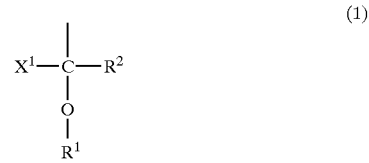

(1)

wherein $R^1$ represents a hydrogen atom, a monovalent acid-labile group, an alkyl group having 1–6 carbon atoms which does not have an acid-labile group, or an alkylcarbonyl group having 2–7 carbon atoms which does not have an acid-labile group, $X^1$ represents a linear or branched fluorinated alkyl group having 1–4 carbon atoms, and $R^2$ represents a hydrogen atom, a linear or branched alkyl group having 1–10 carbon atoms, or a linear or branched fluorinated alkyl group having 1–10 carbon atoms. The resin composition exhibits high transmittance of radiation, high sensitivity, resolution, and pattern shape, and is useful as a chemically amplified resist in producing semiconductors at a high yield.

6 Claims, No Drawings

U.S. PATENT DOCUMENTS

| | | |
|---|---|---|
| 2002/0058201 A1 | 5/2002 | Miyaji et al. |
| 2002/0090569 A1 | 7/2002 | Suzuki et al. |
| 2002/0102490 A1 | 8/2002 | Ito et al. |
| 2002/0132181 A1 | 9/2002 | Nishimura et al. |
| 2002/0146639 A1 | 10/2002 | Brock et al. |
| 2002/0164538 A1 | 11/2002 | Allen et al. |
| 2002/0172885 A1 | 11/2002 | Nagai et al. |
| 2002/0187419 A1 | 12/2002 | Dammel et al. |
| 2002/0192593 A1 | 12/2002 | Nagai et al. |
| 2003/0013831 A1 | 1/2003 | Dammel et al. |
| 2003/0022095 A1 | 1/2003 | Kai et al. |
| 2003/0113658 A1 | 6/2003 | Ebata et al. |
| 2003/0113660 A1 | 6/2003 | Yoneda et al. |
| 2003/0157423 A1 | 8/2003 | Nagai et al. |
| 2003/0170561 A1 | 9/2003 | Iwasawa et al. |
| 2003/0191268 A1 | 10/2003 | Iwasawa et al. |
| 2003/0194634 A1 | 10/2003 | Nagai et al. |
| 2003/0203307 A1 | 10/2003 | Soy ano et al. |
| 2003/0203309 A1 | 10/2003 | Nishimura et al. |
| 2003/0219680 A1 | 11/2003 | Nishimura et al. |
| 2004/0048192 A1 | 3/2004 | Shima et al. |
| 2004/0072094 A1 | 4/2004 | Shima et al. |

\* cited by examiner

RADIATION-SENSITIVE RESIN COMPOSITION

This application is a continuation of U.S. Ser. No. 09/879,894, filed Jun. 14, 2001, now U.S. Pat. No. 6,800,414, the entirety of which is incorporated by reference.

BACKGROUND OF THE INVENTION

1. Field of the Invention

The present invention relates to a radiation-sensitive resin composition and, more particularly, to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams.

2. Description of the Background Art

In the field of microfabrication represented by fabrication of integrated circuit devices, a lithographic technology enabling microfabrication with a line width of 0.20 μm or less has been demanded in order to achieve higher integration.

A conventional lithographic process utilizes near ultraviolet rays such as i-line as radiation. It is known in the art that microfabrication with a line width of sub-quarter micron is very difficult using near ultraviolet rays.

Therefore, use of radiation with a shorter wavelength has been studied for enabling microfabrication with a line width of 0.20 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm) and an ArF excimer laser (wavelength: 193 nm) have attracted attention.

As a radiation-sensitive resin composition applicable to the excimer laser radiation, a number of compositions utilizing a chemical amplification effect between a component having an acid-labile functional group and a component generating an acid (hereinafter called "photoacid generator") which generates an acid upon irradiation (hereinafter called "exposure") has been proposed. Such a composition is hereinafter called a chemically-amplified radiation-sensitive composition.

As the chemically-amplified radiation-sensitive composition, Japanese Patent Publication No. 27660/1990 discloses a composition comprising a polymer containing a t-butyl ester group of carboxylic acid or a t-butylcarbonate group of phenol and a photoacid generator. This composition utilizes the effect of the polymer to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer.

Most of conventional chemically-amplified radiation-sensitive compositions use a phenol resin as a base resin. Deep ultraviolet rays used as radiation for exposure are absorbed due to an aromatic ring in the resin and cannot sufficiently reach the bottom of the resist film. Because of this, the dose of the radiation is greater at the film surface and is smaller at the bottom of the resist film. This causes critical dimension of a resist pattern to be smaller at the film surface and be larger toward the bottom, thereby forming a tapered profile after development. No sufficient resolution can be obtained from such a resist film. Such a tapered profile formed after development cannot give a desired dimensional accuracy in the succeeding steps such as an etching step and an ion implantation step. In addition, if the configuration of the resist pattern is not rectangular on the upper portion, the resist disappears faster during dry etching, making it difficult to control etching conditions.

The resist profile can be improved by increasing the radiation transmittance through the resist film. For example, (meth)acrylate resins represented by polymethylmethacrylate are desirable from the viewpoint of radiation transmittance due to the superior transparency to deep ultraviolet rays. Japanese Patent Application Laid-open No. 226461/1992 proposes a chemically-amplified radiation-sensitive resin composition using a methacrylate resin. However, in spite of the excellent micro-processing performance, this composition exhibits only poor dry etching resistance due to the absence of an aromatic ring, giving rise to difficulty in performing etching with high accuracy. This composition thus does not have both radiation transmittance and dry etching resistance at the same time.

A method of introducing an alicyclic ring into the resin component in the composition instead of an aromatic ring has been known as a means for improving dry etching resistance without impairing radiation transmittance of the resist made from a chemically-amplified radiation-sensitive resin composition. A chemically-amplified radiation-sensitive resin composition using a (meth)acrylate resin having an alicyclic ring is proposed in Japanese Patent Application Laid-open No. 234511/1995, for example.

This composition, however, comprises groups which are comparatively easily dissociated with conventional acids (for example, an acetal functional group such as a tetrahydropyranyl group) and groups which are comparatively difficult to be dissociated with acids (for example, a t-butyl functional group such as a t-butyl ester group, t-butylcarbonate group) as an acid-labile functional group as the resin component. The resin component possessing the former acid-labile functional group exhibits excellent basic characteristics as a resist such as superior sensitivity and excellent pattern shape, but has a problem of poor storage stability, whereas the resin component possessing the latter acid-labile functional group exhibits impaired resist characteristics, particularly in terms of sensitivity and pattern shape, in spite of excellent storage stability. In addition, inclusion of an alicyclic structure in the resin components of this composition increases hydrophobicity of the resin, resulting in poor adhesion to substrates.

In view of recent progress in the microfabrication of semiconductor devices, development of a novel resin component exhibiting high transmittance of radiation, having excellent basic properties as a resist, and suitable for use in chemically amplified radiation sensitive compositions which can be adapted to short wavelength radiation represented by a deep ultraviolet rays is an important subject.

Therefore, an object of the present invention is to provide a novel radiation-sensitive resin composition, which has high transmittance of radiation, exhibits superior basic properties as a resist such as high sensitivity, resolution, and pattern shape, and is capable of producing semiconductors at a high yield without producing resolution defects during microfabrication.

SUMMARY OF THE INVENTION

The above object can be achieved in the present invention by a radiation-sensitive resin composition comprising (A) an acid-labile group-containing resin having a structure represented by the following formula (1) and (B) a photoacid generator:

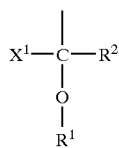

(1)

wherein $R^1$ represents a hydrogen atom, a monovalent acid-labile group, an alkyl group having 1–6 carbon atoms which does not have an acid-labile group, or an alkylcarbonyl group having 2–7 carbon atoms which does not have an acid-labile group, $X^1$ represents a linear or branched fluorinated alkyl group having 1–4 carbon atoms, and $R^2$ represents a hydrogen atom, a linear or branched alkyl group having 1–10 carbon atoms, or a linear or branched fluorinated alkyl group having 1–10 carbon atoms.

In a preferred embodiment of the present invention, the above component (A) is an acid-labile group-containing resin having a recurring unit (I) represented by the following formula (2):

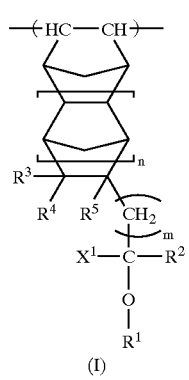

(2)

(I)

wherein $R^1$ represents a hydrogen atom, a monovalent acid-labile group, an alkyl group having 1–6 carbon atoms which does not have an acid-labile group, or an alkylcarbonyl group having 2–7 carbon atoms which does not have an acid-labile group, $X^1$ represents a linear or branched fluorinated alkyl group having 1–4 carbon atoms, $R^2$ represents a hydrogen atom, a linear or branched alkyl group having 1–10 carbon atoms, or a linear or branched fluorinated alkyl group having 1–10 carbon atoms, $R^3$, $R^4$, and $R^5$ individually represents a hydrogen atom or a linear or branched alkyl group having 1–4 carbon atoms, a monovalent oxygen-containing polar group, or a monovalent nitrogen-containing polar group, n is an integer of 0–2, and m is an integer of 0–3.

In another preferred embodiment of the above radiation-sensitive resin composition the above component (A) is an alkali insoluble or scarcely soluble acid-labile group-containing resin having a recurring unit (I) and a recurring unit (II) shown by the following formula (3):

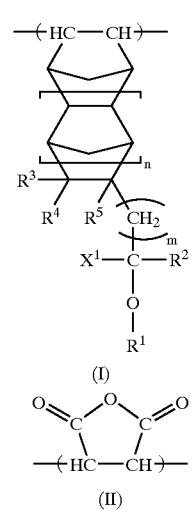

(3)

(I)

(II)

wherein $R^1$ represents a hydrogen atom, a monovalent acid-labile group, an alkyl group having 1–6 carbon atoms which does not have an acid-labile group, or an alkylcarbonyl group having 2–7 carbon atoms which does not have an acid-labile group, $X^1$ represents a linear or branched fluorinated alkyl group having 1–4 carbon atoms, $R^2$ represents a hydrogen atom, a linear or branched alkyl group having 1–10 carbon atoms, or a linear or branched fluorinated alkyl group having 1–10 carbon atoms, $R^3$, $R^4$, and $R^5$ individually represents a hydrogen atom or a linear or branched alkyl group having 1–4 carbon atoms, a monovalent oxygen-containing polar group, or a monovalent nitrogen-containing polar group, n is an integer of 0–2, and m is an integer of 0–3.

In the above radiation-sensitive resin composition, the content of the recurring unit (I) in the resin component (A) is preferably 1–50 mol % of the total amount of recurring units.

In the above radiation-sensitive resin composition, the alkali insoluble or scarcely soluble acid-labile group-containing resin (A) has a recurring unit (I), recurring unit (II), and recurring unit (III) shown by the following formula (4):

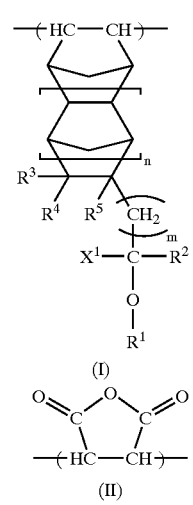

(4)

(I)

(II)

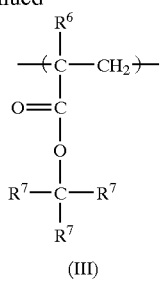

(III)

wherein $R^1$ represents a hydrogen atom, a monovalent acid-labile group, an alkyl group having 1–6 carbon atoms which does not have an acid-labile group, or an alkylcarbonyl group having 2–7 carbon atoms which does not have an acid-labile group, $X^1$ represents a linear or branched fluorinated alkyl group having 1–4 carbon atoms, $R^2$ represents a hydrogen atom, a linear or branched alkyl group having 1–10 carbon atoms, or a linear or branched fluorinated alkyl group having 1–10 carbon atoms, $R^3$, $R^4$, and $R^5$ individually represents a hydrogen atom or a linear or branched alkyl group having 1–4 carbon atoms, a monovalent oxygen-containing polar group, or a monovalent nitrogen-containing polar group, n is an integer of 0–2, m is an integer of 0–3, $R^6$ represents a hydrogen atom or methyl group, and $R^7$ individually represents a linear or branched alkyl group having 1–4 carbon atoms or a monovalent alicyclic hydrocarbon group having 4–20 carbon atoms or a derivative thereof, or any two of $R^7$'s form in combination a divalent alicyclic hydrocarbon group having 4–20 carbon atoms or a derivative thereof, with the remaining $R^7$ being a linear or branched alkyl group having 1–4 carbon atoms or a monovalent alicyclic hydrocarbon group having 4–20 carbon atoms or a derivative thereof.

In the above radiation-sensitive resin composition, the component (A) is an acid-labile group-containing resin having a recurring unit (IV) represented by the following formula (5):

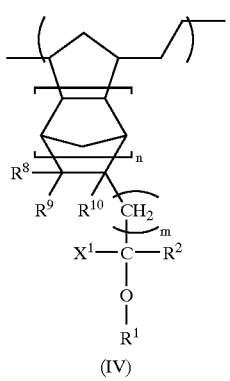

(IV)

wherein $R^1$ represents a hydrogen atom, a monovalent acid-labile group, an alkyl group having 1–6 carbon atoms which does not have an acid-labile group, or an alkylcarbonyl group having 2–7 carbon atoms which does not have an acid-labile group, $X^1$ represents a linear or branched fluorinated alkyl group having 1–4 carbon atoms, $R^2$ represents a hydrogen atom, a linear or branched alkyl group having 1–10 carbon atoms, or a linear or branched fluorinated alkyl group having 1–10 carbon atoms, $R^8$, $R^9$, and $R^{10}$ individually represents a hydrogen atom or a linear or branched alkyl group having 1–4 carbon atoms, a monovalent oxygen-containing polar group, or a monovalent nitrogen-containing polar group, n is an integer of 0–2, and m is an integer of 0–3.

In the above radiation-sensitive resin composition, the photoacid generator of component (B) is at least one compound selected from the group consisting of an onium salt compound, halogen-containing compound, diazoketone compound, sulfone compound, and sulfonic acid compound.

The above radiation-sensitive resin composition preferably further comprises a nitrogen-containing organic compound as an acid diffusion controller.

The above radiation-sensitive resin composition preferably further comprises an alicyclic additive having an acid-labile organic group.

The above alicyclic additive is preferably at least one compound selected from the group consisting of an adamantane derivative, a deoxycholate, a lithocholate, and 2,5-dimethyl-2,5-di(adamantylcarbonyloxy)hexane.

Other objects, features and advantages of the invention will hereinafter become more readily apparent from the following description.

DETAILED DESCRIPTION OF THE INVENTION AND PREFERRED EMBODIMENTS

Component (A)

The component (A) of the present invention is an acid-labile group-containing resin (hereinafter referred to as "resin (A)") represented by the above-described structure (hereinafter referred to as "structure (1)").

The radiation-sensitive resin composition of the present invention exhibits excellent solubility in a developer and produces no developing effects due to possession of the structure (1) by the resin (A).

As examples of the monovalent acid-labile group represented by $R^1$ (hereinafter referred to as an "acid-labile group (i)"), a tertiary alkyl group, acetal group, substituted methyl group, 1-substituted ethyl group, 1-substitution propyl group, 1-branched alkyl group (excluding tertiary alkyl groups), silyl group, germyl group, alkoxycarbonyl group, acyl group, cyclic acid-labile group, and the like can be given.

As examples of the tertiary alkyl group in the acid-labile group (i), a t-butyl group, 1,1-dimethylpropyl group, 1-methyl-1-ethylpropyl group, 1,1-dimethylbutyl group, 1-methyl-1-ethylbutyl group, 1,1-dimethylpentyl group, 1-methyl-1-ethylpentyl group, 1,1-dimethylhexyl group, 1,1-dimethylheptyl group, 1,1-dimethyloctyl group, and the like can be given.

As examples of the acetal group, a methoxymethoxy group, ethoxymethoxy group, n-propoxymethoxy group, i-propoxymethoxy group, n-butoxymethoxy group, t-butoxymethoxy group, n-pentyloxymethoxy group, n-hexyloxymethoxy group, cyclopentyloxymethoxy group, cyclohexyloxymethoxy group, 1-methoxyethoxy group, 1-ethoxyethoxy group, 1-n-propoxyethoxy group, 1-i-propoxyethoxy group, 1-n-butoxyethoxy group, 1-t-butoxyethoxy group, 1-n-pentyloxyethoxy group, 1-n-hexyloxyethoxy group, 1-cyclopentyloxyethoxy group, 1-cyclohexyloxyethoxy group, (cyclohexyl)(methoxy)methoxy group, (cyclohexyl)(ethoxy)methoxy group, (cyclohexyl)(n-propoxy)methoxy group, (cyclohexyl)(i-propoxy)methoxy group, (cyclohexyl)(cyclohexyloxy)methoxy group, and the like can be given.

As examples of the substituted methyl group, a methoxymethyl group, methylthiomethyl group, ethoxymethyl group, ethylthiomethyl group, methoxyethoxymethyl group, benzyloxymethyl group, benzylthiomethyl group, phenacylgroup, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of the 1-substituted methyl group, a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, 1-t-butoxycarbonylethyl group, and the like can be given.

As examples of the 1-substituted propyl group, a 1-methoxypropyl group, 1-ethoxypropyl group, and the like can be given.

As examples of the 1-branched alkyl group, i-propyl group, sec-butyl group, 1-methylbutyl group, and the like can be given.

As examples of the silyl group, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of the germyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of the alkoxycarbonyl group, a methoxycarbonyl group, ethoxycarbonyl group, i-propoxycarbonyl group, t-butoxycarbonyl group, and the like can be given.

As examples of the acyl group, an acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the cyclic acid-labile group, a 3-oxocyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 2-oxo-4-methyl-4-tetrahydropyranyl group, 4-methoxytetrahydrothiopyranyl group, 3-tetrahydrothiophene-1,1-dioxide group, and the like can be given.

Of these acid-labile groups (i), a t-butyl group, 1-methoxyethoxy group, 1-ethoxyethoxy group, 1-cyclohexyloxyethoxy group, methoxymethyl group, t-butoxycarbonylmethyl group, 1-methoxyethyl group, 1-ethoxyethyl group, 1-n-propoxyethyl group, 1-cyclohexyloxyethyl group, 1-ethoxypropyl group, trimethylsilyl group, t-butoxycarbonyl group, tetrahydropyranyl group, tetrahydrofuranyl group, and the like are preferable.

The alkyl group represented by $R^1$ having 1–6 carbon atoms and no acid-labile group may be linear, branched or cyclic, and the examples include a methyl group, ethyl group, n-propyl group, n-butyl group, i-butyl group, n-pentyl group, n-hexyl group, cyclopentyl group, and cyclohexyl group.

Of these alkyl groups, a methyl group, ethyl group, n-propyl group, and cyclohexyl group are particularly preferable.

The alkylcarbonyl group represented by $R^1$ having 2–7 carbon atoms and no acid-labile group may be linear, branched, or cyclic, and the examples include a methylcarbonyl group, ethylcarbonyl group, n-propylcarbonyl group, n-butylcarbonyl group, i-butylcarbonyl group, n-pentylcarbonyl group, i-pentylcarbonyl group, n-hexylcarbonyl group, i-hexylcarbonyl group, and cyclohexylcarbonyl group.

Of these alkylcarbonyl groups, a methylcarbonyl group and ethylcarbonyl group are particularly preferable.

Particularly preferable groups for $R^1$ in the formula (1) are a hydrogen atom, the above-mentioned preferable acid-labile groups (i), a methyl group, ethyl group, methylcarbonyl group, ethylcarbonyl group, and the like.

Given as examples of the linear or the branched fluoro alkyl group having 1–4 carbon atoms represented by $X^1$ are a fluoromethyl group, difluoromethyl group, perfluoromethyl group, 1-fluoroethyl group, 1,1-difluoroethyl group, 2,2,2-trifluoroethyl group, perfluoroethyl group, 1-fluoro-n-propyl group, 1,1-difluoro-n-propyl group, 3,3,3-trifluoro-n-propyl group, 3,3,3,2,2-pentafluoro-n-propyl group, perfluoro-n-propyl group, 1-fluoro-1-methylethyl group, 2,2,2-trifluoro-1-methylethyl group, perfluoro-i-propyl group, 1-fluoro-n-butyl group, 1,1-difluoro-n-butyl group, 4,4,4-trifluoro-n-butyl group, 4,4,4,3,3-pentafluoro-n-butyl group, 4,4,4,3,3,2,2-heptafluoro-n-butyl group, and perfluoro-n-butyl group.

Of these fluoroalkyl groups, a fluoromethyl group, difluoromethyl group, perfluoromethyl group, 1,1-difluoroethyl group, 2,2,2-trifluoroethyl group, and 1-fluoro-1-methylethyl group are preferable.

Given as examples of the linear or the branched alkyl group having 1–10 carbon atoms represented by $R^2$ are a methyl group, ethyl group, n-propyl group, i-propyl group, n-butyl group, i-butyl group, sec-butyl group, t-butyl group, n-pentyl group, neopentyl group, n-hexyl group, n-heptyl group, n-octyl group, 2-ethylhexyl-group, n-nonyl group, n-decyl group, and the like.

Of these, a methyl group, ethyl group, n-propyl group, and n-hexyl group are preferable.

Given as examples of the linear or the branched fluoro alkyl group having 1–10 carbon atoms represented by $R^2$ are a fluoromethyl group, difluoromethyl group, perfluoromethyl group, 1-fluoroethyl group, 1,1-difluoroethyl group, 2,2,2-trifluoroethyl group, perfluoroethyl group, 1-fluoro-n- propyl group, 1,1-difluoro-n-propyl group, 3,3,3-trifluoro-n-propyl group, 3,3,3,2,2-pentafluoro-n-propyl group, perfluoro-n-propyl group, 1-fluoro-1-methylethyl group, 2-trifluoro-1-methylethyl group, perfluoro-i-propyl group, 1-fluoro-n-butyl group, 1,1-difluoro-n-butyl group, 4,4,4-trifluoro-n-butyl group, 4,4,4,3,3-pentafluoro-n-butyl group, 4,4,4,3,3,2,2-heptafluoro-n-butyl group, perfluoro-n-butyl group, 2-fluoro-2-methylpropyl group, 1-fluoro-1-methylpropyl group, 1-fluoro-n-pentyl group, 1,1-difluoro-n-pentyl group, 5,5,5-trifluoro-n-pentyl group, 1-fluoro-n-hexyl group, 1,1-difluoro-n-hexyl group, 6,6,6-trifluoro-n-hexyl group, 1-fluoro-n-heptyl group, 1,1-difluoro-n-heptyl group, 7,7,7-trifluoro-n-heptyl group, 1-fluoro-n-octyl group, 1,1-difluoro-n-octyl group, 8,8,8-trifluoro-n-octyl group, 2-fluoro-2-ethylhexyl group, 1-fluoro-n-nonyl group, 1,1-difluoro-n-nonyl group, 9,9,9-trifluoro-n-nonyl group, 1-fluoro-n-decyl group, 1,1-difluoro-n-decyl group, and 10,10,10-trifluoro-n-decyl group.

Of these fluoroalkyl groups, a fluoromethyl group, difluoromethyl group, perfluoromethyl group, 1,1-difluoroethyl group, 2,2,2-trifluoroethyl group, and 1-fluoro-1-methylethyl group are preferable.

Particularly preferable groups for $R^2$ in the formula (2) are a hydrogen atom, methyl group, perfluoromethyl group, and the like.

Specific preferable examples of the structure (1) include the structures of the following formulas (1-1) to (1-12).

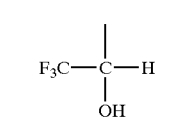
(1-1)

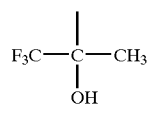
(1-2)

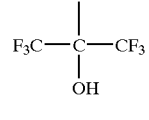
(1-3)

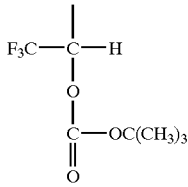
(1-4)

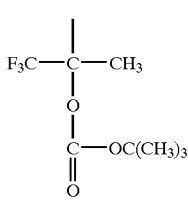
(1-5)

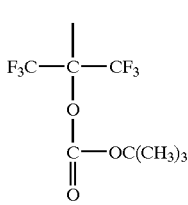
(1-6)

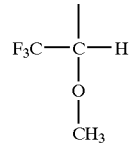
(1-7)

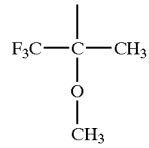
(1-8)

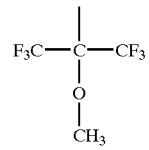
(1-9)

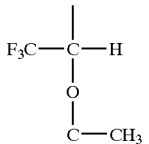
(1-10)

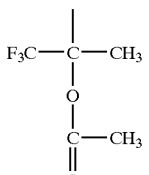
(1-11)

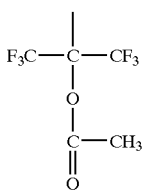
(1-12)

Of these, the structures shown by the formulas (1-3), (1-6), (1-12), and the like are preferable.

Any resins including addition condensation resins, polyaddition resins, ring-opening polymerization resins, condensation polymerization resins, and the like can be employed without specific limitations as the resin (A) inasmuch as the resin has an acid-labile group. From the viewpoint of transmittance of radioactive rays, the resin (A) of the present invention preferably does not have an aromatic ring or contains as small an amount of aromatic rings as possible.

As preferable specific examples of the resin (A) in the present invention, an acid-labile group-containing resin having a recurring unit (I) shown by the following formula (2) (hereinafter referred to as "resin (A1)"), an acid-labile group-containing resin having a structural unit (IV) shown by the following formula (5) (hereinafter referred to as "resin (A2)"), and the like can be given:

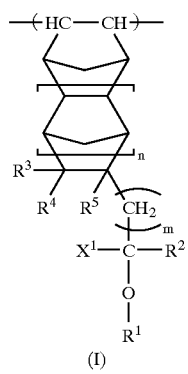

(I)

wherein $R^1$, $X^1$, and $R^2$ are the same as defined for the above formula (1), $R^3$, $R^4$, and $R^5$ individually represents a hydrogen atom or a linear or branched alkyl group having 1–4 carbon atoms, a monovalent oxygen-containing polar group, or a monovalent nitrogen-containing polar group, n is an integer of 0–2, and m is an integer of 0–3,

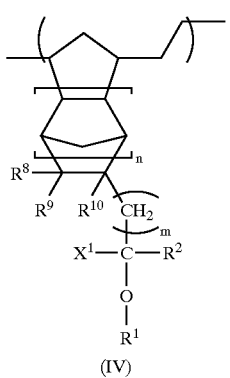

(IV)

wherein $R^1$, $X^1$, and $R^2$ are the same as defined for the above formula (1), $R^8$, $R^9$, and $R^{10}$ individually represents a hydrogen atom or a linear or branched alkyl group having 1–4 carbon atoms, a monovalent oxygen-containing polar group, or a monovalent nitrogen-containing polar group, n is an integer of 0–2, and m is an integer of 0–3.

First, the resin (A1) will be explained.

As examples of the linear or branched alkyl group having 1–4 carbon atoms represented by $R^3$, $R^4$, or $R^5$ in the formula (2), a methyl group, ethyl group, n-propyl group, i-propyl group, n-butyl group, i-butyl group, sec-butyl group, t-butyl group, and the like can be given.

Of these alkyl groups, methyl group and ethyl groups are particularly preferable.

As examples of the monovalent oxygen-containing polar group represented by $R^3$, $R^4$, or $R^5$, a hydroxyl group; carboxyl group; linear or branched hydroxyalkyl groups having 1–4 carbon atoms such as a hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, and 4-hydroxy-n-butyl group; and linear or branched alkoxyl groups having 1–4 carbon atoms such as a methoxy group, ethoxy group, n-propoxy group, i-propoxy group, n-butoxy group, 2-methylpropoxy group, 1-methylpropoxy group, t-butoxygroup, and the like can be given.

Of these oxygen-containing polar groups, a hydroxyl group, carboxyl group, hydroxymethyl group, methoxy group, ethoxy group, and the like are preferable.

As examples of the monovalent nitrogen-containing polar group represented by $R^3$, $R^4$, or $R^5$, a cyano group; linear or branched cyanoalkyl groups having 2–5 carbon atoms such as a cyanomethyl group, 1-cyanoethyl group, 2-cyanoethyl group, 1-cyano-n-propyl group, 2-cyano-n-propyl group, 3-cyano-n-propyl group, 1-cyano-n-butyl group, 2-cyano-n-butyl group, 3-cyano-n-butyl group, and 4-cyano-n-butyl group.

Of these nitrogen-containing polar groups, a cyano group, cyanomethyl group, 1-cyanoethyl group, and the like are preferable.

Particularly preferable groups represented by $R^3$, $R^4$, or $R^5$ in the formula (2) are a hydrogen atom, methyl group, ethyl group, hydroxyl group, carboxyl group, hydroxymethyl group, methoxy group, ethoxy group, cyano group, cyanomethyl group, 1-cyanoethyl group, and the like.

m and n in the formula (2) are preferably either 0 or 1.

The recurring unit (I) may be present in the resin (A1) either individually or in combination of two or more.

As preferable examples of the resin (A1) in the present invention, an alkali insoluble or scarcely alkali soluble acid-labile group-containing resin having the recurring unit (I) and recurring unit (II) shown by the following formula (3) (hereinafter referred to as "resin (A1-1)"), an alkali insoluble or scarcely alkali soluble acid-labile group-containing resin having the recurring unit (I), recurring unit (II), and recurring unit (III) shown by the following formula (4) (hereinafter referred to as "resin (A1-2)"), and the like can be given:

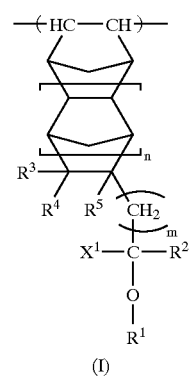

(I)

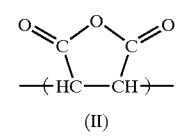

(II)

wherein R¹, X¹, and R² are the same as defined for the above formula (1), and R³, R⁴, R⁵, n, and m have the same meanings as defined for the corresponding symbols in the formula (2),

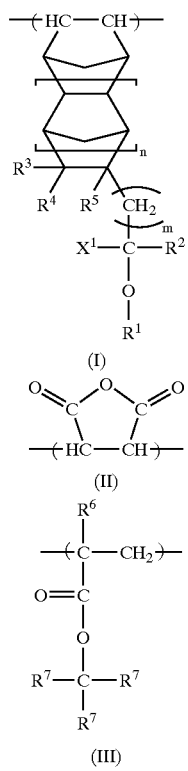

wherein R¹, X¹, and R² are the same as defined for the above formula (1), R³, R⁴, R⁵, n, and m have the same meanings as defined for the corresponding symbols in the formula (2), R⁶ represents a hydrogen atom or methyl group, and R⁷ individually represents a linear or branched alkyl group having 1–4 carbon atoms or a monovalent alicyclic hydrocarbon group having 4–20 carbon atoms or a derivative thereof, or any two of R⁷s form in combination a divalent alicyclic hydrocarbon group having 4–20 carbon atoms or a derivative thereof, with the remaining R⁷ being a linear or branched alkyl group having 1–4 carbon atoms or a monovalent alicyclic hydrocarbon group having 4–20 carbon atoms or a derivative thereof.

As examples of the linear or branched alkyl group having 1–4 carbon atoms represented by R⁷ in the formula (4), a methyl group, ethyl group, n-propyl group, isopropyl group, n-butyl group, 2-methylpropyl group, 1-methylpropyl group, and t-butyl group can be given.

Of these alkyl groups, methyl group and ethyl groups are particularly preferable.

As examples of the monovalent alicyclic hydrocarbon group having 4–20 carbon atoms and the divalent alicyclic hydrocarbon group having 4–20 carbon atoms formed by two R⁷s in combination, alicyclic groups derived from a cycloalkane such as norbornane, tricyclodecane, tetracyclododecane, adamantane, cyclobutane, cyclopentane, cyclohexane, cycloheptane, or cyclooctane, and groups obtained by replacing hydrogen atoms on these alicyclic groups with one or more linear or branched alkyl groups having 1–4 carbon atoms, such as methyl group, ethyl group, n-propyl group, isopropyl group, n-butyl group, 2-methyl propyl group, 1-methyl propyl group, or t-butyl group, can be given.

Of these monovalent and divalent alicyclic hydrocarbon groups, groups containing an alicyclic ring derived from norbornane, tricyclodecane, tetracyclododecane, or adamantane, groups in which these alicyclic ring-containing groups are substituted with the above alkyl groups are preferable.

As examples of derivatives of the monovalent or divalent alicyclic hydrocarbon groups, groups having one or more substituents such as a hydroxyl group; a carboxyl group; a linear or branched hydroxyalkyl group having 1–4 carbon atoms such as a hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, and 4-hydroxy-n-butyl group; a linear or branched alkoxyl group having 1–4 carbon atoms such as a methoxy group, ethoxy group, n-propoxy group, 2-propoxy group, n-butoxy group, 2-methylpropoxy group, 1-methylpropoxy group, and t-butoxy group; a cyano group; a linear or branched cyanoalkyl group having 2–5 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, and 4-cyanobutyl group; and the like can be given.

Of these substituents, a hydroxyl group, carboxyl group, hydroxymethyl group, cyano group, cyanomethyl group, and the like are preferable.

The group —COO—C(R⁷)₃ in the recurring unit (III) in the formula (4) dissociates at the carbonyloxy group (COO—) and the group —C(R⁷)₃, and is herein called acid-labile group (ii).

Specific preferable examples of the acid-labile group (ii) include a t-butoxycarbonyl group and the groups shown by the flowing formulas (ii-1) to (ii-57).

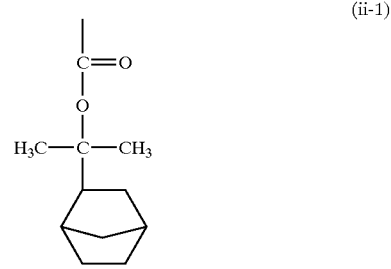

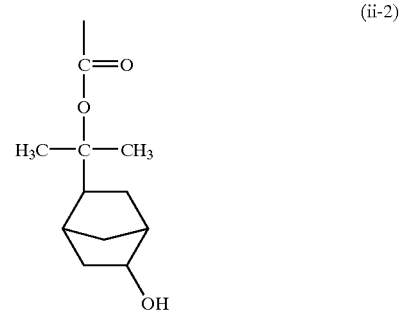

(ii-3)
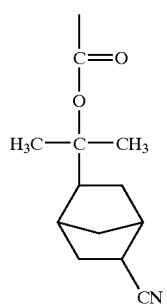
(ii-4)
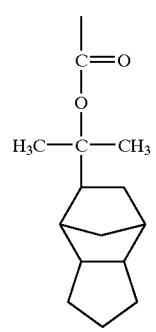
(ii-5)
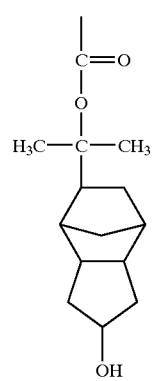
(ii-6)
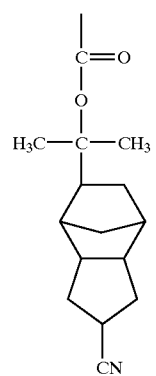
(ii-7)
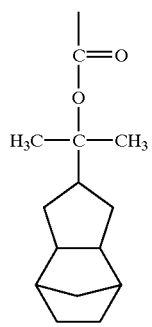
(ii-8)
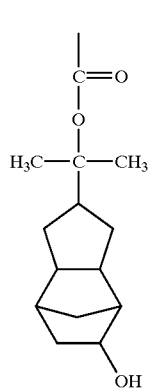
(ii-9)
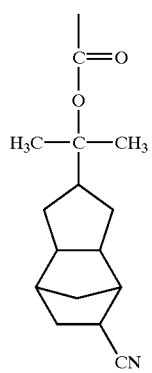
(ii-10)
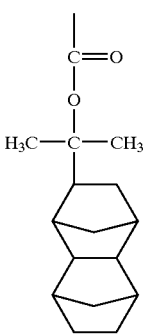

(ii-11) 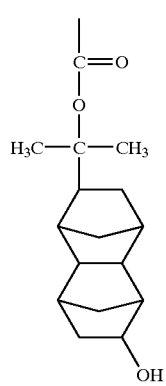
(ii-12) 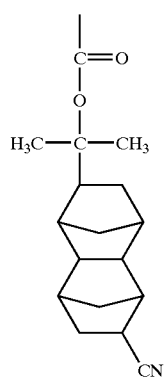
(ii-13) 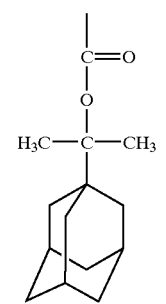
(ii-14) 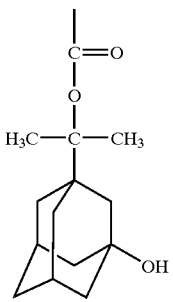
(ii-15) 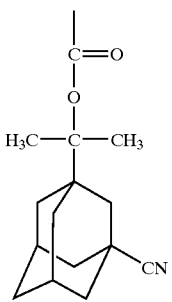
(ii-16) 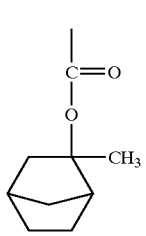
(ii-17) 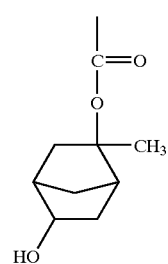
(ii-18) 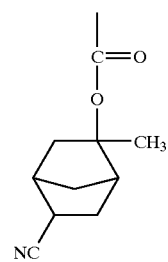
(ii-19) 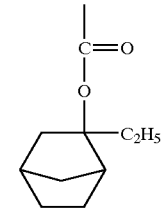
(ii-20) 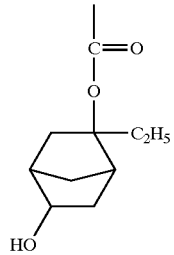
(ii-21) 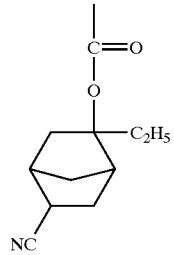

-continued
(ii-22)
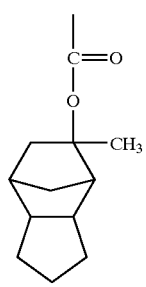
(ii-23)
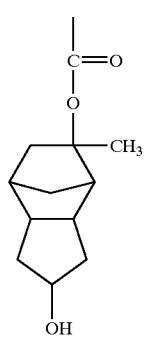
(ii-24)
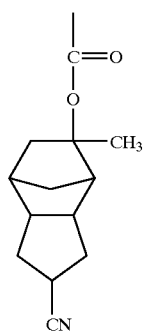
(ii-25)
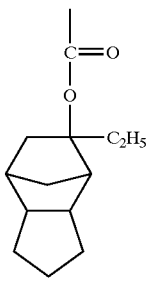
(ii-26)
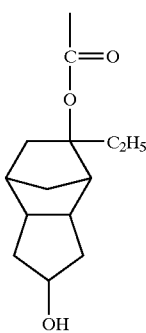
-continued
(ii-27)
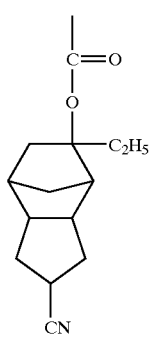
(ii-28)
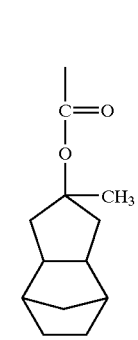
(ii-29)
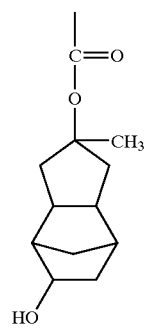
(ii-30)
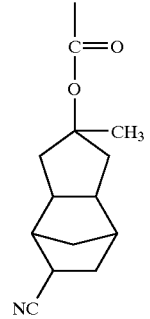
(ii-31)
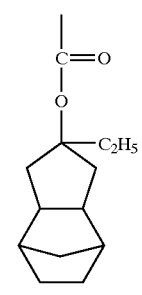

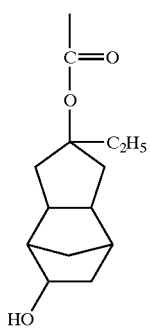 (ii-32)
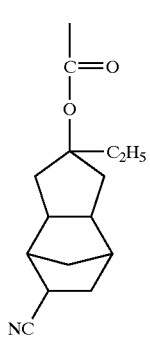 (ii-33)
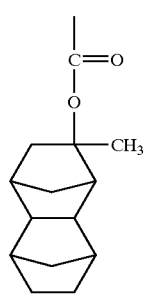 (ii-34)
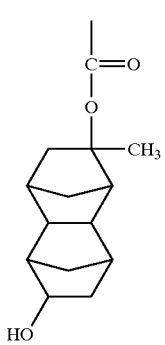 (ii-35)
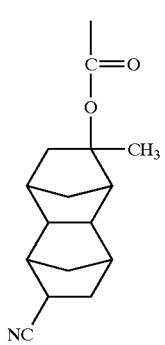 (ii-36)
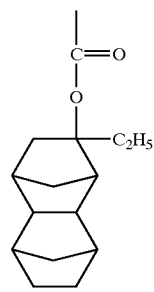 (ii-37)
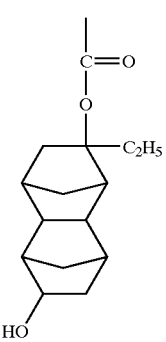 (ii-38)
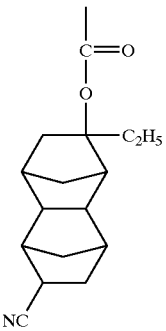 (ii-39)
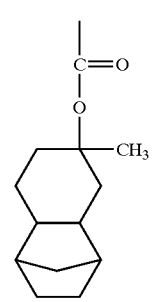 (ii-40)
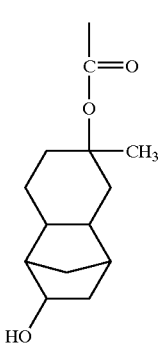 (ii-41)

(ii-42)
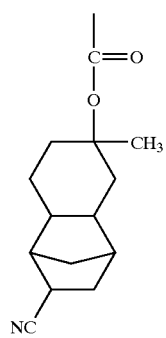
(ii-43)
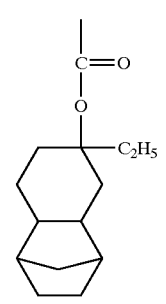
(ii-44)
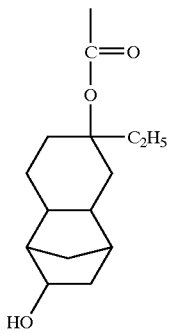
(ii-45)
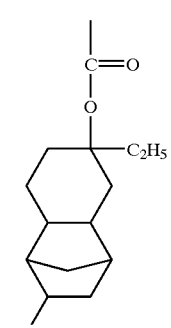
(ii-46)
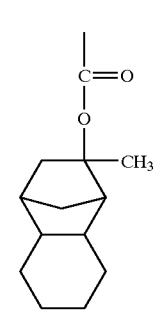
(ii-47)
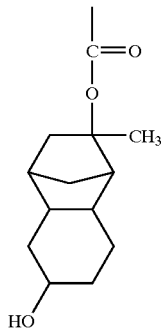
(ii-48)
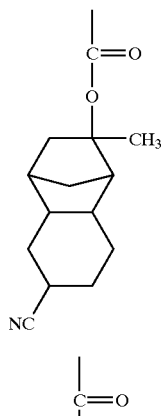
(ii-49)
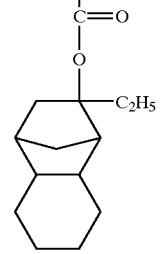
(ii-50)
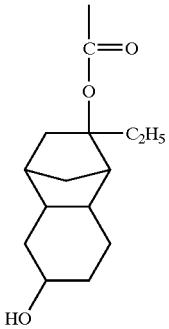
(ii-51)
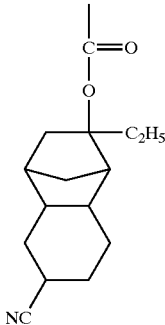

-continued (ii-52) 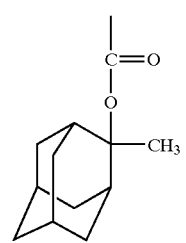

(ii-53) 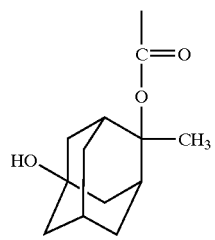

(ii-54) 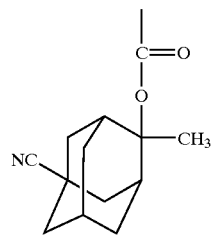

(ii-55) 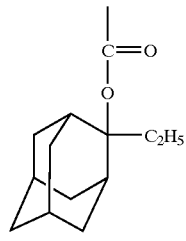

(ii-56) 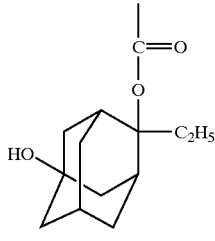

(ii-57) 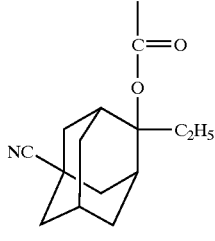

Of these acid-labile organic groups (ii), t-butoxy carbonyl group, 1-methylcyclopentyloxycarbonyl group, 1-methylcyclohexyloxycarbonyl group, and the groups shown by the formulas (ii-1), (ii-2), (ii-10), (ii-11), (ii-13), (ii-14), (ii-16), (ii-17), (ii-22), (ii-23), (ii-34), (ii-35), (ii-40), (ii-41), (ii-52), and (ii-53) are particularly preferable.

As examples of monomers which provide the recurring unit (I) in the resin (A1), resin (A1-1), and resin (A1-2), compounds shown by the following formula (6) (hereinafter referred to as "norbornene derivatives (α1)") can be given:

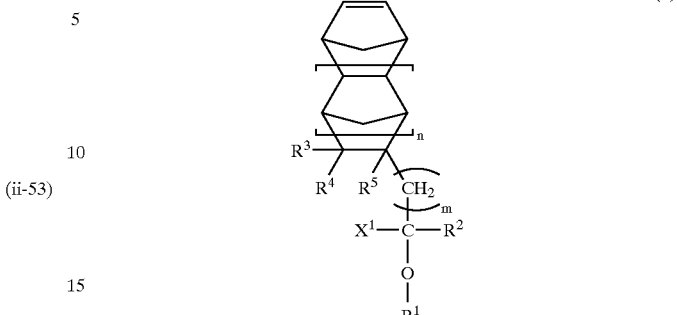

(6)

wherein $R^1$, $X^1$, and $R^2$ are the same as defined for the above formula (1), and $R^3$, $R^4$, $R^5$, n, and m have the same meanings as defined for the corresponding symbols in the formula (2).

The following compounds can be given as examples of the norbornene derivatives (α1) having n=m=0 in the formula (6):

5-(2,2,2-trifluoro-1-hydroxyethyl)bicyclo[2.2.1]hept-2-ene,
5-(2,2,2-trifluoro-1-methyl-1-hydroxyethyl)bicyclo[2.2.1]-hept-2-ene,
5-(2,2,2-trifluoro-1-trifluoromethyl-1-hydroxyethyl)-bicyclo[2.2.1]hept-2-ene,
5-(2,2,2-trifluoro-1-methoxyethyl)bicyclo[2.2.1]hept-2-ene,
5-(2,2,2-trifluoro-1-methyl-1-methoxyethyl)bicyclo[2.2.1]-hept-2-ene,
5-(2,2,2-trifluoro-1-trifluoromethyl-1-methoxyethyl)-bicyclo[2.2.1]hept-2-ene,
5-(2,2,2-trifluoro-1-methylcarbonyloxyethyl)bicyclo[2.2.1]-hept-2-ene,
5-(2,2,2-trifluoro-1-methyl-1-methylcarbonyloxyethyl)-bicyclo[2.2.1]hept-2-ene,
5-(2,2,2-trifluoro-1-trifluoromethyl-1-methylcarbonyloxy-ethyl)bicyclo[2.2.1]hept-2-ene,
5-(2,2,2-trifluoro-1-t-butoxycarbonyloxyethyl)bicyclo-[2.2.1]hept-2-ene,
5-(2,2,2-trifluoro-1-methyl-1-t-butoxycarbonyloxyethyl)-bicyclo[2.2.1]hept-2-ene, and
5-(2,2,2-trifluoro-1-trifluoromethyl-1-t-butoxycarbonyloxyethyl)bicyclo[2.2.1]hept-2-ene.

The following compounds can be given as specific examples of norbornene derivatives (α1) having n=0 and m=1:

5-(2-trifluoromethyl-2-hydroxyethyl)bicyclo[2.2.1]hept-2-ene,
5-(2-trifluoromethyl-2-methyl-2-hydroxyethyl)bicyclo-[2.2.1]hept-2-ene,
5-[2,2-bis(trifluoromethyl)-2-hydroxyethyl]bicyclo-[2.2.1]hept-2-ene,
5-(2-trifluoromethyl-2-methoxyethyl)bicyclo[2.2.1]-hept-2-ene,
5-(2-trifluoromethyl-2-methyl-2-methoxyethyl)bicyclo-[2.2.1]hept-2-ene,
5-[2,2-bis(trifluoromethyl)-2-methoxyethyl]bicyclo-[2.2.1]hept-2-ene,
5-[2-trifluoromethyl-2-methylcarbonyloxyethyl]bicyclo-[2.2.1]hept-2-ene,
5-(2-trifluoromethyl-2-methyl-methylcarbonyloxyethyl)-bicyclo[2.2.1]hept-2-ene,
5-[2,2-bis(trifluoromethyl)-2-methylcarbonyloxyethyl]-bicyclo[2.2.1]hept-2-ene, 5-[2-trifluoromethyl-2-t-butoxycarbonyloxyethyl]bicyclo[2.2.1]hept-2-ene,
5-(2-trifluoromethyl-2-methyl-2-t-butoxycarbonyloxyethyl)-bicyclo[2.2.1]hept-2-ene, and
5-[2,2-bis(trifluoromethyl)-2-t-butoxycarbonyloxyethyl]-bicyclo[2.2.1]hept-2-ene.

The following compounds can be given as examples of the norbornene derivatives (α1) having n=1 and m=0 in the formula (6):
8-(2,2,2-trifluoro-1-hydroxyethyl)tetracyclo-[4.4.0.1$^{2,5}$.1$^{7,10}$]dodec-3-ene,
8-(2,2,2-trifluoro-1-methyl-1-hydroxyethyl)tetracyclo-[4.4.4.0.1$^{2,5}$.1$^{7,10}$]dodec-3-ene,
8-(2,2,2-trifluoro-1-trifluoromethyl-1-hydroxyethyl)-tetracyclo[4.4.0.1$^{2,5}$.1$^{7,10}$]dodec-3-ene,
8-(2,2,2-trifluoro-1-methoxyethyl)tetracyclo-[4.4.0.1$^{2,5}$.1$^{7,10}$]dodec-3-ene,
8-(2,2,2-trifluoro-1-methyl-1-methoxyethyl)tetracyclo-[4.4.0.1$^{2,5}$.1$^{7,10}$]dodec-3-ene,
8-(2,2,2-trifluoro-1-trifluoromethyl-1-methoxyethyl)-tetracyclo[4.4.0.1$^{2,5}$.1$^{7,10}$]dodec-3-ene,
8-(2,2,2-trifluoro-1-methylcarbonyloxyethyl)tetracyclo-[4.4.0.1$^{2,5}$.1$^{7,10}$]dodec-3-ene,
8-(2,2,2-trifluoro-1-methyl-1-methylcarbonyloxyethyl)-tetracyclo[4.4.0.1$^{2,5}$.1$^{7,10}$]dodec-3-ene,
8-(2,2,2-trifluoro-1-trifluoromethyl-1-methylcarbonyloxyethyl)tetracyclo[4.4.0.1$^{2,5}$.1$^{7,10}$]dodec-3-ene,
8-(2,2,2-trifluoro-1-t-butoxycarbonyloxyethyl)tetracyclo-[4.4.0.1$^{2,5}$.1$^{7,10}$]dodec-3-ene,
8-(2,2,2-trifluoro-1-methyl-1-t-butoxycarbonyloxyethyl)-tetracyclo[4.4.0.1$^{2,5}$.1$^{7,10}$]dodec-3-ene,
8-(2,2,2-trifluoro-1-trifluoromethyl-1-t-butoxycarbonyloxyethyl)tetracyclo[4.4.0.1$^{2,5}$.1$^{7,10}$]dodec-3-ene, The following compounds can be given as examples of the norbornene derivatives (α1) having n=1 and m=1 in the formula (6):
8-(2-trifluoromethyl-2-hydroxyethyl)tetracyclo-[4.4.0.1$^{2,5}$.1$^{7,10}$]dodec-3-ene,
8-(2-trifluoromethyl-2-methyl-2-hydroxyethyl)tetracyclo-[4.4.0.1$^{2,5}$.1$^{7,10}$]dodec-3-ene,
8-[2,2-bis(trifluoromethyl)-2-hydroxyethyl]tetracyclo-[4.4.0.1$^{2,5}$.1$^{7,10}$]dodec-3-ene,
8-(2-trifluoromethyl-2-methoxyethyl)tetracyclo-[4.4.0.1$^{2,5}$.1$^{7,10}$]dodec-3-ene,
8-(2-trifluoromethyl-2-methyl-2-methoxyethyl)tetracyclo-[4.4.0.1$^{2,5}$.1$^{7,10}$]dodec-3-ene,
8-[2,2-bis(trifluoromethyl)-2-methoxyethyl]tetracyclo-[4.4.0.1$^{2,5}$.1$^{7,10}$]dodec-3-ene,
8-[2-trifluoromethyl-2-methylcarbonyloxyethyl]tetracyclo-[4.4.0.1$^{2,5}$.1$^{7,10}$]dodec-3-ene,
8-(2-trifluoromethyl-2-methyl-2-methylcarbonyloxyethyl)-tetracyclo[4.4.0.1$^{2,5}$.1$^{7,10}$]dodec-3-ene,
8-[2,2-bis(trifluoromethyl)-2-methylcarbonyloxyethyl]-tetracyclo[4.4.0.1$^{2,5}$.1$^{7,10}$]dodec-3-ene,
8-[2-trifluoromethyl-2-t-butoxycarbonyloxyethyl]-tetracyclo[4.4.0.1$^{2,5}$.1$^{7,10}$]dodec-3-ene,
8-(2-trifluoromethyl-2-methyl-2-t-butoxycarbonyloxyethyl)-tetracyclo[4.4.0.1$^{2,5}$.1$^{7,10}$]dodec-3-ene, and
8-[2,2-bis(trifluoromethyl)-2-t-butoxycarbonyloxyethyl]-tetracyclo[4.4.0.1$^{2,5}$.1$^{7,10}$]dodec-3-ene, Of these norbornene derivatives (α1), the following compounds are preferable:
5-(2,2,2-trifluoro-1-trifluoromethyl-1-hydroxyethyl)-bicyclo[2.2.1]hept-2-ene,
5-(2,2,2-trifluoro-1-trifluoromethyl-1-methoxyethyl)-bicyclo[2.2.1]hept-2-ene,
5-(2,2,2-trifluoro-1-trifluoromethyl-1-methylcarbonyloxyethyl)bicyclo[2.2.1]hept-2-ene,
5-(2,2,2-trifluoro-1-trifluoromethyl-1-t-butoxycarbonyloxyethyl)bicyclo[2.2.1]hept-2-ene,
5-[2,2-bis(trifluoromethyl)-2-hydroxyethyl]bicyclo[2.2.1]-hept-2-ene,
5-[2,2-bis(trifluoromethyl)-2-methoxyethyl]bicyclo[2.2.1]-hept-2-ene,
5-[2,2-bis(trifluoromethyl)-2-methylcarbonyloxyethyl]-bicyclo[2.2.1]hept-2-ene,
5-[2,2-bis(trifluoromethyl)-2-t-butoxycarbonyloxyethyl]-bicyclo[2.2.1]hept-2-ene,
8-(2,2,2-trifluoro-1-trifluoromethyl-1-hydroxyethyl)-tetracyclo[4.4.0.1$^{2,5}$.1$^{7,10}$]dodec-3-ene,
8-(2,2,2-trifluoro-1-trifluoromethyl-1-methoxyethyl)-tetracyclo[4.4.0.1$^{2,5}$.1$^{7,10}$]dodec-3-ene,
8-(2,2,2-trifluoro-1-trifluoromethyl-1-methylcarbonyloxyethyl)tetracyclo[4.4.0.1$^{2,5}$.1$^{7,10}$]dodec-3-ene,
8-(2,2,2-trifluoro-1-trifluoromethyl-1-t-butoxycarbonyloxyethyl)tetracyclo[4.4.0.1$^{2,5}$.1$^{7,10}$]dodec-3-ene,
8-[2,2-bis(trifluoromethyl)-2-hydroxyethyl]tetracyclo-[4.4.0.1$^{2,5}$.1$^{7,10}$]dodec-3-ene,
8-[2,2-bis(trifluoromethyl)-2-methoxyethyl]tetracyclo-[4.4.0.1$^{2,5}$.1$^{7,10}$]dodec-3-ene,
8-[2,2-bis(trifluoromethyl)-2-methylcarbonyloxyethyl]-tetracyclo[4.4.0.1$^{2,5}$.1$^{7,10}$]dodec-3-ene,
8-[2,2-bis(trifluoromethyl)-2-t-butoxycarbonyloxyethyl]-tetracyclo[4.4.0.1$^{2,5}$.1$^{7,10}$]dodec-3-ene, The norbornene derivatives (α1) can be synthesized by the method disclosed by Hiroshi Ito in The American Chemical Society Symposium (1998) (see Preprint, pages 208–211).

The monomer providing the recurring unit (II) in the resin (A1-1) and resin (A1-2) is maleic anhydride. Maleic anhydride copolymerizes well with norbornene derivatives (α1), later described norbornenes and norbornene derivatives (β-1), and other norbornene derivatives. The copolymerization with maleic anhydride increases the molecular weight of the resulting resin (A1-1) and resin (A1-2) to a desired level.

The monomer providing the recurring unit (III) in the resin (A1-2) is a compound derived from (meth) acrylic acid by converting the carboxyl group into the acid-labile group (ii).

The recurring unit (III) may be present in the resin (A1-2) either individually or in combination of two or more.

The resin (A1), resin (A1-1), and resin (A1-2) may comprise at least one recurring unit other than the recurring units (I), (II), or (III) (hereinafter referred to as "other recurring units (a)").

As an example of the other recurring unit (a), the recurring unit containing an acid-labile group shown by the following formula (7) (hereinafter referred to as "recurring unit (7)") can be given.

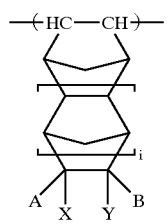

(7)

wherein A and B individually represent a hydrogen atom or an acid-labile group having 20 or less carbon atoms which dissociates and produces an acidic functional group in the presence of an acid, at least one of A and B being the acid-labile group, X and Y individually represent a hydrogen atom or a linear or branched monovalent alkyl group having 1–4 carbon atoms, and i is an integer of 0 to 2.

In addition to the above acid-labile group (ii), the following groups can be given as examples of the acid-labile group represented by a or B in the formula (7): a linear, branched, or cyclic alkoxycarbonyl group such a methoxycarbonyl group, ethoxycarbonyl group, n-propoxycarbonyl group, 2-propoxycarbonyl group, n-butoxycarbonyl group, 2-methylpropoxycarbonyl group, 1-methylpropoxycarbonyl group, n-pentyloxycarbonyl group, n-hexyloxycarbonyl group, n-heptyloxycarbonyl group, n-octyloxycarbonyl group, n-decyloxycarbonyl group, cyclopentyloxycarbonyl group, cyclohexyloxycarbonyl group, 4-t-butylcyclohekyloxycarbonyl group, cycloheptyloxycarbonyl group, and
cyclooctyloxycarbonyl group;
an aryloxycarbonyl group such as a phenoxycarbonyl group, 4-t-butylphenoxycarbonyl group, and 1-naphthyloxycarbonyl group;
an aralkyloxycarbonyl group such as a benzyloxycarbonyl group, 4-t-butylbenzyloxycarbonyl group, phenethyloxycarbonyl group, and 4-t-butylphenethyloxycarbonyl group;
a linear, branched, or cyclic 1-alkyloxyethoxycarbonyl group such as a 1-methoxyethoxycarbonyl group, 1-ethoxyethoxycarbonyl group, 1-n-propoxyethoxycarbonyl group, 1-i-propoxyethoxycarbonyl group, 1-n-butoxyethoxycarbonyl group, 1-(2'-methylpropoxy) ethoxycarbonyl group, 1-(1'-methylpropoxy) ethoxycarbonyl group, 1-t-butoxyethoxycarbonyl group, 1-cyclohexyloxyethoxycarbonyl group, and 1-(4'-t-butylcyclohexyloxy)ethoxycarbonyl group;
a 1-aryloxyethoxycarbonyl group such as a 1-phenoxyethoxycarbonyl group, 1-(4'-t-butylphenoxy) ethoxycarbonyl group, and 1-(1'-naphthyloxy) ethoxycarbonyl group;
a 1-aralkyloxyethoxycarbonyl group such as a 1-benzyloxyethoxycarbonyl group, 1-(4'-t-butylbenzyloxy)ethoxycarbonyl group, 1-phenethyloxyethoxycarbonyl group, and 1-(4'-t-butylphenethyloxy)ethoxycarbonyl group;
a linear, branched, or cyclic alkoxycarbonylmethoxycarbonyl group such as a methoxycarbonylmethoxycarbonyl group, ethoxycarbonylmethoxycarbonyl group, n-propoxycarbonylmethoxycarbonyl group, i-propoxycarbonylmethoxycarbonyl group, n-butoxycarbonylmethoxycarbonyl group, 2-methylpropoxycarbonylmethoxycarbonyl group, 1-methylpropoxycarbonylmethoxycarbonyl group, t-butoxycarbonylmethoxycarbonyl group, cyclohexyloxycarbonylmethoxycarbonyl group, and 4-t-butylcyclohexyloxycarbonylmethoxycarbonyl group;
a linear, branched, or cyclic alkoxycarbonylmethyl group such as a methoxycarbonylmethyl group, ethoxycarbonylmethyl group, n-propoxycarbonylmethyl group, 2-propoxycarbonylmethyl group, n-butoxycarbonylmethyl group, 2-methylpropoxycarbonylmethyl group, 1-methylpropoxycarbonylmethyl group, t-butoxycarbonylmethyl group, cyclohexyloxycarbonylmethyl group, and 4-t-butylcyclohexyloxycarbonylmethyl group, an aryloxycarbonylmethyl group such as a phenoxycarbonylmethyl group, 4-t-butylphenoxycarbonylmethyl group, and 1-naphthyloxycarbonylmethyl group;
an aralkyloxycarbonylmethyl group such as a benzyloxycarbonylmethyl group, 4-t-butylbenzyloxycarbonylmethyl group, phenethyloxycarbonylmethyl group, and 4-t-butylphenethyloxycarbonylmethyl group;
a linear, branched, or cyclic 2-alkoxycarbonylethyl group such as a 2-methoxycarbonylethyl group, 2-ethoxycarbonylethyl group, 2-n-propoxycarbonylethyl group, 2-i-propoxycarbonylethyl group, 2-n-butoxycarbonylethyl group, 2-(2'-methylpropoxy) carbonylethyl group, 2-(1'-methylpropoxy)carbonylethyl group, 2-t-butoxycarbonylethyl group, 2-cyclohexyloxycarbonylethyl group, and 2-(4'-t-butylcyclohexyloxycarbonyl)ethyl group;
a 2-aryloxycarbonylethyl group such as a 2-phenoxycarbonylethyl group, 2-(4'-t-butylphenoxycarbonyl)ethyl group, and 2-(1'-naphthyloxycarbonyl)ethyl group;
a 2-aralkyloxycarbonylethyl group such as a 2-benzyloxycarbonylethyl group, 2-(4'-t-butylbenzyloxycarbonyl)ethyl group, 2-phenethyloxycarbonylethyl group, and 2-(4'-t-butylphenethyloxycarbonyl)ethyl group;
a tetrahydrofuranyloxycarbonyl group; and a tetrahydropyranyloxycarbonyl group.

Of these acid-labile organic groups (iii), t-butoxycarbonyl group and the groups shown by the formulas (ii-1), (ii-2), (ii-10), (ii-11), (ii-13), (ii-14), (ii-16), (ii-17), (ii-22), (ii-23), (ii-34), (ii-35), (ii-40), (ii-41), (ii-52), and (ii-53) are particularly preferable.

Of these groups, groups corresponding to the formula —COOR' (wherein R' represents a linear, branched, or cyclic alkyl group having 1–19 carbon atoms) or the formula —COOCH$_2$COOR" (wherein R" represents a linear, branched, or cyclic alkyl group having 1–17 carbon atoms) are preferable.

As examples of linear or branched alkyl groups having 1–4 carbon atoms represented by X or Y, a methyl group, ethyl group, n-propyl group, isopropyl group, n-butyl group, i-butyl group, sec-butyl group, t-butyl group, and the like can be given.

Of these alkyl groups, a methyl group and ethyl group are particularly preferable.

i in the formula (5) is preferably either 0 or 1.

As examples of monomers providing the recurring unit (7), compounds shown by the following formula (8) (hereinafter referred to as "norbornene derivatives (β-1)") can be given.

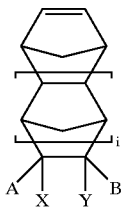

(8)

wherein A, B, X, Y, and i have the same meanings as defined for the formula (7).

Given as examples of the norbornene derivatives (β-1) are a compound of the formula (8), wherein either one of A and B, or both, are the acid-labile group (ii), the remainder of the A and B, X, and Y are a hydrogen atom, and i is 0; a compound of the formula (8), wherein either one of A and B, or both, are the acid-labile group (ii), the remainder of the A and B, X, and Y are a hydrogen atom, and i is 1; and the following compounds:

5-methoxycarbonylbicyclo[2.2.1]hept-2-ene,
5-ethoxycarbonylbicyclo[2.2.1]hept-2-ene,
5-n-propoxycarbonylbicyclo[2.2.1]hept-2-ene,
5-i-propoxycarbonylbicyclo[2.2.1]hept-2-ene,
5-n-butoxycarbonylbicyclo[2.2.1]hept-2-ene,
5-(2'-methylpropoxycarbonyl)bicyclo[2.2.1]hept-2-ene,
5-(1'-methylpropoxycarbonyl)bicyclo[2.2.1]hept-2-ene,
5-t-butoxycarbonylbicyclo[2.2.1]hept-2-ene,
5-cyclopentyloxycarbonylbicyclo[2.2.1]hept-2-ene,
5-(1'-methylcyclopentyloxycarbonyl)bicyclo[2.2.1]hept-2-ene,
5-cyclohexyloxycarbonylbicyclo[2.2.1]hept-2-ene,
5-(1'-methylcyclohexyloxycarbonyl)bicyclo[2.2.1]hept-2-ene,
5-(4'-t-butylcyclohexyloxycarbonyl)bicyclo[2.2.1]hept-2-ene,
5-phenoxycarbonylbicyclo[2.2.1]hept-2-ene,
5-(1'-ethoxyethoxycarbonyl)bicyclo[2.2.1]hept-2-ene,
5-(1'-cyclohexyloxyethoxycarbonyl)bicyclo[2.2.1]hept-2-ene,
5-t-butoxycarbonylmethoxycarbonylbicyclo[2.2.1]hept-2-ene,
5-tetrahydrofuranyloxycarbonylbicyclo[2.2.1]hept-2-ene,
5-tetrahydropyranyloxycarbonylbicyclo[2.2.1]hept-2-ene,
5-methyl-5-methoxycarbonylbicyclo[2.2.1]hept-2-ene,
5-methyl-5-ethoxycarbonylbicyclo[2.2.1]hept-2-ene,
5-methyl-5-n-propoxycarbonylbicyclo[2.2.1]hept-2-ene,
5-methyl-5-i-propoxycarbonylbicyclo[2.2.1]hept-2-ene,
5-methyl-5-n-butoxycarbonylbicyclo[2.2.1]hept-2-ene,
5-methyl-5-(2'-methylpropoxycarbonyl)bicyclo[2.2.1]hept-2-ene,
5-methyl-5-(1'-methylpropoxycarbonyl)bicyclo[2.2.1]hept-2-ene,
5-methyl-5-t-butoxycarbonylbicyclo[2.2.1]hept-2-ene,
5-methyl-5-cyclohexyloxycarbonylbicyclo[2.2.1]hept-2-ene,
5-methyl-5-(4'-t-butylcyclohexyloxycarbonyl)bicyclo[2.2.1]-hept-2-ene,
5-methyl-5-phenoxycarbonylbicyclo[2.2.1]hept-2-ene,
5-methyl-5-(1'-ethoxyethoxycarbonyl)bicyclo[2.2.1]hept-2-ene,
5-methyl-5-(1'-cyclohexyloxyethoxycarbonyl)bicyclo[2.2.1]-hept-2-ene,
5-methyl-5-t-butoxycarbonylmethoxycarbonylbicyclo[2.2.1]-hept-2-ene,
5-methyl-5-tetrahydrofuranyloxycarbonylbicyclo[2.2.1]-hept-2-ene,
5-methyl-5-tetrahydropyranyloxycarbonylbicyclo[2.2.1]-hept-2-ene,
5,6-di(methoxycarbonyl)bicyclo[2.2.1]hept-2-ene,5,6-di(ethoxycarbonyl)bicyclo[2.2.1]hept-2-ene,
5,6-di(n-propoxycarbonyl)bicyclo[2.2.1]hept-2-ene,
5,6-di(i-propoxycarbonyl)bicyclo[2.2.1]hept-2-ene,
5,6-di(n-butoxycarbonyl)bicyclo[2.2.1]hept-2-ene,
5,6-di(2'-methylpropoxycarbonyl)bicyclo[2.2.1]hept-2-ene,
5,6-di(1'-methylpropoxycarbonyl)bicyclo[2.2.1]hept-2-ene,
5,6-di(t-butoxycarbonyl)bicyclo[2.2.1]hept-2-ene,
5,6-di(cyclopentyloxycarbonyl)bicyclo[2.2.1]hept-2-ene,
5,6-di(1'-methylcyclopentyloxycarbonyl)bicyclo[2.2.1]-hept-2-ene,
5,6-di(cyclohexyloxycarbonyl)bicyclo[2.2.1]hept-2-ene,
5,6-di(1'-methylcyclohexyloxycarbonyl)bicyclo[2.2.1]hept-2-ene,
5,6-di(4'-t-butylcyclohexyloxycarbonyl)bicyclo[2.2.1]hept-2-ene,
5,6-di(phenoxycarbonyl)bicyclo[2.2.1]hept-2-ene,
5,6-di(1'-ethoxyethoxycarbonyl)bicyclo[2.2.1]hept-2-ene,
5,6-di(1'-cyclohexyloxyethoxycarbonyl)bicyclo[2.2.1]hept-2-ene,
5,6-di(t-butoxycarbonylmethoxycarbonyl)bicyclo[2.2.1]hept-2-ene,
5,6-di(tetrahydrofuranyloxycarbonyl)bicyclo[2.2.1]hept-2-ene,
5,6-di(tetrahydropyranyloxycarbonyl)bicyclo[2.2.1]hept-2-ene,
8-methoxycarbonyltetracyclo[4.4.0.1$^{2,5}$.1$^{7,10}$]dodec-3-ene,
8-ethoxycarbonyltetracyclo[4.4.0.1$^{2,5}$.1$^{7,10}$]dodec-3-ene,
8-n-propoxycarbonyltetracyclo[4.4.0.1$^{2,5}$.1$^{7,10}$]dodec-3-ene,
8-i-propoxycarbonyltetracyclo[4.4.0.1$^{2,5}$.1$^{7,10}$]dodec-3-ene,
8-n-butoxycarbonyltetracyclo[4.4.0.1$^{2,5}$.1$^{7,10}$]dodec-3-ene,
8-(2'-methylpropoxy)carbonyltetracyclo[4.4.0.1$^{2,5}$.1$^{7,10}$]-dodec-3-ene,
8-(1'-methylpropoxy)carbonyltetracyclo[4.4.0.1$^{2,5}$.1$^{7,10}$]-dodec-3-ene,
8-t-butoxycarbonyltetracyclo[4.4.0.1$^{2,5}$.1$^{7,10}$]dodec-3-ene,
8-cyclopentyloxycarbonyltetracyclo[4.4.0.1$^{2,5}$.1$^{7,10}$]dodec-3-ene,
8-(1'-methylcyclopentyloxycarbonyl)tetracyclo-[4.4.0.1$^{2,5}$.1$^{7,10}$]dodec-3-ene,
8-cyclohexyloxycarbonyltetracyclo[4.4.0.1$^{2,5}$.1$^{7,10}$]dodec-3-ene,
8-(1'-methylcyclohexyloxycarbonyl)tetracyclo-[4.4.0.1$^{2,5}$.1$^{7,10}$]dodec-3-ene,
8-(4'-t-butylcyclohexyloxy)carbonyltetracyclo-[4.4.0.1$^{2,5}$.1$^{7,10}$]dodec-3-ene,
8-phenoxycarbonyltetracyclo[4.4.0.1$^{2,5}$.1$^{7,10}$]dodec-3-ene,
8-(1'-ethoxyethoxy)carbonyltetracyclo[4.4.0.1$^{2,5}$.1$^{7,10}$]dodec-3-ene,
8-(1'-cyclohexyloxyethoxy)carbonyltetracyclo-[4.4.0.1$^{2,5}$.1$^{7,10}$]dodec-3-ene,
8-t-butoxycarbonylmethoxycarbonyltetracyclo-[4.4.0.1$^{2,5}$.1$^{7,10}$]dodec-3-ene,
8-tetrahydrofuranyloxycarbonyltetracyclo[4.4.0.1$^{2,5}$.1$^{7,10}$]-dodec-3-ene,
8-tetrahydropyranyloxycarbonyltetracyclo[4.4.0.1$^{2,5}$.1$^{7,10}$]-dodec-3-ene,
8-methyl-8-methoxycarbonyltetracyclo[4.4.0.1$^{2,5}$.1$^{7,10}$]dodec-3-ene,
8-methyl-8-ethoxycarbonyltetracyclo[4.4.0.1$^{2,5}$.1$^{7,10}$]dodec-3-ene,
8-methyl-8-n-propoxycarbonyltetracyclo[4.4.0.1$^{2,5}$.1$^{7,10}$]-dodec-3-ene,
8-methyl-8-i-propoxycarbonyltetracyclo[4.4.0.1$^{2,5}$.1$^{7,10}$]-dodec-3-ene, 8-methyl-8-n-butoxycarbonyltetracyclo[4.4.0.1$^{2,5}$.1$^{7,10}$]-dodec-3-ene,
8-methyl-8-(2'-methylpropoxy)carbonyltetracyclo-[4.4.0.1$^{2,5}$.1$^{7,10}$]dodec-3-ene,
8-methyl-8-(1'-methylpropoxy)carbonyltetracyclo-[4.4.0.1$^{2,5}$.1$^{7,10}$]dodec-3-ene,
8-methyl-8-t-butoxycarbonyltetracyclo[4.4.0.1$^{2,5}$.1$^{7,10}$]-dodec-3-ene,
8-methyl-8-cyclohexyloxycarbonyltetracyclo[4.4.0.1$^{2,5}$.1$^{7,10}$]-dodec-3-ene,
8-methyl-8-(4'-t-butylcyclohexyloxy)carbonyltetracyclo-[4.4.0.1$^{2,5}$.1$^{7,10}$]dodec-3-ene,
8-methyl-8-phenoxycarbonyltetracyclo[4.4.0.1$^{2,5}$.1$^{7,10}$]dodec-3-ene,
8-methyl-8-(1'-ethoxyethoxy)carbonyltetracyclo-[4.4.0.1$^{2,5}$.1$^{7,10}$]dodec-3-ene,
8-methyl-8-(1'-cyclohexyloxyethoxy)carbonyltetracyclo-[4.4.0.1$^{2,5}$.1$^{7,10}$]dodec-3-ene,
8-methyl-8-t-butoxycarbonylmethoxycarbonyltetracyclo[4.4.0.1$^{2,5}$.1$^{7,10}$]dodec-3-ene,
8-methyl-8-tetrahydrofuranyloxycarbonyltetracyclo-[4.4.0.1$^{2,5}$.1$^{7,10}$]dodec-3-ene,
8-methyl-8-tetrahydropyranyloxycarbonyltetracyclo-[4.4.0.1$^{2,5}$.1$^{7,10}$]dodec-3-ene,
8,9-di(methoxycarbonyl)tetracyclo[4.4.0.1$^{2,5}$.1$^{7,10}$]dodec-3-ene,
8,9-di(ethoxycarbonyl)tetracyclo[4.4.0.1$^{2,5}$.1$^{7,10}$]dodec-3-ene,
8,9-di(n-propoxycarbonyl)tetracyclo[4.4.0.1$^{2,5}$.1$^{7,10}$]dodec-3-ene,
8,9-di(i-propoxycarbonyl)tetracyclo[4.4.0.1$^{2,5}$.1$^{7,10}$]dodec-3-ene,
8,9-di(n-butoxycarbonyl)tetracyclo[4.4.0.1$^{2,5}$.1$^{7,10}$]dodec-3-ene,
8,9-di(2'-methylpropoxycarbonyl)tetracyclo[4.4.0.1$^{2,5}$.1$^{7,10}$]-dodec-3-ene,
8,9-di(1'-methylpropoxycarbonyl)tetracyclo[4.4.0.1$^{2,5}$.1$^{7,10}$]-dodec-3-ene,
8,9-di(t-butoxycarbonyl)tetracyclo[4.4.0.1$^{2,5}$.1$^{7,10}$]dodec-3-ene,
8,9-di(cyclopentyloxycarbonyl)tetracyclo[4.4.0.1$^{2,5}$.1$^{7,10}$]-dodec-3-ene,
8,9-di(1'-methylcyclopentyloxycarbonyl)tetracyclo-[4.4.0.1$^{2,5}$.1$^{7,10}$]dodec-3-ene,
8,9-di(cyclohexyloxycarbonyl)tetracyclo[4.4.0.1$^{2,5}$.1$^{7,10}$]-dodec-3-ene,
8,9-di(1'-methylcyclohexyloxycarbonyl)tetracyclo-[4.4.0.1$^{2,5}$.1$^{7,10}$]dodec-3-ene,
8,9-di(4'-t-butylcyclohexyloxycarbonyl)tetracyclo-[4.4.0.1$^{2,5}$.1$^{7,10}$]dodec-3-ene,
8,9-di(phenoxycarbonyl)tetracyclo[4.4.0.1$^{2,5}$.1$^{7,10}$]dodec-3-ene,
8,9-di(1'-ethoxyethoxycarbonyl)tetracyclo[4.4.0.1$^{2,5}$.1$^{7,10}$]-dodec-3-ene,
8,9-di(1'-cyclohexyloxyethoxycarbonyl)tetracyclo-[4.4.0.1$^{2,5}$.1$^{7,10}$]dodec-3-ene,
8,9-di(t-butoxycarbonylmethoxycarbonyl)tetracyclo-[4.4.0.1$^{2,5}$.1$^{7,10}$]dodec-3-ene,
8,9-di(tetrahydrofuranyloxycarbonyl)tetracyclo-[4.4.0.1$^{2,5}$.1$^{7,10}$]dodec-3-ene, and
8,9-di(tetrahydropyranyloxycarbonyl)tetracyclo-[4.4.0.1$^{2,5}$.1$^{7,10}$]dodec-3-ene.

Of these norbornene derivatives (β-1), preferable compounds are a compound of the formula (8) in which either one of A and B or both are a t-butoxycarbonyl group, 1-methylcyclopentyloxycarbonyl group, 1-methylcyclohexyloxycarbonyl group, or the group shown by the formulas (ii-1), (ii-2), (ii-10), (ii-11), (ii-13), (ii-14), (ii-16), (ii-17), (ii-22), (ii-23), (ii-34), (ii-35), (ii-40), (ii-41), (ii-52), and (ii-53), the remainder of the A and B, X, and Y are a hydrogen atom, and i is 0; a compound of the formula (8) in which either one of A and B or both are a t-butoxycarbonyl group, 1-methylcyclopentyloxycarbonyl group, 1-methylcyclohexyloxycarbonyl group, or the group shown by the formulas (ii-1), (ii-2), (ii-10), (ii-11), (ii-13), (ii-14), (ii-16), (ii-17), (ii-22), (ii-23), (ii-34), (ii-35), (ii-40), (ii-41), (ii-52), and (ii-53), the remainder of the A and B, X, and Y are a hydrogen atom, and i is 1; and 5,6-di(t-butoxycarbonylmethoxycarbonyl)bicyclo[2.2.1]hept-2-ene, 8-methyl-8-t-butoxycarbonyltetracyclo-[4.4.0.1$^{2,5}$.1$^{7,10}$]dodec-3-ene, 8-methyl-8-t-butoxycarbonylmethoxycarbonyltetracyclo-[4.4.0.1$^{2,5}$.1$^{7,10}$]dodec-3-ene, and the like.

These preferable norbornene derivatives (β-1) may also be used as a monomer which provides the other recurring unit (b) in the resin (A2) described later.

The following compounds can be given as examples of monomers which provide the recurring unit (a) other than the recurring unit (7): monofunctional monomers including norbornenes such as norbornene(specifically, bicyclo[2.2.1]hept-2-ene),
5-methylbicyclo[2.2.1]hept-2-ene,
5-ethylbicyclo[2.2.1]hept-2-ene,
5-hydroxybicyclo[2.2.1]hept-2-ene,
5-hydroxymethylbicyclo[2.2.1]hept-2-ene,
tetracyclo[4.4.0.1$^{2,5}$.1$^{7,10}$]dodec-3-ene,
8-methyltetracyclo[4.4.0.1$^{2,5}$.1$^{7,10}$]dodec-3-ene,
8-ethyltetracyclo[4.4.0.1$^{2,5}$.1$^{7,10}$]dodec-3-ene,
8-hydroxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-fluorotetracyclo[4.4.0.1$^{2,5}$.1$^{7,10}$]dodec-3-ene,
8-fluoromethyltetracyclo[4.4.0.1$^{2,5}$.1$^{7,10}$]dodec-3-ene,
8-difluoromethyltetracyclo[4.4.0.1$^{2,5}$.1$^{7,10}$]dodec-3-ene,
8-trifluoromethyltetracyclo[4.4.0.1$^{2,5}$.1$^{7,10}$]dodec-3-ene,
8-pentafluoroethyltetracyclo[4.4.0.1$^{2,5}$.1$^{7,10}$]dodec-3-ene,
8,8-difluorotetracyclo[4.4.0.1$^{2,5}$.1$^{7,10}$]dodec-3-ene,
8,9-difluorotetracyclo[4.4.0.1$^{2,5}$.1$^{7,10}$]dodec-3-ene,
8,8-bis(trifluoromethyl)tetracyclo[4.4.0.1$^{2,5}$.1$^{7,10}$]dodec-3-ene,
8,9-bis(trifluoromethyl)tetracyclo[4.4.0.1$^{2,5}$.1$^{7,10}$]dodec-3-ene,
8-methyl-8-trifluoromethyltetracyclo[4.4.0.1$^{2,5}$.1$^{7,10}$]dodec-3-ene,
8,8,9-trifluorotetracyclo[4.4.0.1$^{2,5}$.1$^{7,10}$]dodec-3-ene,
8,8,9-tris(trifluoromethyl)tetracyclo[4.4.0.1$^{2,5}$.1$^{7,10}$]-dodec-3-ene,
8,8,9,9-tetrafluorotetracyclo[4.4.0.1$^{2,5}$.1$^{7,10}$]dodec-3-ene,
8,8,9,9-tetrakis(trifluoromethyl)tetracyclo-[4.4.0.1$^{2,5}$.1$^{7,10}$]dodec-3-ene,
8,8-difluoro-9,9-bis(trifluoromethyl)tetracyclo-[4.4.0.1$^{2,5}$.1$^{7,10}$]dodec-3-ene,
8,9-difluoro-8,9-bis(trifluoromethyl)tetracyclo-[4.4.0.1$^{2,5}$.1$^{7,10}$]dodec-3-ene,
8,8,9-trifluoro-9-trifluoromethyltetracyclo-[4.4.0.1$^{2,5}$.1$^{7,10}$]dodec-3-ene,
8,8,9-trifluoro-9-trifluoromethoxytetracyclo-[4.4.0.1$^{2,5}$.1$^{7,10}$]dodec-3-ene,
8,8,9-trifluoro-9-pentafluoropropoxytetracyclo-[4.4.0.1$^{2,5}$.1$^{7,10}$]dodec-3-ene,
8-fluoro-8-pentafluoroethyl-9,9-bis(trifluoromethyl)-tetracyclo[4.4.0.1$^{2,5}$.1$^{7,10}$]dodec-3-ene,
8,9-difluoro-8-heptafluoroisopropyl-9-trifluoromethyl-tetracyclo[4.4.0.1$^{2,5}$.1$^{7,10}$]dodec-3-ene,
8-chloro-8,9,9-trifluorotetracyclo[4.4.0.1$^{2,5}$.1$^{7,10}$]dodec-3-ene, 8,9-dichloro-8,9-bis(trifluoromethyl)tetracyclo-[4.4.0.1$^{2,5}$.1$^{7,10}$]dodec-3-ene,
8-(2',2',2'-trifluorocarboethoxy)tetracyclo-[4.4.0.1$^{2,5}$.1$^{7,10}$]dodec-3-ene, and
8-methyl-8-(2',2',2'-trifluorocarboethoxy)tetracyclo-[4.4.0.1$^{2,5}$.1$^{7,10}$]-dodec-3-ene, or derivatives of these norbornenes (hereinafter collectively referred to as "norbornene compounds (β-2)");
other alicyclic unsaturated compounds such as dicyclopentadiene, tricyclo[5.2.1.0$^{2,6}$]deca-8-ene, tricyclo[5.2.1.0$^{2,6}$]dec-3-ene, tricyclo[4.4.0.1$^{2,5}$]undec-3-ene, tricyclo[6.2.1.0$^{1,8}$]undec-9-ene, tricyclo[6.2.1.0$^{1,8}$]undec-4-ene, tetracyclo[4.4.0.1$^{2,5}$.1$^{7,10}$.0$^{1,6}$]dodec-3-ene, 8-methyltetracyclo[4.4.0.1$^{2,5}$.1$^{7,10}$.0$^{1,6}$]dodec-3-ene, 8-ethylidenetetracyclo[4.4.0.1$^{2,5}$.1$^{7,10}$.0$^{1,12}$]dodec-3-ene, 8-ethylidenetetracyclo[4.4.0.1$^{2,5}$.1$^{7,10}$.0$^{1,6}$]dodec-3-ene, pentacyclo[6.5.1.1$^{3,6}$.0$^{2,7}$.0$^{9,13}$]pentadec-4-ene, and pentacyclo[7.4.0.1$^{2,5}$.1$^{9,12}$.0$^{8,13}$]pentadec-3-ene; (meth)acrylatic acid esters such as methyl(meth)acrylate, ethyl (meth)acrylate, n-propyl (meth)acrylate, n-butyl (meth)acrylate, 2-methylpropyl (meth)acrylate, 2-hydroxyethyl (meth)acrylate, 2-hydroxypropyl (meth)acrylate, 3-hydroxypropyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, and 2-(4'-methoxycyclohexyl)oxycarbonylethyl (meth) acrylate, norbornyl (meth)acrylate, isobornyl (meth) acrylate, tricyclodecanyl (meth)acrylate, tetracyclododecanyl (meth)acrylate, dicyclopentenyl (meth)acrylate, adamantyl (meth)acrylate, adamantylmethyl (meth) acrylate, and 1-methyladamantyl (meth)acrylate;
α-hydroxymethylacrylic acid esters such as methyl α-hydroxymethyl acrylate, ethyl α-hydroxymethyl acrylate, n-propyl α-hydroxymethyl acrylate, and n-butyl α-hydroxymethyl acrylate;
(meth)acryloyloxylactone compound having an acid-labile group such as
α-(meth)acryloyloxy-β-methoxycarbonyl-γ-butyrolactone,
α-(meth)acryloyloxy-β-ethoxycarbonyl-γ-butyrolactone,
α-(meth)acryloyloxy-β-n-propoxycarbonyl-γ-butyrolactone,
α-(meth)acryloyloxy-β-i-propoxycarbonyl-γ-butyrolactone,
α-(meth)acryloyloxy-β-n-butoxycarbonyl-γ-butyrolactone,
α-(meth)acryloyloxy-β-(2-methylpropoxy)carbonyl-γ-butyrolactone,
α-(meth)acryloyloxy-β-(1-methylpropoxy)carbonyl-γ-butyrolactone,
α-(meth)acryloyloxy-β-t-butoxycarbonyl-γ-butyrolactone,
α-(meth)acryloyloxy-β-cyclohexyloxycarbonyl-γ-butyrolactone,
α-(meth)acryloyloxy-β-(4-t-butylcyclohexyloxy)carbonyl-γ-butyrolactone,
α-(meth)acryloyloxy-β-phenoxycarbonyl-γ-butyrolactone,
α-(meth)acryloyloxy-β-(1-ethoxyethoxy)carbonyl-γ-butyrolactone,
α-(meth)acryloyloxy-β-(1-cyclohexyloxyethoxy)carbonyl-γ-butyrolactone,
α-(meth)acryloyloxy-β-t-butoxycarbonylmethoxycarbonyl-γ-butyrolactone,
α-(meth)acryloyloxy-β-tetrahydrofuranyloxycarbonyl-γ-butyrolactone,
α-(meth)acryloyloxy-β-tetrahydropyranyloxycarbonyl-γ-butyrolactone;
α-methoxycarbonyl-β-(meth)acryloyloxy-γ-butyrolactone,
α-ethoxycarbonyl-β-(meth)acryloyloxy-γ-butyrolactone,
α-n-propoxycarbonyl-β-(meth)acryloyloxy-γ-butyrolactone,
α-i-propoxycarbonyl-β-(meth)acryloyloxy-γ-butyrolactone,
α-n-butoxycarbonyl-β-(meth)acryloyloxy-γ-butyrolactone,
α-(2-methylpropoxy)carbonyl-β-(meth)acryloyloxy-γ-butyrolactone,
α-(1-methylpropoxy)carbonyl-β-(meth)acryloyloxy-γ-butyrolactone,
α-t-butoxycarbonyl-β-(meth)acryloyloxy-γ-butyrolactone,
α-cyclohexyloxycarbonyl-β-(meth)acryloyloxy-γ-butyrolactone,
α-(4-t-butylcyclohexyloxy)carbonyl-β-(meth)acryloyloxy-γ-butyrolactone,
α-phenoxycarbonyl-β-(meth)acryloyloxy-γ-butyrolactone,
α-(1-ethoxyethoxy)carbonyl-β-(meth)acryloyloxy-γ-butyrolactone,
α-(1-cyclohexyloxyethoxy)carbonyl-β-(meth)acryloyloxy-γ-butyrolactone,
α-t-butoxycarbonylmethoxycarbonyl-β-(meth)acryloyloxy-γ-butyrolactone,
α-tetrahydrofuranyloxycarbonyl-β-(meth)acryloyloxy-γ-butyrolactone, and
α-tetrahydropyranyloxycarbonyl-β-(meth)acryloyloxy-γ-butyrolactone;
(meth)acryloyloxylactone compound having no acid-labile group such as α-(meth)acryloyloxy-γ-butyrolactone,
α-(meth)acryloyloxy-β-fluoro-γ-butyrolactone,
α-(meth)acryloyloxy-β-hydroxy-γ-butyrolactone,
α-(meth)acryloyloxy-β-methyl-γ-butyrolactone,
α-(meth)acryloyloxy-β-ethyl-γ-butyrolactone,
α-(meth)acryloyloxy-β,β-dimethyl-γ-butyrolactone,
α-(meth)acryloyloxy-β-methoxy-γ-butyrolactone,
β-(meth)acryloyloxy-γ-butyrolactone,
α-fluoro-β-(meth)acryloyloxy-γ-butyrolactone,
α-hydroxy-β-(meth)acryloyloxy-γ-butyrolactone,
α-methyl-β-(meth)acryloyloxy-γ-butyrolactone,
α-ethyl-β-(meth)acryloyloxy-γ-butyrolactone,
α,α-dimethyl-β-(meth)acryloyloxy-γ-butyrolactone,
α-methoxy-β-(meth)acryloyloxy-γ-butyrolactone, and
α-(meth)acryloyloxy-δ-mevalonolactone;
compounds shown by the following formula (9),

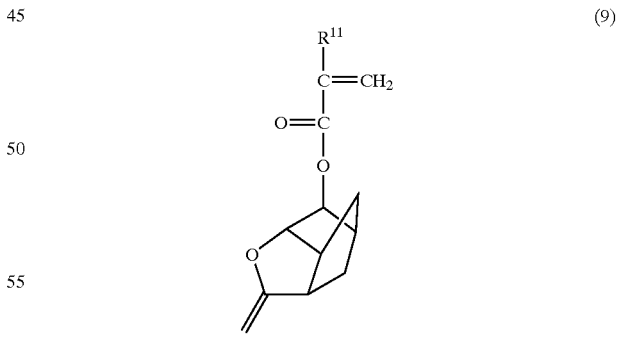

wherein R$^{11}$ represents a hydrogen atom or a methyl group;
vinyl esters such as vinyl acetate, vinyl propionate, and vinyl butyrate;
unsaturated nitrile compounds such as (meth)acrylonitrile, α-chloroacrylonitrile, crotonitrile, maleinitrile, fumaronitrile, mesaconitrile, citraconitrile, and itaconitrile;
unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-vinyl-ε-caprolactam, N-vinylpyrrolidone, vinylpyridine, and vinylimidazole;

unsaturated carboxylic acids (anhydrides) such as (meth) acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acids such as 2-carboxyethyl (meth)acrylate, 2-carboxypropyl (meth)acrylate, 3-carboxypropyl (meth)acrylate, 4-carboxybutyl (meth)acrylate, 4-carboxycyclohexyl (meth)acrylate, carboxytricyclodecanyl (meth)acrylate, and carboxytetracyclododecanyl (meth)acrylate; and compounds in which a carboxyl group in the above unsaturated carboxylic acids or carboxyl group-containing esters of unsaturated carboxylic acids is converted into the above acid-labile organic group (i); and polyfunctional monomers such as methylene glycol di(meth)acrylate, ethylene glycol di(meth)acrylate, propylene glycol di(meth)acrylate, 1,6-hexanediol di(meth) acrylate, 2,5-dimethyl-2,5-hexanediol di(meth)acrylate, 1,8-octanediol di(meth)acrylate, 1,9-nonanediol di(meth) acrylate, 1,4-bis(2-hydroxypropyl)benzene di(meth) acrylate, 1,3-bis(2-hydroxypropyl)benzene di(meth) acrylate, 1,2-adamantanediol di(meth)acrylate, 1,3-adamantanediol di(meth)acrylate, 1,4-adamantanediol di(meth)acrylate, and tricyclodecanyldimethylol di(meth) acrylate.

The amount of the recurring unit (I) in the resin (A1) is 1–100 mol %, preferably 1–90 mol %, and still more preferably 5–80 mol % of the total amount of the recurring units. If the amount of the recurring unit (I) is less than 1 mol %, developability of the resulting radiation-sensitive resin composition tends to decrease.

The amount of the recurring unit (I) in the resin (A1-1) is usually 1–50 mol %, preferably 1–40 mol %, and still more preferably 5–40 mol % of the total amount of the recurring units. If the amount of the recurring unit (I) is less than 1 mol %, developability of the resulting radiation-sensitive resin composition tends to decrease. If the amount exceeds 50 mol %, on the other hand, resolution as a resist tends to decrease.

The amount of the recurring unit (II) is usually 1–50 mol %, preferably 5–50 mol %, and still more preferably 10–50 mol % of the total amount of the recurring units. If the content of the recurring unit (II) is less than 1 mol %, the rate of copolymerization decreases and the resulting radiation-sensitive resin composition tends to exhibit decreased developability. If the content exceeds 50 mol %, on the other hand, part of maleic anhydride, which is a monomer providing the recurring unit (II), may remain un-reacted in the polymerization reaction for producing the resin (A1-1).

The amount of the other recurring units (a) is usually 40 mol % or less, and preferably 30 mol % or less.

The amount of the recurring unit (I) in the resin (A1-2) is usually 1–50 mol %, preferably 5–50 mol %, and still more preferably 5–45 mol % of the total amount of the recurring units. If the amount of the recurring unit (I) is less than 1 mol %, developability of the resulting radiation-sensitive resin composition tends to decrease. If the amount exceeds 50 mol %, on the other hand, resolution as a resist tends to decrease.

The amount of the recurring unit (II) is usually 1–50 mol %, preferably 5–50 mol %, and still more preferably 5–45 mol % of the total amount of the recurring units. If the content of the recurring unit (II) is less than 1 mol %, developability of the resulting radiation-sensitive resin composition tends to decrease. If the content exceeds 50 mol %, resolution as a resist tends to decrease.

The amount of the recurring unit (III) is usually 1–60 mol %, preferably 5–60 mol %, and still more preferably 10–60 mol % of the total amount of the recurring units. If the content of the recurring unit (II) is less than 1 mol %, resolution as a resist tends to decrease. If the content exceeds 60 mol %, undeveloped areas such as scum tends to be produced due to impaired developability of the resulting radiation-sensitive resin composition.

The amount of the other recurring units (a) is usually 40 mol % or less, and preferably 30 mol % or less.

The resin (A1) can be prepared by polymerization of the norbornene derivatives (α1), preferably together with maleic acid anhydride or maleic acid anhydride and a monomer which provides the recurring unit (III), and optionally with monomers which provide the other recurring units (a) in an appropriate solvent using a radical polymerization initiator such as hydroperoxides, dialkyl peroxides, diacyl peroxides, or azo compounds and, as required, in the presence of a chain-transfer agent.

As examples of the solvent used for polymerization of the components, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, and diethoxyethanes; and the like can be given.

These solvents may be used either individually or in combination of two or more.

The polymerization is carried out at a temperature of usually 40–120° C., and preferably 50–90° C. for usually 1–48 hours, and preferably 1–24 hours.

It is preferable that the resin (A1) of the present invention contains almost no impurities such as halogens or metals. The smaller the amount of such impurities, the better are the sensitivity, resolution, process stability, pattern shape, or the like as a resist. The resin (A1) can be purified using, for example, a chemical purification method such as washing with water or liquid-liquid extraction or a combination of the chemical purification method and a physical purification method such as ultra-filtration or centrifugation.

Next, the resin (A2) will be explained.

As examples of the linear or branched alkyl group having 1–4 carbon atoms represented by $R^8$, $R^9$, or $R^{10}$ in the formula (5), a methyl group, ethyl group, n-propyl group, isopropyl group, n-butyl group, 2-methylpropyl group, 1-methylpropyl group, t-butyl group, and the like can be given.

As examples of the monovalent oxygen-containing polar group represented by $R^8$, $R^9$, or $R^{10}$, a hydroxyl group; carboxyl group; linear or branched hydroxyalkyl groups having 1–4 carbon atoms such as a hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, and 4-hydroxy-n-butyl group.

Of these oxygen-containing polar groups, a hydroxyl group, carboxyl group, hydroxymethyl group, methoxy group, ethoxy group, and the like are preferable.

As examples of the monovalent nitrogen-containing polar group represented by $R^8$, $R^9$, or $R^{10}$, a cyano group; linear or branched cyanoalkyl groups having 2–5 carbon atoms such as a cyanomethyl group, 1-cyanoethyl group, 2-cyanoethyl group, 1-cyano-n-propyl group, 2-cyano-n-propyl group, 3-cyano-n-propyl group, 1-cyano-n-butyl group, 2-cyano-n-butyl group, 3-cyano-n-butyl group, and 4-cyano-n-butyl group.

Of these nitrogen-containing polar groups, a cyano group, cyanomethyl group, 1-cyanoethyl group, and the like are preferable.

Particularly preferable groups represented by $R^8$, $R^9$, or $R^{10}$ in the formula (5) are a hydrogen atom, methyl group, ethyl group, hydroxyl group, carboxyl group, hydroxymethyl group, methoxy group, ethoxy group, cyano group, cyanomethyl group, 1-cyanoethyl group, and the like.

m and n in the formula (5) are preferably either 0 or 1.

The structural unit (IV) may be used in the resin (A2) either individually or in combination of two or more.

The structural unit (IV) can be formed in the resin (A2) by the ring-opening polymerization of a compound similar to the norbornene derivative (α1) of the formula (6), but replacing $R^3$, $R^4$, and $R^5$ respectively with $R^8$, $R^9$, and $R^{10}$ (such a compound is hereinafter referred to as "norbornene derivative (α2)"), for example, in the presence of a metathesis catalyst described later.

The resin (A2) may further comprise one or more other structural units obtained by a ring opening polymerization using a metathesis catalyst (hereinafter referred to as "other structural unit (b)").

As examples of monomers which provide the other structural unit (b), the same norbornene derivatives (β-1), norbornene compounds (β-2), and other alicyclic unsaturated compounds given in connection with the resin (A1) can be given.

The amount of the structural unit (IV) in the resin (A2) is 1–100 mol %, preferably 5–90 mol %, and still more preferably 10–80 mol % of the total amount of the structural units. If the amount of the structural unit (IV) is less than 1 mol %, developability of the resulting radiation-sensitive resin composition tends to decrease.

The resin (A2) is prepared by the ring-opening (co) polymerization of a norbornene derivative (α2), optionally together with a norbornene derivative (β-1), norbornene derivative (β-2), and other monomers such as an alicyclic unsaturated compound which is copolymerizable by the ring-opening (co)polymerization in an appropriate solvent using a metathesis catalyst.

The metathesis catalyst is usually a combination of at least one compound of an element selected from the group consisting of W, Mo, and Re (hereinafter referred to as "specific transition metal compound") and a compound of a metal belonging to the group IA, IIA, IIIA, IVA, or IVB of Deming's Periodic Table and having a metal-carbon bond or metal-hydrogen bond (hereinafter referred to as "specific organometallic compound").

As examples of the specific transition metal compound, a halide, oxyhalide, alkoxyhalide, alkoxide, carbonate, (oxy) acetylacetonate, carbonyl complex, acetonitrile complex, and hydride complex of W, Mo, or Re, and derivatives of these compounds can be given. Of these compounds, a compound of W or Mo, more particularly a halide, oxyhalide, or alkoxyhalide of W or Mo are preferable in view of polymerization activity and practicability.

The specific transition metal compound can be a compound conjugated by a suitable agent such as triphenylphosphine ($P(C_6H_5)_3$), pyridine ($NC_5H_5$), or the like.

The following compounds can be given as specific examples of the specific transition metal compound: $WCl_6$, $WCl_5$, $WCl_4$, $WBr_6$, $WF_6$, $WI_6$, $MoCl_5$, $MoCl_4$, $MoCl_3$, $ReCl_3$, $WOCl_4$, $WOCl_3$, $WOBr_3$, $MoOCl_3$, $MoOBr_3$, $ReOCl_3$, $ReOBr_3$, $WCl_2(OC_2H_5)_4$, $W(OC_2H_5)_6$, $MoCl_3(OC_2H_5)_2$, $Mo(OC_2H_5)_5$, $WO_2(acac)_2$ (wherein "acac" indicates an acetylacetonate residue), $MoO_2(acac)_2$, $W(OCOR)_5$ (wherein "OCOR" indicates a carboxylic acid residue), $Mo(OCOR)_5$, $W(CO)_6$, $Mo(CO)_6$, $Re_2(CO)_{10}$, $WCl_5 \cdot P(C_6H_5)_3$, $MoCl_5 \cdot P(C_6H_5)_3$, $ReOBr_3 \cdot P(C_6H_5)_3$, $WCl_6 \cdot NC_5H_5$, $W(CO)_5 \cdot P(C_6H_5)_3$, and $W(CO)_3 \cdot (CH_3CN)_3$.

Of these, $WCl_6$, $MoCl_5$, $WCl_2(OC_2H_5)_4$, $MoCl_3(OC_2H_5)_2$, and the like are preferable.

These specific transition metal compounds may be used either individually or in combinations of two or more.

The specific transition metal compound component which constitutes a metathesis catalyst may be a mixture of two or more compounds forming specific transition metal compound by reacting in the polymerization reaction system.

The following compounds can be given as specific examples of the specific organometallic compounds: n-$C_4H_9Li$, n-$C_5H_{11}Na$, $C_6H_5Na$, $CH_3MgI$, $C_2H_5MgBr$, $CH_3MgBr$, n-$C_3H_7MgCl$, t-$C_4H_9MgCl$, $CH_2=CHCH_2MgCl$, $(C_2H_5)_2Zn$, $(C_2H_5)_2Cd$, $CaZn(C_2H_5)_4$, $(CH_3)_3B$, $(C_2H_5)_3B$, (n-$C_4H_9)_3B$, $(CH_3)_3Al$, $(CH_3)_2AlCl$, $CH_3AlCl_2$, $(CH_3)_3Al_2Cl_3$, $(C_2H_5)_3Al$, $(C_2H_5)_3Al_2Cl_3$, $(C_2H_5)_2Al \cdot O(C_2H_5)_2$, $(C_2H_5)_2AlCl$, $C_2H_5AlCl_2$, $(C_2H_5)_2AlH$, $(C_2H_5)_2AlOC_2H_5$, $(C_2H_5)_2AlCN$, $LiAl(C_2H_5)_2$, (n-$C_3H_7)_3Al$, (i-$C_4H_9)_3Al$, (i-$C_4H_9)_2AlH$, (n-$C_6H_{13})_3Al$, (n-$C_8H_{17})_3Al$, $(C_6H_5)_3Al$, $(CH_3)_4Ga$, $(CH_3)_4Sn$, (n-$C_4H_9)_4$ Sn, $(C_2H_5)_3SnH$, LiH, NaH, $B_2H_6$, $NaBH_4$, $AlH_3$, $LiAlH_4$, and $TiH_4$.

Of these, $(CH_3)_3Al$, $(CH_3)_2AlCl$, $CH_3AlCl_2$, $(CH_3)_3Al_2Cl_3$, $(C_2H_5)_3Al$, $(C_2H_5)_2AlCl$, $C_2H_5AlCl_2$, $(C_2H_5)_3Al_2Cl_3$, $(C_2H_5)_2AlH$, $(C_2H_5)_2AlOC_2H_5$, $(C_2H_5)_2AlCN$, (n-$C_3H_7)_3Al$, (i-$C_4H_9)_3Al$, (i-$C_4H_9)_2AlH$, (n-$C_6H_{13})_3Al$, (n-$C_8H_{17})_3Al$, $(C_6H_5)_3Al$, and the like are preferable.

These specific organometallic compounds may be used either individually or in combinations of two or more.

The ratio of the specific transition metal compound and specific organometallic compound is from 1:1 to 1:100, preferably from 1:2 to 1:50.

One or more activation agents (a) to (i) may be added to the catalyst consisting of a combination of the specific transition metal compound and specific organometallic compound to promote the catalyst activity.

Activation Agent (a): Boron compounds such as B, $BF_3$, $BCl_3$, B(O-n-$C_4H_9)_3$, $BF_3 \cdot O(CH_3)_2$, $BF_3 \cdot O(C_2H_5)_2$, $BF_3 \cdot O$(n-$C_4H_9)_2$, $BF_3 \cdot 2C_6H_5OH$, $BF_3 \cdot 2CH_3COOH$, $BF_3 \cdot CO(NH_2)_2$, $BF_3 \cdot N(C_2H_4OH)_3$, $BF_3 \cdot$ piperidine, $BF_3 \cdot NH_2C_2H_5$, $B_2O_3$, and $H_3BO_3$; silicon compounds such as $Si(OC_2H_5)_4$ and $Si(Cl)_4$.

Activation Agent (b): Alcohols, hydroperoxides, dialkylperoxides, and diacylperoxides.

Activation Agent (c): Water

Activation Agent (d): Oxygen

Activation Agent (e): Aldehydes, carbonyl compounds such as ketones, and oligomers or polymers of these compounds Activation Agent (f): Cyclic ethers such as ethylene oxide, epichlorohydrin, and oxetane Activation Agent (g): amides such as N,N-dimethylformamide and N,N-dimethylacetamide; amines such as aniline, morpholine, and piperidine; and azo compounds such as azobenzene Activation Agent (h): N-nitroso compounds such as N-nitrosodimethylamine, N-nitrosodiphenylamine Activation Agent (i): Compounds having a nitrogen-chlorine bond or a sulfur-chlorine bond such as trichloromelamine, N-chlorosuccinimide, and phenylsulphenyl chloride The ratio of these activation agents and specific transition metal compound cannot be generically specified because the ratio may considerably vary according to the type of the activation agent used. In many cases, the ratio is in the range from 0.005:1 to 10:1, and preferably from 0.05:1 to 3.0:0.1.

Although the molecular weight of the resin (A2) obtained by the ring-opening (co)polymerization can be controlled by changing the reaction conditions such as the type and concentration of the metathesis catalyst, polymerization temperature, the type and amount of the solvent, the monomer concentration, and the like, the molecular weight control by adding a suitable molecular weight modifier to the reaction system is preferable.

As examples of the molecular weight modifier, α-olefins such as ethylene, propylene, 1-butene, 1-pentene, 1-hexene, 1-heptene, 1-octene, 1-nonene, and 1-decene; α,ω-diolefins such as 1,3-butadiene and 1,4-pentadiene; vinyl aromatic compounds such as styrene and α-methylstyrene; acetylenes; and polar allyl compounds such as allyl chloride, allyl acetate, and trimethylallyoxysilane can be given.

These molecular weight modifiers may be used either individually or in combinations of two or more.

The amount of the molecular weight modifiers is usually 0.005–2 mol %, preferably 0.02–1.0 mol %, and still more preferably 0.03–0.7 mol % of the total amount of monomers.

As examples of the solvent used for the ring-opening polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutane, bromohexane, dichloroethane, hexamethylene dibromide, and chlorobenzene; saturated carboxylic acid esters such as ethyl acetate, n-butyl acetate, i-butyl acetate, and methyl propionate; and the like can be given.

These solvents may be used either individually or in combination of two or more.

From the viewpoint of transmittance of radioactive rays, the resin (A2) of the present invention preferably contains as small an amount of carbon-carbon unsaturated bonds as possible. Such a resin (A2) can be prepared by effecting an addition reaction such as a hydrogenation reaction, hydration reaction, halogenation reaction, and halogenation-hydrogenation reaction at an appropriate time during the course of the ring-opening (co)polymerization or after the ring-opening (co)polymerization. A particularly preferable resin (A2) is that obtained by the hydrogenation reaction.

The degree of hydrogenation of the hydrogenated resin (A2) is preferably 70% or more, more preferably 90% or more, and still more preferably 100%.

A catalyst commonly used in the hydrogenation reaction of olefin compounds can be used in the above hydrogenation reaction.

As examples of a heterogeneous system catalyst among such hydrogenation catalysts, a solid catalyst with a noble metal, such as Pd, Pt, Ni, Rh, or Ru, carried on a carrier such as carbon, silica, almina, or titanium dioxide can be given. These heterogeneous system catalysts may be used either individually or in combinations of two or more.

As examples of a homogeneous system catalyst, a nickel naphthenate/triethylaluminum catalyst, nickel acetylacetonate/triethylaluminum catalyst, cobalt octenate/n-butyl lithium catalyst, titanocene dichloride/diethylaluminum monochloride catalyst, and a rhodium catalyst such as rhodium acetate, chlorotris(triphenylphosphine) rhodium, and the like can be given.

These homogeneous system catalysts may be used either individually or in combinations of two or more.

Of these hydrogenation catalysts, the heterogeneous system catalysts are preferable due to the high reaction activity, ease of catalyst removal after the reaction, and excellent color tone of the resulting resin (A2).

The hydrogenation reaction is carried out under a hydrogen gas pressure from atmospheric pressure to 300 atm, and preferably from 3 to 200 atm, at a temperature of usually 0–200° C., and preferably 20–180° C.

Furthermore, the resin (A2) of the present invention should contain as small an amount of impurities as possible. The impurities mainly originate from the catalyst used in the ring-opening (co)polymerization reaction. Impurities to which particular attention should be paid when the resin composition is used as a resist are halogens such as fluorine, chlorine, and bromine, and metals belonging to the group IV, V, VI, VII, or VIII of the Deming's Periodic Table. A preferable resin (A2) should contain halogen impurities of no more than 3 ppm, particularly no more than 2 ppm, and metal impurities no more than 300 ppb, and particularly no more than 100 ppb. The impurity content less than the above-described limit ensures sensitivity, resolution, and process stability as a resist and increases the yield of semiconductors produced using the radiation-sensitive resin composition of the present invention. As the method for reducing impurities in the resin (A2) when the impurities are remaining halogens, (1) a method of washing or extracting (liquid-liquid extraction) the resin solution with purified water, (2) a combination of washing or liquid-liquid extraction with purified water and a physical purification method such as ultra-filtration, centrifugation, and the like, (3) a method of using an alkaline aqueous solution or an acid aqueous solution instead of purified water in the methods (1) or (2), and the like can be given. When the impurities are residual metals, in addition to the methods (1)–(3), (4) a method of treating the resin by oxidation, reduction, ligand exchange, counter-ion exchange, etc. to increase the solubility of the residual metals in solvents or water, then applying the method (1), (2), or (3) can be given.

These treatments for reducing the amount of impurities can be carried out at an appropriate time after the ring-opening (co)polymerization for manufacturing the resin (A2).

The resin (A) of the present invention has an acid-labile group. Therefore, when the group $R^1$ in the structure (1) of the resin (A) is a group other than the acid-labile group (i), a monomer having an acid-labile group must be copolymerized with the norbornene derivatives (α1) or norbornene derivatives (α2), for example. Such a monomer having an acid-labile group may also be used when the group $R^1$ is an acid-labile group (i).

The polystyrene-standard weight average molecular weight (hereinafter referred to as "Mw") of the resin (A) determined by gel permeation chromatography (GPC) is usually 3,000–300,000, preferably 4,000–200,000, and still more preferably 5,000–100,000. If Mw of the resin (A) is less than 3,000, heat resistance as a resist tends to decrease. If Mw exceeds 300,000, developability as a resist tends to decrease.

The ratio of Mw to the polystyrene-standard number average molecular weight (hereinafter referred to as "Mn") determined by gel permeation chromatography (GPC) (Mw/Mn) of the resin (A) is usually 1–5, and preferably 1–3.

In the present invention, the resin (A) may be used either individually or in combination of two or more.

Component (B)

The component (B) of the present invention is a photoacid generator which generates an acid upon exposure (hereinafter referred to as "acid generator (B)").

The acid generator (B) causes an acid-labile group in the resin (A) to dissociate by the action of an acid generated upon exposure. As a result, an exposed part of the resist film becomes readily soluble in an alkaline developer, thereby forming a positive-tone resist pattern.

As examples of the acid generator (B), onium salts, halogen-containing compounds, diazoketone compounds, sulfone compounds, sulfonate compounds, and the like can be given.

Examples of the acid generator (B) are given below.

Onium Salt Compounds:

As examples of onium salt compounds, iodonium salts, sulfonium salts (including tetrahydrothiophenium salts), phosphonium salts, diazonium salts, and pyridinium salts can be given.

The following compounds can be given as specific preferable examples of onium salt compounds:
diphenyliodoniumtrifluoromethanesulfonate,
diphenyliodoniumnonafluoro-n-butanesulfonate,
diphenyliodoniumperfluoro-n-octanesulfonate,
bis(4-t-butylphenyl)iodoniumtrifluoromethanesulfonate,
bis(4-t-butylphenyl)iodoniumnonafluoro-n-butanesulfonate,
bis(4-t-butylphenyl)iodoniumperfluoro-n-octanesulfonate,
triphenylsulfoniumtrifluoromethanesulfonate,
triphenylsulfoniumnonafluoro-n-butanesulfonate,
triphenylsulfoniumperfluoro-n-octanesulfonate,
triphenylsulfonium 10-camphorsulfonate,
cyclohexyl.2-oxocyclohexylmethylsulfoniumtrifluoromethanesulfonate,
dicyclohexyl.2-oxocyclohexylsulfoniumtrifluoromethanesulfonate,
2-oxocyclohexyldimethylsulfoniumtrifluoromethanesulfonate,
1-naphthyldimethylsulfoniumtrifluoromethanesulfonate,
1-naphthyldiethylsulfoniumtrifluoromethanesulfonate,
4-cyano-1-naphthyldimethylsulfoniumtrifluoromethanesulfonate,
4-nitro-1-naphthyldimethylsulfoniumtrifluoromethanesulfonate,
4-methyl-1-naphthyldimethylsulfoniumtrifluoromethanesulfonate,
4-cyano-1-naphthyldiethylsulfoniumtrifluoromethanesulfonate,
4-nitro-1-naphthyldiethylsulfoniumtrifluoromethanesulfonate,
4-methyl-1-naphthyldiethylsulfoniumtrifluoromethanesulfonate,
4-hydroxy-1-naphthyldimethylsulfoniumtrifluoromethanesulfonate,
4-hydroxy-1-naphthyltetrahydrothiopheniumtrifluoromethanesulfonate,
4-hydroxy-1-naphthyltetrahydrothiopheniumnonafluoro-n-butanesulfonate,
4-hydroxy-1-naphthyltetrahydrothiopheniumperfluoro-n-octanesulfonate,
4-methoxy-1-naphthyltetrahydrothiopheniumtrifluoromethanesulfonate,
4-methoxy-1-naphthyltetrahydrothiopheniumnonafluoro-n-butanesulfonate,
4-methoxy-1-naphthyltetrahydrothiopheniumperfluoro-n-octanesulfonate,
4-ethoxy-1-naphthyltetrahydrothiopheniumtrifluoromethanesulfonate,
4-ethoxy-1-naphthyltetrahydrothiopheniumnonafluoro-n-butanesulfonate,
4-ethoxy-1-naphthyltetrahydrothiopheniumperfluoro-n-octanesulfonate,
4-n-butoxy-1-naphthyltetrahydrothiopheniumtrifluoromethanesulfonate,
4-n-butoxy-1-naphthyltetrahydrothiopheniumnonafluoro-n-butanesulfonate,
4-n-butoxy-1-naphthyltetrahydrothiopheniumperfluoro-n-octanesulfonate,
4-methoxymethoxy-1-naphthyltetrahydrothiopheniumtrifluoromethanesulfonate,
4-methoxymethoxy-1-naphthyltetrahydrothiopheniumnonafluoro-n-butanesulfonate,
4-methoxymethoxy-1-naphthyltetrahydrothiopheniumperfluoro-n-octanesulfonate,
4-ethoxymethoxy-1-naphthyltetrahydrothiopheniumtrifluoromethanesulfonate,
4-ethoxymethoxy-1-naphthyltetrahydrothiopheniumnonafluoro-n-butanesulfonate,
4-ethoxymethoxy-1-naphthyltetrahydrothiopheniumperfluoro-n-octanesulfonate,
4-(1'-methoxyethoxy)-1-naphthyltetrahydrothiopheniumtrifluoromethanesulfonate,
4-(1'-methoxyethoxy)-1-naphthyltetrahydrothiopheniumnonafluoro-n-butanesulfonate,
4-(1'-methoxyethoxy)-1-naphthyltetrahydrothiopheniumperfluoro-n-octanesulfonate,
4-(2'-methoxyethoxy)-1-naphthyltetrahydrothiopheniumtrifluoromethanesulfonate,
4-(2'-methoxyethoxy)-1-naphthyltetrahydrothiopheniumnonafluoro-n-butanesulfonate,
4-(2'-methoxyethoxy)-1-naphthyltetrahydrothiopheniumperfluoro-n-octanesulfonate,
4-methoxycarbonyloxy-1-naphthyltetrahydrothiopheniumtrifluoromethanesulfonate,
4-methoxycarbonyloxy-1-naphthyltetrahydrothiopheniumnonafluoro-n-butanesulfonate,
4-methoxycarbonyloxy-1-naphthyltetrahydrothiopheniumperfluoro-n-octanesulfonate,
4-ethoxycarbonyloxy-1-naphthyltetrahydrothiopheniumtrifluoromethanesulfonate,
4-ethoxycarbonyloxy-1-naphthyltetrahydrothiopheniumnonafluoro-n-butanesulfonate,
4-ethoxycarbonyloxy-1-naphthyltetrahydrothiopheniumperfluoro-n-octanesulfonate,
4-n-propoxycarbonyloxy-1-naphthyltetrahydrothiopheniumtrifluoromethanesulfonate,
4-n-propoxycarbonyloxy-1-naphthyltetrahydrothiopheniumnonafluoro-n-butanesulfonate,
4-n-propoxycarbonyloxy-1-naphthyltetrahydrothiopheniumperfluoro-n-octanesulfonate,
4-i-propoxycarbonyloxy-1-naphthyltetrahydrothiopheniumtrifluoromethanesulfonate,
4-i-propoxycarbonyloxy-1-naphthyltetrahydrothiopheniumnonafluoro-n-butanesulfonate, 4-i-propoxycarbonyloxy-1-naphthyltetrahydrothiopheniumperfluoro-n-octanesulfonate,
4-n-butoxycarbonyloxy-1-naphthyltetrahydrothiopheniumtrifluoromethanesulfonate,
4-n-butoxycarbonyloxy-1-naphthyltetrahydrothiopheniumnonafluoro-n-butanesulfonate,
4-n-butoxycarbonyloxy-1-naphthyltetrahydrothiopheniumperfluoro-n-octanesulfonate,
4-t-butoxycarbonyloxy-1-naphthyltetrahydrothiopheniumtrifluoromethanesulfonate,
4-t-butoxycarbonyloxy-1-naphthyltetrahydrothiopheniumnonafluoro-n-butanesulfonate,
4-t-butoxycarbonyloxy-1-naphthyltetrahydrothiopheniumperfluoro-n-octanesulfonate,
4-(2'-tetrahydrofuranyloxy)-1-naphthyltetrahydrothiopheniumtrifluoromethanesulfonate,
4-(2'-tetrahydrofuranyloxy)-1-naphthyltetrahydrothiopheniumnonafluoro-n-butanesulfonate,
4-(2'-tetrahydrofuranyloxy)-1-naphthyltetrahydrothiopheniumperfluoro-n-octanesulfonate,
4-(2'-tetrahydropyranyloxy 1-naphthyltetrahydrothiopheniumtrifluoromethanesulfonate,
4-(2'-tetrahydropyranyloxy)-1-naphthyltetrahydrothiopheniumnonafluoro-n-butanesulfonate,
4-(2'-tetrahydropyranyloxy)-1-naphthyltetrahydrothiophenium perfluoro-n-octanesulfonate,
4-benzyloxy-1-naphthyltetrahydrothiopheniumtrifluoromethane sulfonate,
4-benzyloxy-1-naphthyltetrahydrothiopheniumnonafluoro-n-butanesulfonate,
4-benzyloxy-1-naphthyltetrahydrothiopheniumperfluoro-n-octanesulfonate,
1-(1'-naphthylacetomethyl)tetrahydrothiopheniumtrifluoromethanesulfonate,
1-(1'-naphthylacetomethyl) tetrahydrothiopheniumnonafluoro-n-butanesulfonate,
1-(1'-naphthylacetomethyl) tetrahydrothiopheniumperfluoro-n-octanesulfonate,
1-(3,5-dimethyl-4-hydroxyphenyl)tetrahydrothiophenium-trifluoromethanesulfonate,
1-(3,5-dimethyl-4-hydroxyphenyl)tetrahydrothiophenium-nonafluoro-n-butanesulfonate, and
1-(3,5-dimethyl-4-hydroxyphenyl)tetrahydrothiophenium-perfluoro-n-octanesulfonate, Halogen-containing Compounds:

As examples of halogen-containing compounds, haloalkyl group-containing hydrocarbon compounds, haloalkyl group-containing heterocyclic compounds, and the like can be given.

As specific examples of preferable halogen-containing compounds, (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, 1,1-bis(4'-chlorophenyl)-2,2,2-trichloroethane, and the like can be given.

Diazoketone Compounds:

As examples of diazoketone compounds, 1,3-diketo-2-diazo compounds, diazobenzoquinone compounds, diazonaphthoquinone compounds, and the like can be given.

As specific examples of preferable diazoketone compounds, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris(4'-hydroxyphenyl)ethane, and the like can be given.

Sulfone Compounds:

As examples of sulfone compounds, β-ketosulfone, β-sulfonylsulfone, α-diazo compounds of these compounds, and the like can be given.

As specific examples of preferable sulfone compounds, 4-trisphenacylsulfone, mesitylphenacylsulfone, bis(phenylsulfonyl)methane, and the like can be given.

Sulfonate Compounds:

As examples of sulfonate compounds, alkyl sulfonate, alkylimide sulfonate, haloalkyl sulfonate, aryl sulfonate, imino sulfonate, and the like can be given.

As specific examples of preferable sulfone compounds, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, and the like can be given.

Of these acid generators (B), the following compounds are particularly preferable:
diphenyliodoniumtrifluoromethanesulfonate,
diphenyliodoniumnonafluoro-n-butanesulfonate,
diphenyliodoniumperfluoro-n-octanesulfonate,
bis(4-t-butylphenyl)iodoniumtrifluoromethanesulfonate,
bis(4-t-butylphenyl)iodoniumnonafluoro-n-butanesulfonate,
bis(4-t-butylphenyl)iodoniumperfluoro-n-octanesulfonate,
triphenylsulfoniumtrifluoromethanesulfonate,
triphenylsulfoniumnonafluoro-n-butanesulfonate,
triphenylsulfoniumperfluoro-n-octanesulfonate,
cyclohexyl.2-oxocyclohexyl-methylsulfoniumtrifluoromethanesulfonate,
dicyclohexyl.2-oxocyclohexylsulfoniumtrifluoromethanesulfonate,
2-oxocyclohexyldimethylsulfoniumtrifluoromethanesulfonate,
4-hydroxy-1-naphthyldimethylsulfoniumtrifluoromethanesulfonate,
4-hydroxy-1-naphthyltetrahydrothiopheniumtrifluoromethanesulfonate,
4-hydroxy-1-naphthyltetrahydrothiopheniumnonafluoro-n-butanesulfonate,
4-hydroxy-1-naphthyltetrahydrothiopheniumperfluoro-n-octanesulfonate,
1-(1'-naphthylacetomethyl) tetrahydrothiopheniumtrifluoromethanesulfonate,
1-(1'-naphthylacetomethyl) tetrahydrothiopheniumnonafluoro-n-butanesulfonate,
1-(1'-naphthylacetomethyl) tetrahydrothiopheniumperfluoro-n-octanesulfonate,
1-(3,5-dimethyl-4-hydroxyphenyl) tetrahydrothiopheniumtrifluoromethanesulfonate,
1-(3,5-dimethyl-4-hydroxyphenyl) tetrahydrothiopheniumnonafluoro-n-butanesulfonate,
1-(3,5-dimethyl-4-hydroxyphenyl) tetrahydrothiopheniumperfluoro-n-octanesulfonate, trifluoromethanesulfonylbicyclo[2.2.1]hept-5-ene-2,3-dicarbodiimide,
nonafluoro-n-butanesulfonylbicyclo[2.2.1]hept-5-ene-2,3-dicarbodiimide,
perfluoro-n-octanesulfonylbicyclo[2.2.1]hept-5-ene-2,3-dicarbodiimide,
n-hydroxysuccimidetrifluoromethanesulfonate,
n-hydroxysuccimidenonafluoro-n-butanesulfonate,
n-hydroxysuccimideperfluoro-n-octanesulfonate, and
1,8-naphthalene dicarboxylic acid imidetrifluoromethanesulfonate, In the present invention, the acid generator (B) may be used either individually or in combination of two or more.

The amount of the acid generator (B) to be used in the present invention is usually 0.1–10 parts by weight, and preferably 0.5–7 parts by weight for 100 parts by weight of the resin (A) from the viewpoint of ensuring sensitivity and developability as a resist. If the amount of the acid generator (B) is less than 0.1 part by weight, sensitivity and developability tend to decrease. If the amount exceeds 10 parts by weight, a rectangular resist pattern may not be obtained due to decreased radiation transmittance.

Additives

It is preferable to add an acid diffusion controller to the radiation-sensitive resin composition of the present invention. The acid diffusion controller controls diffusion of an acid generated from the acid generator (B) upon exposure in the resist film to hinder unfavorable chemical reactions in the unexposed area.

The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) between exposure and development, whereby a composition with remarkably superior process stability can be obtained.

As the acid diffusion controller, organic compounds containing nitrogen of which the basicity does not change during exposure or heating for forming a resist pattern are preferable.

As examples of such nitrogen-containing organic compounds, compounds shown by the following formula (10) (hereinafter called "nitrogen-containing compounds (a)"), compounds having two nitrogen atoms in the molecule (hereinafter called "nitrogen-containing compounds (b)"), polyamino compounds or polymers having three or more nitrogen atoms (hereinafter collectively called "nitrogen-containing compounds (c)"), quaternary ammonium hydroxide compounds, amide group-containing compounds, urea compounds, nitrogen-containing heterocyclic compounds, and the like can be given.

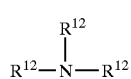
(10)

wherein $R^{12}$ individually represents a hydrogen atom, a substituted or unsubstituted, linear, branched, or cyclic alkyl group, substituted or unsubstituted aryl group, or substituted or unsubstituted aralkyl group.

Examples of the nitrogen-containing compounds (a) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine; and the like.

Examples of the nitrogen-containing compound (II) include ethylenediamine,
N,N,N',N'-tetramethylethylenediamine,
tetramethylenediamine, hexamethylenediamine, 4,4'-diaminodiphenylmethane,
4,4'-diaminodiphenyl ether, 4,4'-diaminobenzophenone,
4,4'-diaminodiphenylamine, 2,2-bis(4'-aminophenyl)propane,
2-(3'-aminophenyl)-2-(4'-aminophenyl)propane,
2-(4'-aminophenyl)-2-(3'-hydroxyphenyl)propane,
2-(4'-aminophenyl)-2-(4'-hydroxyphenyl)propane,
1,4-bis[1'-(4"-aminophenyl)-1'-methylethyl]benzene,
1,3-bis[1'-(4"-aminophenyl)-1'-methylethyl]benzene, bis(2-diethylaminoethyl)ether, and the like.

Examples of the nitrogen-containing compounds (c) include polyethyleneimine, polyallylamine, a polymer of 2-dimethylaminoethylacrylamide, and the like.

As examples of the quaternary ammonium hydroxide compound, tetramethylammonium hydroxide, tetraethylammonium hydroxide, tetra-n-propylammonium hydroxide, tetra-n-butylammonium hydroxide, and the like can be given.

Examples of the amide group-containing compound include, in addition to N-t-butoxycarbonyl group-containing amino compounds, such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole, formamide, N-methylformamide, N,N-dimethylformamide, acetamide, N-methylacetamide, N,N-dimethylacetatnide, propionamide, benzamide, pyrrolidone, N-methylpyrrolidone; and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like. Examples of the nitrogen-containing heterocyclic compounds include: imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2'-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane; and the like.

Of these nitrogen-containing organic compounds, the nitrogen-containing compounds (a), nitrogen-containing compounds (b), quaternary ammonium hydroxide compounds, and nitrogen-containing heterocyclic compounds are preferable.

The acid diffusion controller may be used either individually or in combination of two or more.

The amount of the acid diffusion controller to be added is usually 15 parts by weight or less, preferably 10 parts by weight or less, and still more preferably 5 parts by weight or less for 100 parts by weight of the resin (A). If the proportion of the acid diffusion controller exceeds 15 parts by weight, sensitivity as a resist and developability of the exposed area tend to decrease. If the amount is less than 0.001 part byweight, the pattern shape or dimensional accuracy as a resist may decrease depending on the processing conditions.

Alicyclic additives which further improve dry etching resistance, pattern shape, adhesion to substrate, or the like may be added to the radiation-sensitive resin composition of the present invention.

Examples of such alicyclic additives include:
adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate;
deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate;
lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate;
2,5-dimethyl-2,5-di(adamantylcarbonyloxy)hexane; and the like.

These alicyclic additives may be used either individually or in combination of two or more.

The amount of the alicyclic additives to be added is usually 50 parts by weight or less, and preferably 30 parts by weight or less for 100 parts by weight of the resin (A). If the amount of alicyclic additives exceeds 50 parts by weight, heat resistance as a resist tends to decrease.

Surfactants which improve applicability, developability, or the like may be added to the radiation-sensitive resin composition of the present invention.

As examples of surfactants, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate; commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by TOHKEM PRODUCTS CORPORATION), MEGAFAC F171, F173 (manufactured by Dainippon Ink and Chemicals, Inc.), Fluorard FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.); and the like can be given.

These surfactants may be used either individually or in combination of two or more.

The amount of surfactants to be added is usually 2 parts by weight or less for 100 parts by weight of the total of the resin (A) and the acid generator (B).

As other additives, halation inhibitors, adhesion promoters, storage stabilizers, anti-foaming agents, and the like can be given.

Preparation of Composition Solution

The radiation-sensitive resin composition of the present invention is prepared as a composition solution by dissolving the composition in a solvent so that the total solid content is 5–50 wt %, and preferably 10–25 wt %, and filtering the composition using a filter with a pore diameter of about 0.2 μm, for example.

Examples of solvents used for the preparation of the composition solution include: linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl-ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butylacetate, methyl acetoacetoate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate.

These solvents may be used either individually or in combination of two or more. Among these solvents, linear or branched ketones, cyclic ketones, propylene glycol monoalkyl ether acetates, alkyl 2-hydroxypropionates, and alkyl 3-alkoxypropionates are preferable.

Formation of Resist Pattern

The radiation-sensitive resin composition of the present invention is particularly useful as a chemically-amplified resist.

In the chemically-amplified resist, an acid-labile group in the resin (A) dissociates by the action of an acid generated from the acid generator (B) upon exposure, thereby producing an acidic functional group, preferably a carboxyl group. As a result, solubility of the exposed part of the resist in an alkaline developer increases, whereby the exposed part is dissolved in an alkaline developer and removed to obtain a positive-tone resist pattern.

A resist pattern is formed from the radiation-sensitive resin composition of the present invention by applying the composition solution to, for example, substrates such as a silicon wafer or a wafer coated with aluminum using an appropriate application method such as spin coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, electron beams, or the like is appropriately selected depending on types of the acid generator. It is particularly preferable to use an ArF excimer laser (wavelength: 193 nm) or KrF excimer laser (wavelength: 248 nm)

In the present invention, it is preferable to perform post-exposure bake (hereinafter called "PEB") after exposure. PEB ensures smooth dissociation of the acid-labile organic group in the resin (A). The heating temperature for PEB is usually 30–200° C., and preferably 50–170° C., although the heating conditions vary depending on the composition of the radiation-sensitive resin composition.

In order to bring out latent capability of the radiation-sensitive resin composition of the present invention, an organic or inorganic anti-reflection film may be formed on a substrate as disclosed in Japanese Patent Publication No. 12452/1994, for example. Moreover, a protection film may be formed on the resist film as disclosed in Japanese Patent Publication No. 188598/1993 or the like in order to prevent the effects of basic impurities or the like in an environmental atmosphere. These techniques may be employed in combination.

The exposed resist film is then developed to form a predetermined resist pattern.

As examples of a developer used for development, it is preferable to use an alkaline aqueous solution prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diaza bicyclo-[4.3.0]-5-nonene.

The concentration of the alkaline aqueous solution is usually 10 wt % or less. If the concentration of the alkaline aqueous solution exceeds 10 wt %, an unexposed area may be dissolved in the developer.

Organic solvents or the like may be added to the developer containing an alkaline aqueous solution.

As examples of organic solvents, linear, branched, or cyclic ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvents is preferably 100 vol % of the alkaline aqueous solution. If the amount of the organic solvents exceeds 100 vol %, an exposed area may remain undeveloped due to decreased developability.

In addition, surfactants or the like may be added to the developer containing the alkaline aqueous solution in an appropriate amount.

The resist film is generally washed with water after development using a developer containing an alkaline aqueous solution.

EXAMPLES

The embodiments of the present invention will be described in more detail by examples. However, these examples should not be construed as limiting the present invention. In the examples, part(s) refers to part(s) by weight unless otherwise indicated.

Measurement and evaluation of each composition in the examples and comparative examples were carried out as follows.

Mw:

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Radiation Transmittance:

A solution composition was applied to a quartz plate and the coating was post-baked on a hot plate at 90° C. for 60 seconds to obtain a resist coating with a thickness of 1 μm. Radiation transmittance of the resist coating was calculated from absorbance at a wavelength of 193 nm and was adopted as a standard for transparency in the deep UV ray region.

Sensitivity

Examples 1–18 and Comparative Example 1

A solution composition with a formulation shown in Table 1 was applied to a silicon wafer with a 520 Å thickness Deep UV30 (ARC) film (manufactured by Brewer Science Inc.) formed on the surface by spin coating and post-baked on a hot plate under the conditions shown in Table 2 to obtain a resist coating with a thickness of 0.4 μm.

The coating was exposed to radiation through a mask pattern using an ArF excimer laser exposure apparatus (manufactured by Nikon Corp., lens numerical aperture: 0.55, wavelength: 193 nm). After PEB under the conditions shown in Table 2, the resist coatings were developed in a 2.38 wt % tetramethylammonium hydroxide aqueous solution (Examples 1–18) or 2.38×1/50 wt % tetramethylammonium hydroxide aqueous solution (Comparative Example 4)

at 25° C. for 1 minute, washed with water, and dried to form a positive-tone resist pattern. An optimum dose at which a line-and-space (1L1S) pattern with a line width of 0.18 μm was formed was taken as sensitivity.

Sensitivity

Example 19

A solution composition with a formulation shown in Table 1 was applied to a silicon wafer (AR-19) manufactured by Shipley Company by spin coating and post-baked on a hot plate under the conditions shown in Table 2 to obtain a resist coating with a thickness of 0.4 μm.

The coating was exposed to radiation through a mask pattern using an ISI mini-stepper (lens numerical aperture: 0.60, wavelength: 193 nm). After performing PEB under the conditions shown in Table 2, the resist films were developed in a 2.38 wt % tetramethylammonium hydroxide aqueous solution, developed at 25° C. for 1 minute, washed with water, and dried to form a positive-tone resist pattern. An optimum dose at which a line-and-space (1L1S) pattern with a line width of 0.15 μm was formed was taken as sensitivity.

Resolution:

Minimum dimensions of the resist pattern resolved at the optimum dose was taken as the resolution of the resist coating.

Defect:

Defect was evaluated by observing the presence or absence of the defective development using an optical microscope and a KLA defect inspection device (manufactured by KLA-TENCOR JAPAN LTD.) by the following procedure.

Evaluation procedure using KLA defect inspection device:

The total number of defective clusters and unclusters in one piece of wafer extracted from the difference produced by superposing reference images and pixels was counted by array mode observation using the KLA defect inspection device of which the sensitivity was set to detect defects with a size 0.15 μm or greater.

Pattern Configuration:

The length of the bottom ($L_1$) and top ($L_2$) of a square cross-section of a line-and-space (1L1S) pattern with a line width of 0.20 μm was measured by a scanning electron microscope.

The pattern configuration was judged as "Good" when $0.85 \leq L_2/L_1 \leq 1$ was satisfied and the pattern was not tapered.

Synthesis of Monomers

Synthesis Example 1

A 500 ml autoclave was charged with 22 g of cyclopentadiene, 109 g of 1,1-bis(trifluoromethyl)-3-butenol, and 450 mg of hydroquinone in an argon atmosphere, and the mixture was heated at 170° C. for 17 hours. The reaction solution was distilled to obtain 70 g of 5-[2,2-bis(trifluoromethyl)-2-hydroxyethyl]bicyclo[2.2.1]-hept-2-ene of the following formula (11).

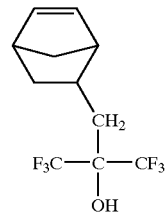

(11)

Synthesis Example 2

A 500 ml reaction vessel was charged with 10 g of 5-[2,2-bis(trifluoromethyl)-2-hydroxyethyl]bicyclo[2.2.1]-hept-2-ene obtained in Synthesis Example 1, 10 g of potassium carbonate, 40 g of tetrahydrofuran, and 20 g of water. After the addition of 8 g of t-butyl bromoacetate, the mixture was reacted at 70° C. for six hours. The reaction mixture was mixed with 200 ml of ethyl acetate and the mixture was washed with water. The solvent was removed under vacuum to obtain a crude product. The crude product was distilled under vacuum to obtain 7 g of 5-[2,2-bis(trifluoromethyl)-2-t-butoxycarbonyloxyethyl]bicyclo[2.2.1]hept-2-ene of the following formula (12).

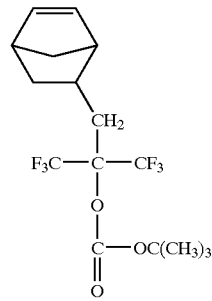

(12)

Synthesis Example 3

A 500 ml autoclave was charged with 230 g of 1,1-bis(trifluoromethyl)-3-butenol, 73 g of dicyclopentadiene, and 0.15 g of 2,6-di-t-butylparacresol, and the mixture was heated at 190° C. for 12 hours. The reaction solution was cooled to room temperature and purified by distillation to obtain 40 g of 8-(2,2,2-trifluoro-1-trifluoromethyl-1-hydroxyethyl)tetracyclo[$4.4.0.1^{2,5}.1^{7,10}$]dodec-3-ene of the following formula (13).

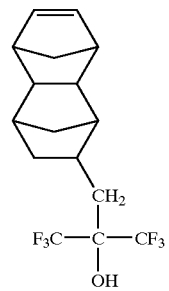

(13)

Synthesis Example 4

6 g of 8-[2,2-bis(trifluoromethyl)-2-t-butoxycarbonyloxyethyl]tetracyclo[4.4.0.1$^{2,5}$.1$^{7,10}$]dodec-3-ene of the following formula (14) was prepared in the same manner as in the Synthesis Example 2 except for using 10 g of 8-(2,2,2-trifluoro-1-trifluoromethyl-1-hydroxyethyl)tetracyclo[4.4.0.1$^{2,5}$.1$^{7,10}$]dodec-3-ene obtained in the Synthesis Example 3 instead of 5-[2,2-bis(trifluoromethyl)-2-hydroxyethyl]bicyclo[2.2.1]hept-2-ene.

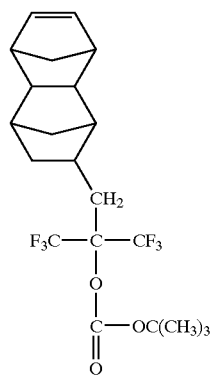

(14)

Synthesis Example 5

10 g of 8-(2,2,2-trifluoro-1-trifluoromethyl-1-hydroxyethyl)tetracyclo[4.4.0.1$^{2,5}$.1$^{7,10}$]dodec-3-ene obtained in the Synthesis Example 3 was refluxed for 24 hours in acetic anhydride and the crude product obtained was purified by distillation to obtain 6 g of 8-[2,2-bis(trifluoromethyl)-2-methylcarbonyloxyethyl]-tetracyclo[4.4.0.1$^{2,5}$.1$^{7,10}$]dodec-3-ene of the following formula (15).

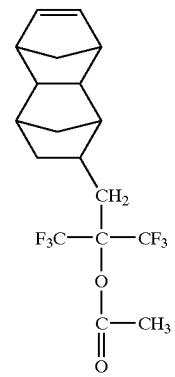

(15)

Synthesis of Resin (A)

Synthesis Example 6

A 100 ml pressure polymerization bottle was charged with 15 ml of 1,2-dichloroethane, 4.5 g of 5-[2,2-bis(trifluoromethyl)-2-hydroxyethyl]bicyclo[2.2.1]-hept-2-ene, and 2.4 g of 5-[2,2-bis(trifluoromethyl)-2-t-butoxycarbonlyoxyethyl]bicyclo[2.2.1]hept-2-ene. 2 ml of a solution of palladium complex catalyst prepared by the method described below was added to initiate the polymerization reaction. The reaction was continued for 6 hours at 30° C. The reaction solution was charged into a large amount of methanol to coagulate the product, which was filtered to obtain 4.7 g of a resin.

The resin was confirmed to be a copolymer with a copolymerization molar ratio of the recurring unit (I-1) and recurring unit (I-2), shown in the following formula (16), of 65:35, and having Mw of 6,000. This resin is referred to as a "resin (A-1)".

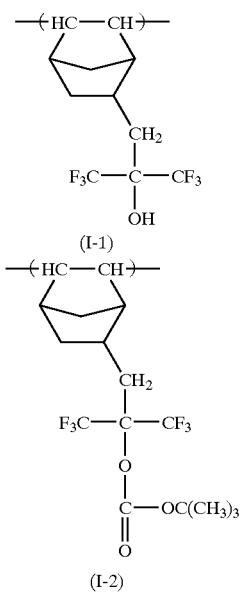

(16)

(I-1)

(I-2)

<Preparation of Catalyst>

A solution of 40 mg of silver hexafluoroantimonate dissolved in 1 ml of 1,2-dichloroethane was added to a solution of 27 mg of π-allyl palladium chloride dimmer in 1 ml of 1,2-dichloroethane. The mixture was stirred for one hour at room temperature and silver chloride formed was separated by filtration to obtain a solution of palladium complex catalyst in 2-dichloroethane.

Synthesis Example 7

The same polymerization reaction as in the Synthesis Example 6 was carried out, except for using 5.4 g of 5-[2,2-bis(trifluoromethyl)-2-hydroxyethyl]bicyclo[2.2.1]-hept-2-ene and 2.1 g of 5-t-butoxycarbonylbicyclo[2.2.1]-hept-2-ene as monomers, to obtain 5.1 g of a resin.

The resin was confirmed to be a copolymer with a copolymerization molar ratio of the recurring unit (I-1) and recurring unit (V-1), shown in the following formula (17), of 65:35, and having Mw of 6,200. This resin is referred to as a "resin (A-2)".

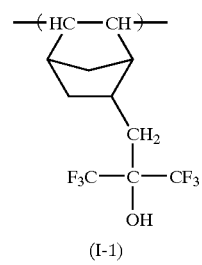

(17)

(I-1)

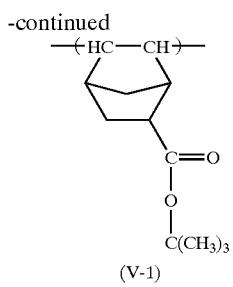

(V-1)

Synthesis Example 8

The same polymerization reaction as in the Synthesis Example 6 was carried out, except for using 4.9 g of 5-[2,2-bis(trifluoromethyl)-2-hydroxyethyl]bicyclo[2.2.1]-hept-2-ene and 2.6 g of the compound shown by the following formula (18) as monomers, to obtain 4.9 g of a resin.

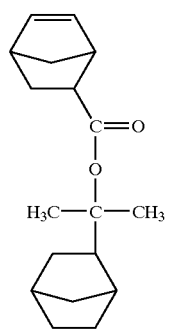

(18)

The resin was confirmed to be a copolymer with a copolymerization molar ratio of the recurring unit (I-1) and recurring unit (V-2), shown in the following formula (19), of 65:35, and having Mw of 5,800. This resin is referred to as a "resin (A-3)".

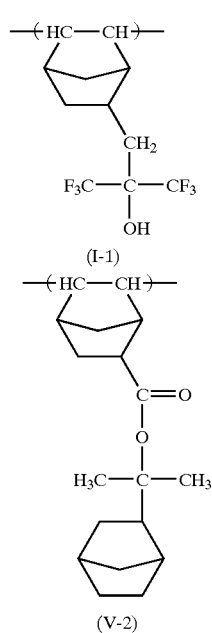

(19)

Synthesis Example 9

A 100 ml eggplant flask was charged with 12.1 g of 5-[2,2-bis(trifluoromethyl)-2-hydroxyethyl]bicyclo[2.2.1]-hept-2-ene, 5.7 g of 5-t-butoxycarbonylbicyclo[2.2.1]-hept-2-ene, 7.2 g of maleic anhydride, 1.5 g of azobisisobutyronitrile, and 25 g of tetrahydrofuran in a nitrogen atmosphere. The mixture was reacted at 60° C. for eight hours. After polymerization, the reaction solution was cooled to room temperature and poured into a large quantity of a isopropylalcohol/n-hexane mixed solution to coagulate the resin. The coagulated resin was filtered, washed with a small amount of n-hexane, and dried under vacuum to obtain 20 g of a resin product.

The resin was confirmed to be a copolymer with a copolymerization molar ratio of the recurring unit (I-1), recurring unit (II), and recurring unit (V-1), shown in the following formula (20), of 30:20:50, and having Mw of 7,000. This resin is referred to as a "resin (A-4)".

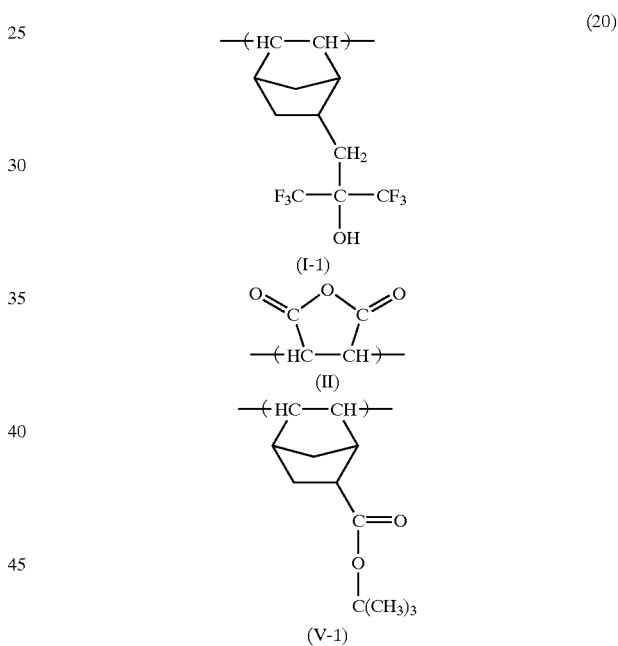

(20)

Synthesis Example 10

The same polymerization reaction as in the Synthesis Example 9 was carried out, except for using 12 g of 5-[2,2-bis(trifluoromethyl)-2-hydroxyethyl]bicyclo[2.2.1]-hept-2-ene, 4.3 g of maleic anhydride, and 8.7 g of 2-(2-methyl)adamantyl methacrylate as monomers, to obtain 19 g of a resin.

The resin was confirmed to be a copolymer with a copolymerization molar ratio of the recurring unit (I-1), recurring unit (II), and recurring unit (III-1), shown in the following formula (21), of 35:35:30, and having Mw of 6,800. This resin is referred to as a "resin (A-5)".

(21)

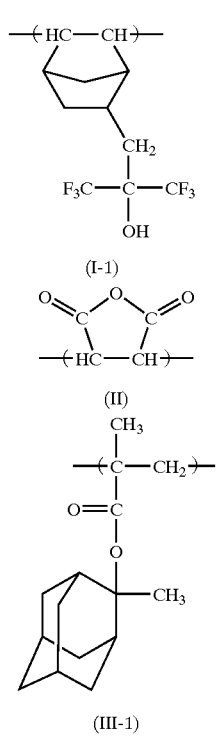

(I-1)

(II)

(III-1)

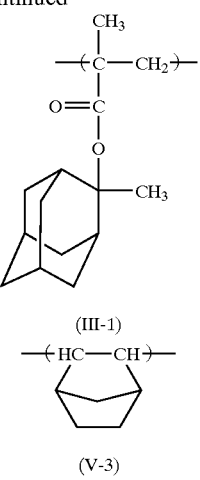

(III-1)

(V-3)

Synthesis Example 11

The same polymerization reaction as in the Synthesis Example 9 was carried out, except for using 11.5 g of 5-[2,2-bis(trifluoromethyl)-2-hydroxyethyl]bicyclo[2.2.1]hept-2-ene, 1.3 g of norbornene, 5.5 g of maleic anhydride, and 6.6 g of 2-(2-methyl)adamantyl methacrylate as monomers, to obtain 21 g of a resin.

The resin was confirmed to be a copolymer with a copolymerization molar ratio of the recurring unit (I-1), recurring unit (II), recurring unit (III-1), and recurring unit (V-3), shown in the following formula (22), of 30:10:40:20, and having Mw of 7,300. This resin is referred to as a "resin (A-6)".

(22)

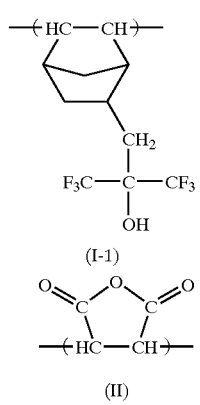

(I-1)

(II)

Synthesis Example 12

The same polymerization reaction as in the Synthesis Example 9 was carried out, except for using 11.8 g of 5-[2,2-bis(trifluoromethyl)-2-hydroxyethyl]bicyclo[2.2.1]hept-2-ene, 1.4 g of norbornene, 5.6 g of maleic anhydride, and 6.4 g of 2-(2'-methacryloyloxy-2'-propyl)norbornene as monomers, to obtain 20 g of a resin.

The resin was confirmed to be a copolymer with a copolymerization molar ratio of the recurring unit (I-1), recurring unit (II), recurring unit (III-2), and recurring unit (V-3), shown in the following formula (23), of 30:10:40:20, and having Mw of 6,400. This resin is referred to as a "resin (A-7)".

(23)

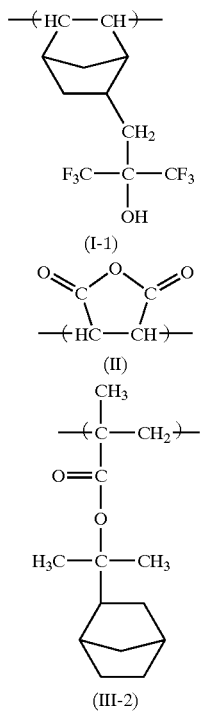

(I-1)

(II)

(III-2)

-continued

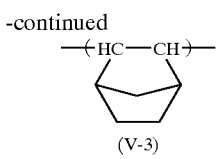

(V-3)

Synthesis Example 13

The same polymerization reaction as in the Synthesis Example 9 was carried out, except for using 9.7 g of 8-(2,2,2-trifluoro-1-trifluoromethyl-1-hydroxyethyl)tetracyclo[$4.4.0.1^{2,5}.1^{7,10}$]dodec-3-ene, 8.3 g of 5-t-butoxycarbonylbicyclo[2.2.1]hept-2-ene, and 7 g of maleic anhydride as monomers, to obtain 21 g of a resin.

The resin was confirmed to be a copolymer with a copolymerization molar ratio of the recurring unit (I-3), recurring unit (II), and recurring unit (V-1), shown in the following formula (24), of 30:20:50, and having Mw of 7,100. This resin is referred to as a "resin (A-8)".

(24)

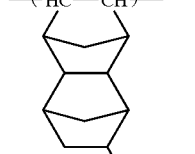
(I-3)

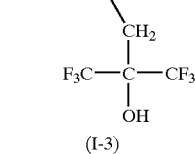
(II)

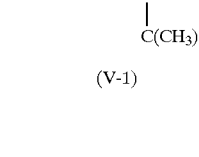

(V-1)

Synthesis Example 14

The same polymerization reaction as in the Synthesis Example 9 was carried out, except for using 12.3 g of 8-(2,2,2-trifluoro-1-trifluoromethyl-1-hydroxyethyl)tetracyclo[$4.4.0.1^{2,5}.1^{7,10}$]dodec-3-ene, 0.6 g of norbornene, 4.2 g of maleic anhydride, and 8 g of 2-(2'-methacryloyloxy-2'-propyl)-norbornene as monomers, to obtain 22 g of a resin.

The resin was confirmed to be a copolymer with a copolymerization molar ratio of the recurring unit (I-3), recurring unit (II), recurring unit (III-2), and recurring unit (V-3), shown in the following formula (25), of 30:10:40:20, and having Mw of 6,500. This resin is referred to as a "resin (A-9)".

(25)

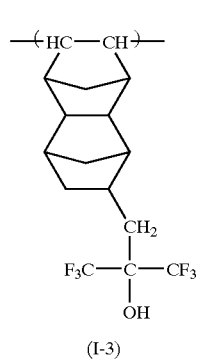
(I-3)

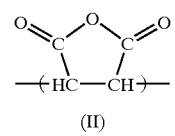
(II)

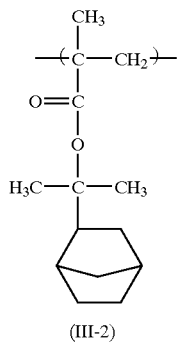
(III-2)

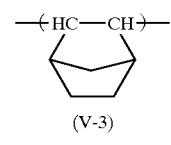
(V-3)

Synthesis Example 15

(1) Polymerization

A separable flask equipped with a stirrer, a reflux condenser, and a three-way cock was charged with 100 parts by weight of 8-[2,2-bis(trifluoromethyl)-2-t-butoxycarbonyloxyethyl]tetracyclo[$4.4.0.1^{2,5}.1^{7,10}$]-dodec-3-ene, 33 parts by weight of 1-hexene (molecular weight modifier), and 200 parts by weight of toluene, and the mixture was heated to 80° C. Next, after the addition of 0.17 part by weight of a toluene solution of triethylaluminum (concentration: 1.5 mol/l) and 1.0 part by weight of a toluene solution of tungsten hexachloride (concentration: 0.05 mol/l) as a metathesis catalyst, the ring-opening polymerization reaction was carried out at 80° C. for three hours while stirring to obtain a resin solution.

The resin was confirmed to be a polymer consisting of the recurring unit (IV-1) of the following formula (26) and having Mw of 12,000 (yield 67 wt %). This resin is referred to as a "resin (A-10)".

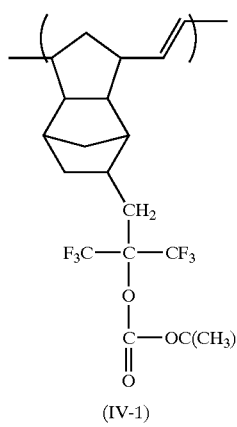

(26)

(IV-1)

(2) Hydrogenation

An autoclave was charged with 400 parts by weight of resin (A-10) and 0.075 part by weight of chlorohydrocarbonyltriphenylphosphine ruthenium as a hydrogenation catalyst. Hydrogenation reaction was carried out at 165° C. under a hydrogen pressure of 100 kg/cm².G for four hours.

400 parts by weight of the resulting reaction solution and 100 parts by weight of toluene were charged to another reaction vessel. After the addition of 0.71 part by weight of lactic acid and 1.15 parts by weight of water, the mixture was stirred at 60° C. for 30 minutes. Then, after the addition of 260 parts of methanol, the mixture was further stirred at 60° C. for one hour. The reaction solution was cooled to room temperature and separated into a poor solvent layer (methanol layer) and a good solvent layer (resin solution layer). Only the poor solvent layer was removed. Methanol and toluene in the amount equivalent respectively to 4.5 wt % and 55 wt % of the removed methanol, were added to the reaction vessel, and the mixture was stirred at 60° C. for one hour. Then, the reaction solution was again cooled to room temperature and separated into a poor solvent layer and a good solvent layer to remove only the poor solvent layer. This extraction procedure using methanol was repeated several times. The good solvent was removed from the finally obtained good solvent layer by evaporation, thereby collecting the resin. The resin was re-dissolved in tetrahydrofuran and a large amount of methanol was added to coagulate the resin. The coagulated resin was dried under reduced pressure.

The degree of hydrogenation determined by the NMR spectrum was 100% and the resin was confirmed to be a polymer consisting of the recurring unit (IV-2) of the following formula (27). This resin is referred to as a "resin (A-11)".

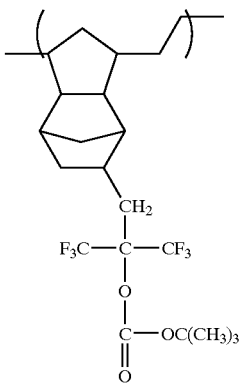

(27)

(3) Hydrolysis:

A flask was charged with 100 parts by weight of the resin (A-11), 200 parts by weight of propylene glycol monomethyl ether, 100 parts by weight of distilled water, and 1 part by weight of p-toluenesulfonic acid. Hydrolysis reaction was carried out for 8 hours while refluxing in a nitrogen atmosphere. The reaction solution was cooled to room temperature, neutralized by the addition of a large amount of water and triethylamine. The resin was extracted using ethyl acetate, and the extracted resin layer was washed with water until the water layer became neutral. The solvent was evaporated to obtain a resin.

The degree of hydrolysis determined by IR spectrum was 60%, and the resin was confirmed to be a copolymer with a copolymerization molar ratio of the recurring unit (IV-2) and recurring unit (IV-3), shown in the following formula (28), of 40:60. This resin is referred to as a "resin (A-12)".

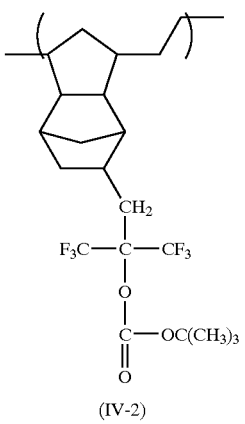

(IV-2)

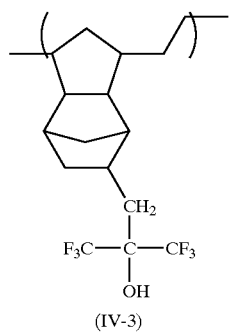

(IV-3)

(28)

Synthesis Example 16

(1) Polymerization

A separable flask equipped with a stirrer, a reflux condenser, and a three-way cock was charged with 60 parts by weight of 8-[2,2-bis(trifluoromethyl)-2-t-butoxycarbonyloxyethyl]tetracyclo[4.4.0.1$^{2,5}$.1$^{7,10}$]dodec-3-ene, 40 parts by weight of 5-[2,2-bis(trifluoromethyl)-2-t-butoxycarbonyloxyethyl]2.2.1]hept-2-ene, 25 parts by weight of 1-hexene (molecular weight modifier), 400 parts by weight of 1,2-dichloroethane, and 0.6 part by weight of a chlorobenzene solution of triethylaluminum (concentration: 1.5 mol/l) and 4 parts by weight of a chlorobenzene solution of tungsten hexachloride (concentration: 10.025 mol/l) as a metathesis catalyst. The ring-opening polymerization reaction was carried out at 80° C. for three hours. After the polymerization reaction, a large amount of methanol was added to the reaction solution to cause the resin to coagulate. The coagulated resin was filtered and dried under vacuum to obtain a resin (yield: 92 wt %).

The resin was confirmed to be a copolymer with a copolymerization molar ratio of the recurring unit (IV-1) and recurring unit (IV-4), shown in the following formula (29), of 50:50, and having Mw of 13,000. This resin is referred to as a "resin (A-13)".

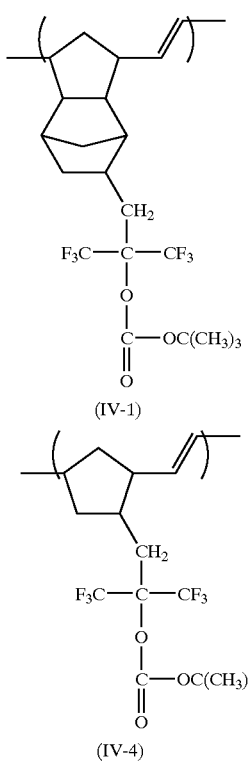

(29)

(2) Hydrogenation

A hydrogenation reaction was carried out in the same manner as in Synthesis Example 15 using the resin (A-13).

The degree of hydrogenation determined by the IR spectrum and NMR spectrum was 100% and the resin was confirmed to be a polymer consisting of the recurring unit (IV-2) recurring unit (IV-5) of the following formula (30). This resin is referred to as a "resin (A-14)".

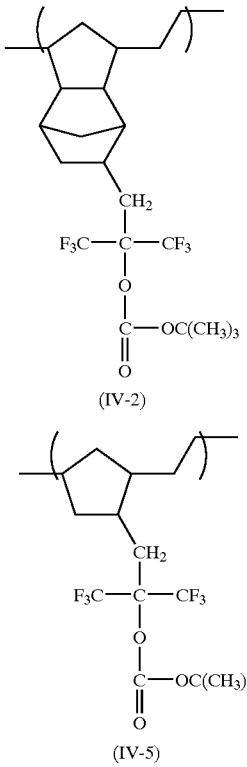

(30)

(3) Hydrolysis:

A hydrolysis reaction was carried out in the same manner as in Synthesis Example 15 using the resin (A-14). The degree of hydrolysis determined by IR spectrum was 70%, and the resin was confirmed to be a copolymer with a copolymerization molar ratio of the recurring unit (IV-2), recurring unit (IV-3), recurring unit (IV-5), and recurring unit (IV-6), shown in the following formula (31), of 13:37:17:33. This resin is referred to as a "resin (A-15)".

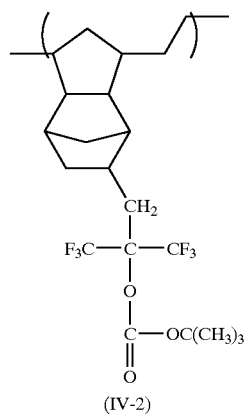

(31)

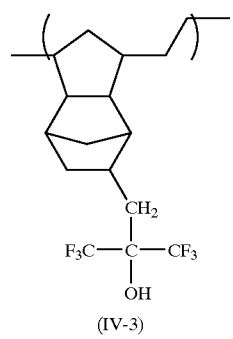

(IV-3)

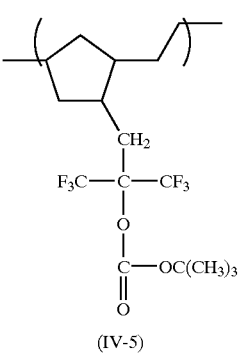

(IV-5)

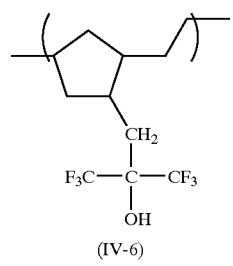

(IV-6)

Synthesis Example 17

(1) Polymerization

The same ring-opening polymerization reaction as in the Synthesis Example 16 was carried out, except for using 50 parts by weight of 8-[2,2-bis(trifluoromethyl)-2-methylcarbonyloxyethyl]tetracyclo[4.4.0.1$^{2,5}$.1$^{7,10}$]dodec-3-ene and 50 parts by weight of 5-t-butoxycarbonylbicyclo[2.2.1]hept-2-ene.

The resulting resin was confirmed to be a copolymer with a copolymerization molar ratio of the recurring unit (IV-7) and recurring unit (V-4), shown in the following formula (32), of 40:60, and having Mw of 13,000. This resin is referred to as a "resin (A-16)".

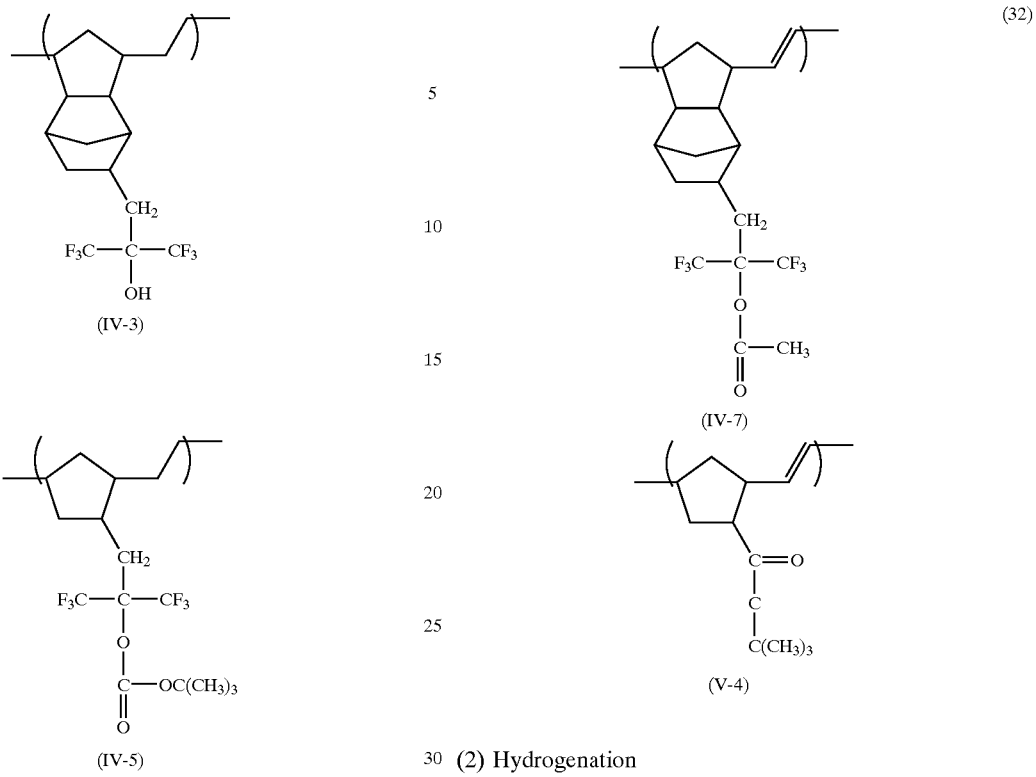

(32)

(IV-7)

(V-4)

(2) Hydrogenation

A hydrogenation reaction was carried out in the same manner as in Synthesis Example 15 using the resin (A-16).

The degree of hydrogenation determined by the IR spectrum and NMR spectrum was 100% and the resin was confirmed to be a polymer consisting of the recurring unit (IV-8) recurring unit (V-5) of the following formula (33). This resin is referred to as a "resin (A-17)".

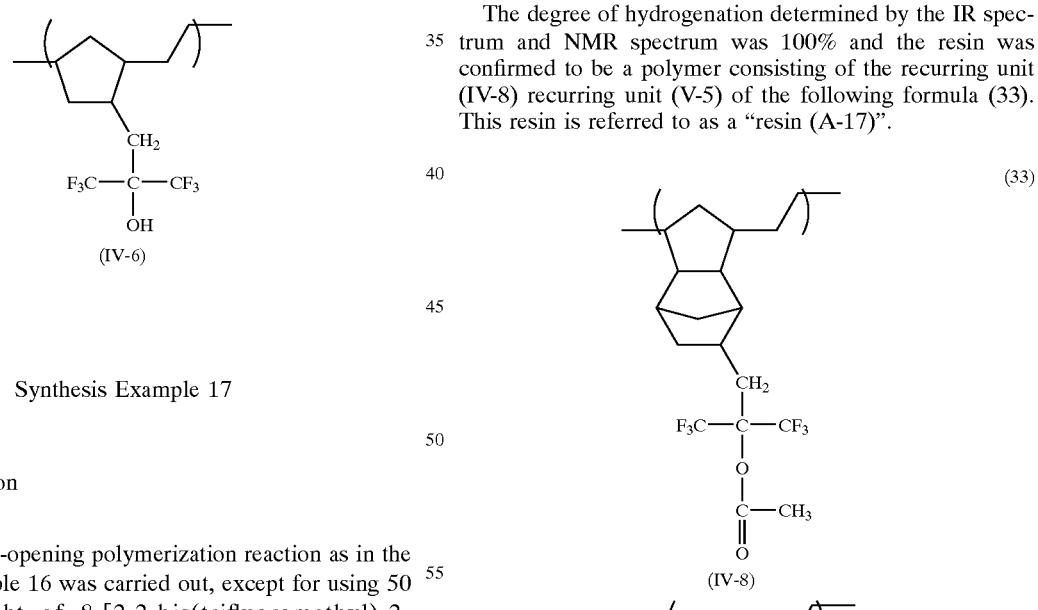

(33)

(IV-8)

(V-5)

(3) Hydrolysis:

A flask was charged with 100 parts by weight of the resin (A-17), 500 parts by weight of tetrahydrofuran, 50 parts by weight of an aqueous solution of potassium hydroxide (concentration: 10 mol/l), and the hydrolysis reaction was carried out for 6 hours while refluxing in a nitrogen atmosphere. The reaction solution was cooled to room temperature and neutralized by the addition of a large amount of water and oxalic acid. The resin was extracted using methyl acetate and the extracted resin layer was washed with water until the water layer became neutral. The solvent was evaporated to obtain a resin.

The degree of hydrolysis of methylcarbonyloxy groups determined by the IR spectrum was 100% and the resin was confirmed to be a polymer consisting of the recurring unit (IV-3) recurring unit (V-5) of the following formula (34). This resin is referred to as a "resin (A-18)".

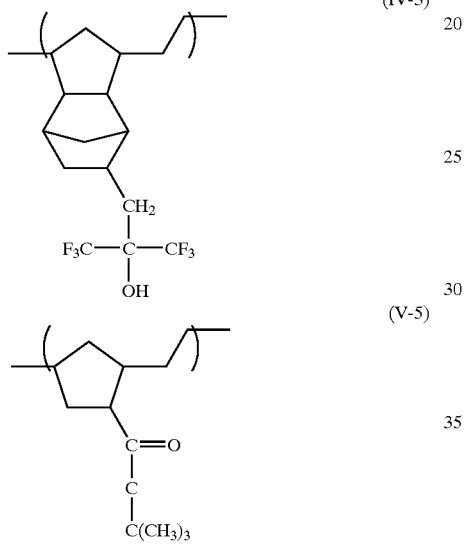

Synthesis Example 18

The same polymerization reaction as in the Synthesis Example 9 was carried out, except for using 5.81 g of 5-[2,2-bis(trifluoromethyl)-2-hydroxyethyl]bicyclo[2.2.1]-hept-2-ene, 14.00 g of 5-[2,2-bis(trifluoromethyl)-2-t-butoxycarbonyloxyethyl]bicyclo[2.2.1]hept-2-ene, and 5.19 g of maleic anhydride as monomers, to obtain 16 g of a resin.

The resin was confirmed to be a copolymer with a copolymerization molar ratio of the recurring unit (I-1), recurring unit (I-2), and recurring unit (II), shown in the following formula (35), of 20:30:50, and having Mw of 4,500. This resin is referred to as a "resin (A-19)".

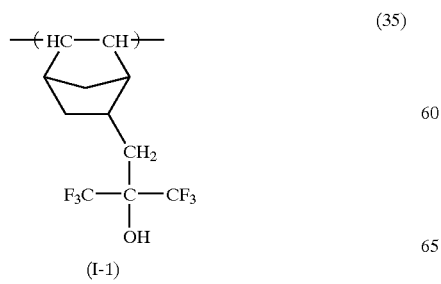

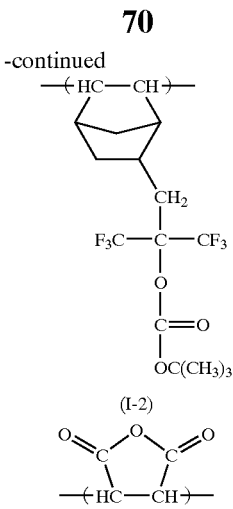

Synthesis Example 19

The same polymerization reaction as in the Synthesis Example 9 was carried out, except for using 6.83 g of 8-(2,2,2-trifluoro-1-trifluoromethyl-1-hydroxyethyl)tetracyclo[4.4.0.1$^{2,5}$.1$^{7,10}$]dodec-3-ene, 13.25 g of 5-[2,2-bis(trifluoromethyl)-2-t-butoxycarbonyloxyethyl]-bicyclo[2.2.1]hept-2-ene, and 4.92 g of maleic anhydride as monomers, to obtain 17 g of a resin.

The resin was confirmed to be a copolymer with a copolymerization molar ratio of the recurring unit (I-3), recurring unit (I-2), and recurring unit (II), shown in the following formula (36), of 20:30:50, and having Mw of 4,200. This resin is referred to as a "resin (A-20)".

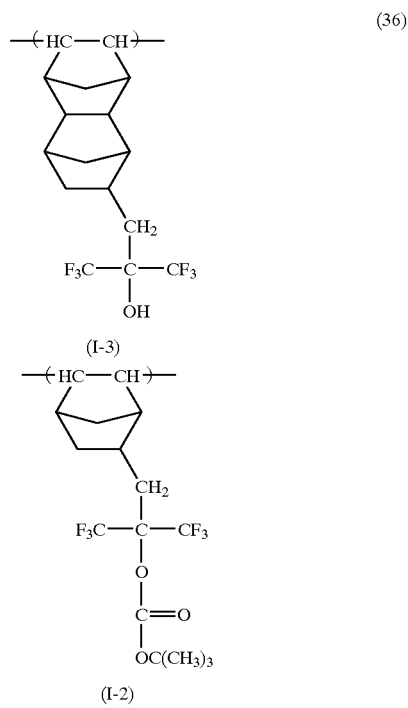

-continued

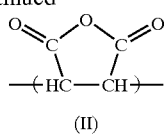
(II)

Synthesis Example 20

The same polymerization reaction as in the Synthesis Example 9 was carried out, except for using 8.07 g of 5-[2,2-bis(trifluoromethyl)-2-hydroxyethyl]bicyclo[2.2.1]-hept-2-ene, 7.21 g of maleic anhydride, and 9.72 g of 5-(1-methylcyclopentyloxycarbonyl)bicyclo[2.2.1]hept-2-ene as monomers, to obtain 20 g of a resin.

The resin was confirmed to be a copolymer with a copolymerization molar ratio of the recurring unit (I-1), recurring unit (II), and recurring unit (V-6), shown in the following formula (37), of 20:50:30, and having Mw of 4,800. This resin is referred to as a "resin (A-21)".

(37)

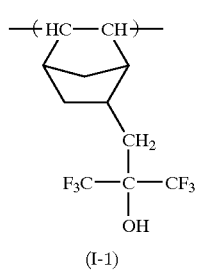

(I-1)

(II)

(V-6)

Synthesis Example 21

The same polymerization reaction as in the Synthesis Example 9 was carried out, except for using 7.67 g of 5-[2,2-bis(trifluoromethyl)-2-hydroxyethyl]bicyclo[2.2.1]-hept-2-ene, 6.86 g of maleic anhydride, and 10.47 g of 2-(2-methyl)adamantyl methacrylate as monomers, to obtain 16 g of a resin.

The resin was confirmed to be a copolymer with a copolymerization molar ratio of the recurring unit (I-1), recurring unit (II), and recurring unit (III-1), shown in the following formula (38), of 20:50:30, and having Mw of 5,800. This resin is referred to as a "resin (A-22)".

(38)

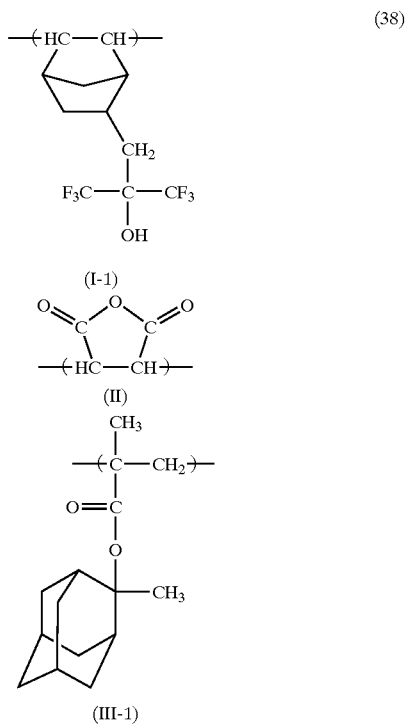

(I-1)

(II)

(III-1)

Synthesis Example 22

The same polymerization reaction as in the Synthesis Example 9 was carried out, except for using 32.69 g of 8-(2,2,2-trifluoro-1-trifluoromethyl-1-hydroxyethyl)-tetracyclo[4.4.0.1$^{2,5}$.1$^{7,10}$]dodec-3-ene and 17.31 g of 2-(2-methyl)adamantyl methacrylate as monomers, to obtain 18 g of a resin.

The resin was confirmed to be a copolymer with a copolymerization molar ratio of the recurring unit (I-1) and recurring unit (II), shown in the following formula (39), of 50:50, and having Mw of 5,900. This resin is referred to as a "resin (A-23)".

(39)

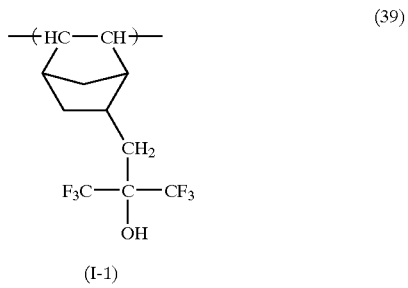

(I-1)

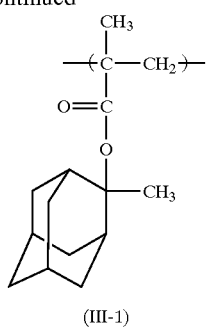

(III-1)

Synthesis Example 23

The same polymerization reaction as in the Synthesis Example 9 was carried out, except for using 24.50 g of 8-(2,2,2-trifluoro-1-trifluoromethyl-1-hydroxyethyl)-tetracyclo[$4.4.0.1^{2,5}.1^{7,10}$]dodec-3-ene, 17.31 g of 2-(2-methyl)adamantyl methacrylate, and 8.29 g of the compound shown by the following formula (40) as monomers, to obtain 20 g of a resin.

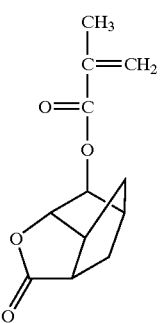

(40)

The resin was confirmed to be a copolymer with a copolymerization molar ratio of the recurring unit (I-1), recurring unit (III-1), and recurring unit (III-3), shown in the following formula (41), of 30:40:20, and having Mw of 5,700. This resin is referred to as a "resin (A-24)".

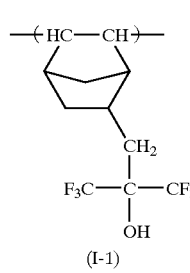

(41)

(I-1)

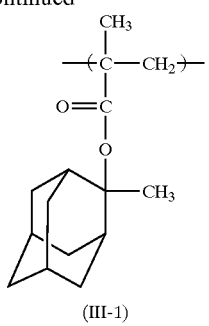

(III-1)

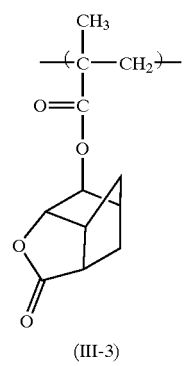

(III-3)

Synthesis Example 24

The same polymerization reaction as in the Synthesis Example 6 was carried out, except for using 5.53 g of 5-[2,2-bis(trifluoromethyl)-2-hydroxyethyl]bicyclo[2.2.1]hept-2-ene and 4.47 g of 5-(1-methyl-1-cyclohexyloxycarbonyl)-bicyclo[2.2.1]hept-2-ene as monomers, to obtain 7 g of a resin.

The resin was confirmed to be a copolymer with a copolymerization molar ratio of the recurring unit (I-1) and recurring unit (V-7), shown in the following formula (42), of 53:37, and having Mw of 30,700 and Mn of 14,500. This resin is referred to as a "resin (A-25)".

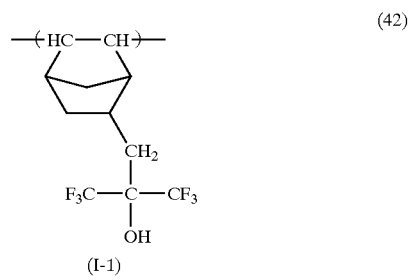

(42)

(I-1)

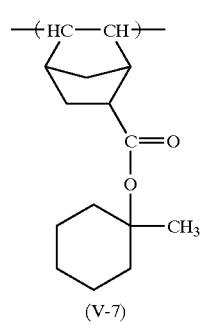

(V-7)

Examples 1–19 and Comparative Example 1

Each composition solution having components shown in Table 1 was evaluated. The evaluation results are shown in Table 3.

Components other than the resins (A-1) to (A-9), (A-12), (A-15), (A-18) to (A-25) shown in Table 1 are as follows.

Other Resins
a-1: t-Butyl methacrylate/methyl methacrylate/methacrylic acid copolymer (copolymerization molar ratio=40/40/20, Mw=20,000)

Acid Generator (B)
B-1: Triphenylsulfonium nonafluoro-n-butanesulfonate
B-2: Bis(4-t-butylphenyl)iodonium nonafluoro-n-butanesulfonate
B-3: 1-(3,5-dimethyl-4-hydroxyphenyl)tetrahydrothiopheniumnonafluoro-n-butanesulfonate
B-4: Bis(4-t-butylphenyl)iodonium perfluoro-n-octanesulfonate
B-5: Nonafluoro-n-butanesulfonylbicyclo[2.2.1]hept-5-ene-2,3-dicarbodiimide
B-6: 4-n-Butoxy-1-naphthyltetrahydrothiophenium perfluoro-n-octanesulfonate Acid Diffusion Control Agent
C-1: Tri-n-octylamine
C-2: 3-Pyperidino-1,2-propanediol
C-3: N-t-butoxycarbonyldicyclohexylamine
C-4: N-t-butoxycarbonyl-2-phenylbenzimidazole
C-5: Tetra-n-butylammoniumhydroxide Other Additives
D-1: t-Butyl deoxycholate
D-2: Di-t-butyl 1,3-adamantanedicarboxylate
D-3: t-Butoxycarbonylmethyl deoxycholate
D-4: 2,5-Dimethyl-2,5-di(adamantylcarbonyloxy)hexane Solvent
E-1: 2-Heptanone
E-2: Cyclohexanone
E-3: Propylene glycol monomethyl ether acetate

TABLE 1

| | Resin | Photoacid generator (B) | Acid diffusion controller | Other additives | Solvents |
|---|---|---|---|---|---|
| Example 1 | A-1 (90) | B-1 (2.0) | C-2 (0.05) | D-1 (10) | E-1 (430) E-2 (100) |
| Example 2 | A-2 (90) | B-2 (2.0) | C-3 (0.10) | D-2 (10) | E-1 (430) E-2 (100) |
| Example 3 | A-3 (90) | B-4 (3.0) | C-4 (0.10) | D-2 (10) | E-1 (430) E-2 (100) |
| Example 4 | A-4 (90) | B-3 (3.5) | C-4 (0.10) | D-3 (10) | E-1 (430) E-2 (100) |
| Example 5 | A-5 (90) | B-2 (3.0) | C-2 (0.05) | D-2 (10) | E-1 (430) E-2 (100) |
| Example 6 | A-6 (90) | B-4 (3.0) | C-3 (0.10) | D-2 (10) | E-1 (430) E-2 (100) |
| Example 7 | A-7 (90) | B-4 (3.0) B-5 (2.0) | C-3 (0.10) | D-3 (10) | E-1 (430) E-2 (100) |
| Example 8 | A-8 (90) | B-2 (3.0) B-5 (2.0) | C-4 (0.10) | D-3 (10) | E-1 (430) E-2 (100) |
| Example 9 | A-9 (90) | B-1 (2.0) | C-2 (0.05) | D-2 (10) | E-1 (430) E-2 (100) |
| Example 10 | A-12 (90) | B-2 (3.0) | C-4 (0.10) | D-1 (10) | E-1 (430) E-2 (100) |
| Example 11 | A-15 (90) | B-4 (3.0) B-5 (2.0) | C-4 (0.10) | D-3 (10) | E-1 (430) E-2 (100) |
| Example 12 | A-18 (90) | B-4 (3.0) | C-3 (0.05) C-4 (0.05) | D-2 (10) | E-1 (430) E-2 (100) |
| Example 13 | A-19 (90) | B-4 (2.5) B-5 (2.5) | C-3 (0.20) | D-3 (10) | E-1 (430) E-2 (100) |
| Example 14 | A-20 (90) | B-2 (3.0) B-5 (2.0) | C-3 (0.15) | D-3 (10) | E-3 (530) |
| Example 15 | A-21 (90) | B-6 (3.0) | C-2 (0.20) | D-2 (10) | E-1 (430) E-2 (100) |
| Example 16 | A-22 (90) | B-4 (2.5) B-5 (2.5) | C-2 (0.17) | D-2 (10) | E-3 (530) |
| Example 17 | A-23 (90) | B-6 (2.5) | C-3 (0.30) | D-3 (10) | E-3 (530) |
| Example 18 | A-24 (90) | B-3 (3.5) | C-1 (0.15) | D-2 (10) | E-1 (430) E-2 (100) |
| Example 19 | A-25 (88) | B-4 (2.0) B-5 (1.5) | C-5 (0.26) | D-4 (12) | E-3 (530) |
| Comparative Example 1 | a-1 (90) | B-1 (2.0) | C-1 (0.05) | D-1 (10) | E-1 (530) |

TABLE 2

| | Thickness of resist (μm) | Substrate | PB Temp. (°C.) | PB Time (sec) | PEB Temp. (°C.) | PEB Time (sec) |
|---|---|---|---|---|---|---|
| Example 1 | 0.4 | ARC | 130 | 90 | 140 | 90 |
| Example 2 | 0.4 | ARC | 130 | 90 | 140 | 90 |
| Example 3 | 0.4 | ARC | 130 | 90 | 140 | 90 |
| Example 4 | 0.4 | ARC | 130 | 90 | 140 | 90 |
| Example 5 | 0.4 | ARC | 130 | 90 | 140 | 90 |
| Example 6 | 0.4 | ARC | 130 | 90 | 140 | 90 |
| Example 7 | 0.4 | ARC | 130 | 90 | 140 | 90 |
| Example 8 | 0.4 | ARC | 130 | 90 | 140 | 90 |
| Example 9 | 0.4 | ARC | 130 | 90 | 140 | 90 |
| Example 10 | 0.4 | ARC | 130 | 90 | 140 | 90 |
| Example 11 | 0.4 | ARC | 130 | 90 | 140 | 90 |
| Example 12 | 0.4 | ARC | 130 | 90 | 140 | 90 |
| Example 13 | 0.4 | ARC | 130 | 90 | 140 | 90 |
| Example 14 | 0.4 | ARC | 130 | 90 | 140 | 90 |
| Example 15 | 0.4 | ARC | 130 | 90 | 140 | 90 |
| Example 16 | 0.4 | ARC | 130 | 90 | 140 | 90 |
| Example 17 | 0.4 | ARC | 130 | 90 | 140 | 90 |
| Example 18 | 0.4 | ARC | 130 | 90 | 140 | 90 |
| Example 19 | 0.4 | ARC-19 | 130 | 90 | 140 | 90 |
| Comparative Example 1 | 0.4 | ARC | 130 | 90 | 140 | 90 |

TABLE 3

| | Transmittance (193 nm, %) | Sensitivity (J/m$^2$) | Resolution (mm) | Defect | Pattern Configuration |
|---|---|---|---|---|---|
| Example 1 | 75 | 73 | 0.15 | 0 | Good |
| Example 2 | 72 | 74 | 0.15 | 0 | Good |
| Example 3 | 69 | 69 | 0.15 | 0 | Good |
| Example 4 | 71 | 70 | 0.15 | 0 | Good |
| Example 5 | 68 | 74 | 0.15 | 0 | Good |
| Example 6 | 73 | 72 | 0.15 | 0 | Good |
| Example 7 | 70 | 68 | 0.15 | 0 | Good |
| Example 8 | 75 | 77 | 0.15 | 0 | Good |
| Example 9 | 70 | 69 | 0.15 | 0 | Good |
| Example 10 | 68 | 71 | 0.15 | 0 | Good |
| Example 11 | 70 | 74 | 0.15 | 0 | Good |
| Example 12 | 71 | 71 | 0.15 | 0 | Good |
| Example 13 | 74 | 72 | 0.15 | 0 | Good |
| Example 14 | 71 | 74 | 0.15 | 0 | Good |
| Example 15 | 74 | 77 | 0.15 | 0 | Good |
| Example 16 | 72 | 69 | 0.15 | 0 | Good |
| Example 17 | 67 | 76 | 0.15 | 0 | Good |
| Example 18 | 68 | 72 | 0.15 | 0 | Good |
| Example 19 | 73 | 79 | 0.13 | 0 | Good |

TABLE 3-continued

| | Transmittance (193 nm, %) | Sensitivity (J/m²) | Resolution (mm) | Defect | Pattern Configuration |
|---|---|---|---|---|---|
| Comparative Example 1 | 62 | 150 | 0.18 | 45 | Good |

The radiation-sensitive resin composition of the present invention has high transmittance of radiation, exhibits superior basic properties as a chemically amplified resist such as high sensitivity, resolution, and pattern shape, and is capable of producing semiconductors at a high yield without producing resolution defects during microfabrication. The resin composition is expected to be an ideal material in the semiconductor field in which microfabrication technology will further advance in the future.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:

A. an acid-labile group-containing resin containing a recurring unit of the following formula (1),

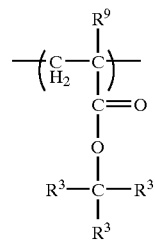

(1)

wherein $R^1$ represents a hydrogen atom or a monovalent acid-labile group, $X^1$ represents a linear or branched fluoroalkyl group having 1–4 carbon atoms, and $R^2$ represents a hydrogen atom, a linear or branched alkyl group having 1–10 carbon atoms, or a linear or branched fluoroalkyl group hving 1–10 carbon atoms, and a recurring unit represented by the following formula (2),

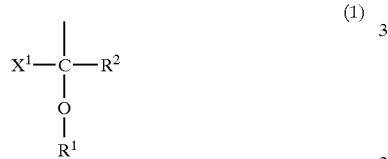

(2)

wherein any two of the $R^3$ groups form, in combination and together with the carbon atom with which these groups bond, a divalent alicyclic hydrocarbon group having 4–20 carbon atoms or a derivative thereof, with the remaining $R^3$ group being a linear or branched alkyl group having 1–4 carbon atoms or a monovalent alicyclic hydrocarbon group having 4–20 carbon atoms or derivative thereof, and (B) a photoacid generator.

2. The radiation-sensitive resin composition according to claim 1, comprising (A) an acid-labile group-containing resin having a recurring unit of the formula (1) and a recurring of the following formula (4),

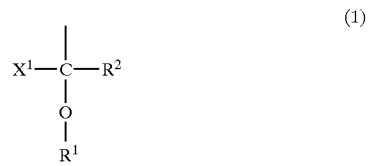

(4)

wherein any two of the $R^3$ groups form, in combination and together with the carbon atom with which these groups bond, a divalent alicyclic hydrocarbon group having 4–20 carbon atoms or a derivative thereof, with the remaining $R^3$ group being a linear or branched alkyl group having 1–4 carbon atoms or a monovalent alicyclic hydrocarbon group having 4–20 carbon atoms or a derivative thereof and $R^9$ represents a hydrogen atom or methyl group, and (B) a photoacid generator.

3. The radiation-sensitive resin composition according to claim 1, wherein $R^1$ in the formula (1) is a hydrogen atom and both $X^1$ and $R^2$ in the formula (1) are trifluoro methyl groups.

4. A radiation-sensitive resin composition comprising:

(A) an acid-labile group-containing resin containing a recurring unit of the following formula (1),

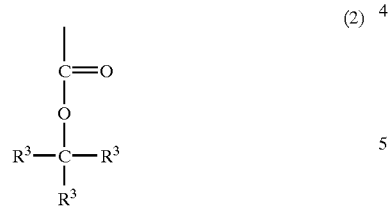

(1)

wherein $R^1$ represents a hydrogen atom or a monovalent acid-labile group, $X^1$ represents a linear or branched fluoroalkyl group having 1–4 carbon atoms, and $R^2$ represents a hydrogen atom, a linear or branched alkyl group having 1–10 carbon atoms, or a linear or branched fluoroalkyl group hving 1–10 carbon atoms, and a recurring unit represented by the following formula (3),

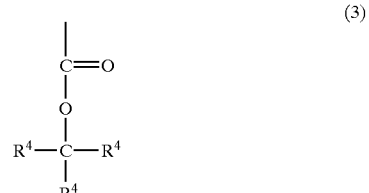

(3)

wherein at least one of the $R^4$ group in the formula (3) is a monovalent alicyclic hydrocarbon group having 4–20 carbon atoms or a derivative thereof, and each of the remaining $R^4$ groups are individually a linear or branched alkyl group having 1–4 carbon atoms, and (B) a photoacid generator.

5. The radiation-sensitive resin composition according to claim 4, comprising (A) an acid-labile group-containing resin having a recurring unit of the formula (1) and a recurring of the following formula (5),

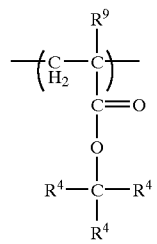

(5)

wherein at least one $R^4$ group is a monovalent alicyclic hydrocarbon group having 4–20 carbon atoms or a derivative thereof and each of the remaining $R^4$ groups are individually a linear or branched alkyl group having 1–4 carbon atoms and $R^9$ represents a hydrogen atom or methyl group, and (B) a photoacid generator.

6. The radiation-sensitive resin composition according to claim 4, wherein $R^1$ in the formula (1) is a hydrogen atom and both $X^1$ and $R^2$ in the formula (1) are trifluoromethyl groups.

* * * * *

(12) EX PARTE REEXAMINATION CERTIFICATE (6550th)
United States Patent
Nishimura et al.

(10) Number: US 6,964,840 C1
(45) Certificate Issued: Dec. 2, 2008

(54) RADIATION-SENSITIVE RESIN COMPOSITION

(75) Inventors: Yukio Nishimura, Mie (JP); Noboru Yamahara, Mie (JP); Masafumi Yamamoto, Mie (JP); Toru Kajita, Mie (JP); Tsutomu Shimokawa, Mie (JP); Hiroshi Ito, San Jose, CA (US)

(73) Assignees: JSR Corporation, Chuo-Ku, Tokyo (JP); International Business Machines Corporation, Armonk, NY (US)

Reexamination Request:
No. 90/008,465, Feb. 1, 2007

Reexamination Certificate for:
Patent No.: 6,964,840
Issued: Nov. 15, 2005
Appl. No.: 10/867,892
Filed: Jun. 16, 2004

Related U.S. Application Data

(63) Continuation of application No. 09/879,894, filed on Jun. 14, 2001, now Pat. No. 6,800,414.

(30) Foreign Application Priority Data

Jun. 16, 2000 (JP) .................................. 2000-182297
Apr. 6, 2001 (JP) .................................. 2001-108824

(51) Int. Cl.
*G03F 7/004* (2006.01)
*G03F 7/039* (2006.01)

(52) U.S. Cl. .............. 430/270.1; 430/286.1; 430/905; 430/907; 430/910

(58) Field of Classification Search ................ None
See application file for complete search history.

(56) References Cited

U.S. PATENT DOCUMENTS 6,951,705 B2  10/2005  Fryd et al.

*Primary Examiner*—Dwayne C Jones

(57) ABSTRACT

A radiation-sensitive resin composition comprising an acid-labile group-containing resin and a photoacid generator is disclosed. The resin has a structure of the formula (1),

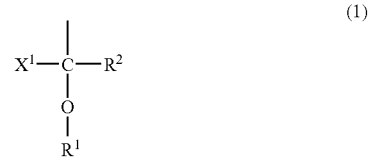

wherein $R^1$ represents a hydrogen atom, a monovalent acid-labile group, an alkyl group having 1–6 carbon atoms which does not have an acid-labile group, or an alkylcarbonyl group having 2–7 carbon atoms which does not have an acid-labile group, $X^1$ represents a linear or branched fluorinated alkyl group having 1–4 carbon atoms, and $R^2$ represents a hydrogen atom, a linear or branched alkyl group having 1–10 carbon atoms, or a linear or branched fluorinated alkyl group having 1–10 carbon atoms. The resin composition exhibits high transmittance of radiation, high sensitivity, resolution, and pattern shape, and is useful as a chemically amplified resist in producing semiconductors at a high yield.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2–3 is confirmed.

Claim 1 is determined to be patentable as amended.

New claims 7–11 are added and determined to be patentable.

Claims 4–6 were not reexamined.

1. A radiation-sensitive resin composition comprising:
   [A.] (*A*) an acid-labile group-containing resin containing a recurring unit of the following formula (1),

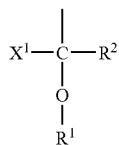

(1)

wherein $R^1$ represents a hydrogen atom or a monovalent acid-labile group, $X^1$ represents a linear or branched fluoroalkyl group having 1–4 carbon atoms, and $R^2$ represents a hydrogen atom, a linear or branched alkyl group having 1–10 carbon atoms, or a linear or branched fluoroalkyl group [hving] *having* 1–10 carbon atoms, and a recurring unit represented by the following formula (2),

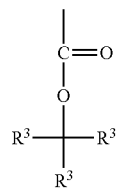

(2)

wherein any two of the $R^3$ groups form, in combination and together with the carbon atom with which these groups bond, a divalent alicyclic hydrocarbon group having 4–20 carbon atoms or a derivative thereof, with the remaining $R^3$ group being a linear or branched alkyl group having 1–4 carbon atoms or a monovalent alicyclic hydrocarbon group having 4–20 carbon atoms or derivative thereof, [and]

(B) a photoacid generator*, and*

(C) *a nitrogen-containing organic compound as an acid diffusion controller*.

7. *The composition of claim 1, wherein the acid diffusion controller is selected from the group consisting of: compounds shown by the following formula (10)*

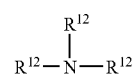

(10)

*wherein each $R^{12}$ individually represents a hydrogen atom, a substituted or unsubstituted, linear, branched, or cyclic alkyl group, substituted or unsubstituted aryl group, or substituted or unsubstituted aralkyl group; compounds having two nitrogen atoms in the molecule; polymers having three or more nitrogen atoms; quaternary ammonium hydroxide compounds; amide group-containing compounds; urea compounds; nitrogen-containing heterocyclic compounds; and combinations thereof.*

8. *The composition of claim 1, wherein the acid diffusion controller is selected from the group consisting of: compounds shown by the following formula (10)*

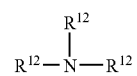

(10)

*wherein each $R^{12}$ individually represents a hydrogen atom, a substituted or unsubstituted, linear, branched, or cyclic alkyl group, substituted or unsubstituted aryl group, or substituted or unsubstituted aralkyl group; amide group-containing compounds; nitrogen-containing heterocyclic compounds; and combinations thereof.*

9. *The composition of claim 1, wherein the acid diffusion controller is selected from the group consisting of: amide group-containing compounds; nitrogen-containing heterocyclic compounds; and combinations thereof.*

10. *The composition of claim 1, wherein the composition comprises 15 parts by weight or less of the acid diffusion controller.*

11. *The composition of claim 1, wherein the composition comprises 0.001 to 15 parts by weight of the acid diffusion controller.*

\* \* \* \* \*